(12) United States Patent
Partio et al.

(10) Patent No.: US 7,642,533 B2
(45) Date of Patent: Jan. 5, 2010

(54) EXTREME ULTRAVIOLET LIGHT SOURCE

(75) Inventors: William N. Partio, Poway, CA (US);
Igor V. Fomenkov, San Diego, CA (US);
Oleh Khodykin, San Diego, CA (US)

(73) Assignee: Cymer, Inc., San Diego, CA (US)

( * ) Notice: Subject to any disclaimer, the term of this patent is extended or adjusted under 35 U.S.C. 154(b) by 0 days.

(21) Appl. No.: 11/880,319

(22) Filed: Jul. 20, 2007

(65) Prior Publication Data

US 2008/0023657 A1    Jan. 31, 2008

Related U.S. Application Data

(63) Continuation of application No. 11/107,535, filed on Apr. 14, 2005, now Pat. No. 7,368,741, which is a continuation of application No. 10/409,254, filed on Apr. 8, 2003, now Pat. No. 6,972,421, which is a continuation-in-part of application No. 10/384,967, filed on Mar. 8, 2003, now Pat. No. 6,904,073, which is a continuation-in-part of application No. 10/189,824, filed on Jul. 3, 2002, now Pat. No. 6,815,700, which is a continuation-in-part of application No. 10/120,655, filed on Apr. 10, 2002, now Pat. No. 6,744,060, which is a continuation-in-part of application No. 09/875,719, filed on Jun. 6, 2001, now Pat. No. 6,586,757, which is a continuation-in-part of application No. 09/875,721, filed on Jun. 6, 2001, now Pat. No. 6,566,668, which is a continuation-in-part of application No. 09/690,084, filed on Oct. 16, 2000, now Pat. No. 6,566,667.

(60) Provisional application No. 60/422,808, filed on Oct. 31, 2002, provisional application No. 60/419,805, filed on Oct. 18, 2002.

(51) Int. Cl.
*H01J 35/20* (2006.01)

(52) U.S. Cl. .................................. 250/504 R; 378/119
(58) Field of Classification Search ............. 250/504 R; 378/119, 143
See application file for complete search history.

(56) References Cited

U.S. PATENT DOCUMENTS 2,759,106 A    8/1956    Wolter .......................... 250/53

(Continued)

FOREIGN PATENT DOCUMENTS

WO    WO 01/373309    5/2001

(Continued)

OTHER PUBLICATIONS

Apruzese, J.P., "X-Ray Laser Research Using Z Pinches," *Am. Inst. of Phys.* 399-403, (1994).

(Continued)

*Primary Examiner*—Kiet T Nguyen

(57) ABSTRACT

The present invention provides a reliable, high-repetition rate, production line compatible high energy photon source. A very hot plasma containing an active material is produced in vacuum chamber. The active material is an atomic element having an emission line within a desired extreme ultraviolet (EUV) range. A pulse power source comprising a charging capacitor and a magnetic compression circuit comprising a pulse transformer, provides electrical pulses having sufficient energy and electrical potential sufficient to produce the EUV light at an intermediate focus at rates in excess of 5 Watts. In preferred embodiments designed by Applicants in-band, EUV light energy at the intermediate focus is 45 Watts extendable to 105.8 Watts.

20 Claims, 51 Drawing Sheets

U.S. PATENT DOCUMENTS

| | | | | |
|---|---|---|---|---|
| 3,150,483 | A | 9/1964 | Mayfield et al. | 60/35.5 |
| 3,232,046 | A | 2/1966 | Meyer | 50/35.5 |
| 3,279,176 | A | 10/1966 | Boden | 60/202 |
| 3,746,870 | A | 7/1973 | Demarest | 250/227 |
| 3,960,473 | A | 6/1976 | Harris | 425/467 |
| 3,961,197 | A | 6/1976 | Dawson | 250/493 |
| 3,969,628 | A | 7/1976 | Roberts et al. | 250/402 |
| 4,042,848 | A | 8/1977 | Lee | 313/231.6 |
| 4,088,966 | A | 5/1978 | Samis | 313/231.5 |
| 4,143,275 | A | 3/1979 | Mallozzi et al. | 250/503 |
| 4,162,160 | A | 7/1979 | Witter | 75/246 |
| 4,203,393 | A | 5/1980 | Giardini | 123/30 |
| 4,364,342 | A | 12/1982 | Asik | 123/143 |
| 4,369,758 | A | 1/1983 | Endo | 123/620 |
| 4,504,964 | A | 3/1985 | Cartz et al. | 378/119 |
| 4,507,588 | A | 3/1985 | Asmussen et al. | 315/39 |
| 4,536,884 | A | 8/1985 | Weiss et al. | 378/119 |
| 4,538,291 | A | 8/1985 | Iwamatsu | 378/119 |
| 4,561,406 | A | 12/1985 | Ward | 123/536 |
| 4,596,030 | A | 6/1986 | Herziger et al. | 378/119 |
| 4,618,971 | A | 10/1986 | Weiss et al. | 378/34 |
| 4,626,193 | A | 12/1986 | Gann | 431/71 |
| 4,633,492 | A | 12/1986 | Weiss et al. | 378/119 |
| 4,635,282 | A | 1/1987 | Okada et al. | 378/34 |
| 4,751,723 | A | 6/1988 | Gupta et al. | 378/119 |
| 4,752,946 | A | 6/1988 | Gupta et al. | 378/119 |
| 4,774,914 | A | 10/1988 | Ward | 123/162 |
| 4,837,794 | A | 6/1989 | Riordan et al. | 378/119 |
| 4,928,020 | A | 5/1990 | Birx et al. | 307/106 |
| 5,023,897 | A | 6/1991 | Neff et al. | 378/122 |
| 5,027,076 | A | 6/1991 | Horsley et al. | 324/674 |
| 5,102,776 | A | 4/1992 | Hammer et al. | 430/311 |
| 5,126,638 | A | 6/1992 | Dethlefsen | 315/326 |
| 5,142,166 | A | 8/1992 | Birx | 307/419 |
| 5,175,755 | A | 12/1992 | Kumakhov | 378/34 |
| 5,313,481 | A | 5/1994 | Cook et al. | 372/37 |
| 5,411,224 | A | 5/1995 | Dearman et al. | 244/53 |
| 5,448,580 | A | 9/1995 | Birx et al. | 372/38 |
| 5,504,795 | A | 4/1996 | McGeoch | 378/119 |
| 5,729,562 | A | 3/1998 | Birx et al. | 372/38 |
| 5,763,930 | A | 6/1998 | Partlo | 250/504 |
| 5,866,871 | A | 2/1999 | Birx | 219/121 |
| 5,936,988 | A | 8/1999 | Partlo et al. | 372/38 |
| 5,963,616 | A | 10/1999 | Silfvast et al. | 378/122 |
| 6,031,241 | A | 2/2000 | Silfvast et al. | 250/504 |
| 6,039,850 | A | 3/2000 | Schulz | 204/192.15 |
| 6,051,841 | A | 4/2000 | Partlo | 250/504 |
| 6,064,072 | A | 5/2000 | Partlo et al. | 250/504 |
| 6,084,198 | A | 7/2000 | Birx | 219/121.48 |
| 6,172,324 | B1 | 1/2001 | Birx | 219/121.57 |
| 6,195,272 | B1 | 2/2001 | Pascente | 363/21 |
| 6,307,913 | B1* | 10/2001 | Foster et al. | 378/34 |
| 6,452,199 | B1 | 9/2002 | Partlo et al. | 250/504 |
| 6,469,310 | B1* | 10/2002 | Fiedorowicz et al. | 250/492.22 |
| 6,493,423 | B1* | 12/2002 | Bisschops | 378/119 |
| 6,566,667 | B1 | 5/2003 | Partlo et al. | 250/504 |
| 6,566,668 | B2 | 5/2003 | Rauch et al. | 250/504 |
| 6,590,959 | B2 | 7/2003 | Kandaka et al. | 378/119 |
| 6,661,018 | B1* | 12/2003 | McGregor et al. | 250/504 R |
| 6,804,327 | B2 | 10/2004 | Schriever et al. | 378/119 |
| 6,865,255 | B2* | 3/2005 | Richardson | 378/119 |
| 6,894,298 | B2 | 5/2005 | Ahmad et al. | 378/119 |
| 6,998,785 | B1* | 2/2006 | Silfvast et al. | 315/111.71 |
| 7,067,832 | B2* | 6/2006 | Mizoguchi et al. | 250/504 R |
| 2002/0014598 | A1 | 2/2002 | Melnychuk et al. | 250/504 R |
| 2004/0022295 | A1* | 2/2004 | Weulersse et al. | 372/75 |
| 2005/0117620 | A1* | 6/2005 | Thro et al. | 372/70 |

FOREIGN PATENT DOCUMENTS

| | | |
|---|---|---|
| WO | WO 01/95362 | 12/2001 |

OTHER PUBLICATIONS

Bollanti, et al., "Compact Three Electrodes Excimer Laser IANUS for a POPA Optical System," *SPIE Proc.* (2206) 144-153, 1994.

Bollanti, et al., "Ianus, the three-electrode excimer laser," *App. Phys. B (Lasers & Optics)* 66(4):401-406, (1998).

Choi, et al., "Fast pulsed hollow cathode capillary discharge device," *Rev. Of Sci. Instrum.* 69(9):3118-3122 (1998).

Choi et al., "Temporal development of hard and soft x-ray emission from a gas-puff Z pinch," Rev. Sci. Instrum. 57(8), pp. 2162-2164 (Aug. 1986).

Fomenkov, et al., "Characterization of a 13.5nm Source for EUV Lithography based on a Dense Plasma Focus and Lithium Emission," Sematech Intl. Workshop on EUV Lithography (Oct. 1999).

Giordano and Letardi, "Magnetic pulse compressor for prepulse discharge in spiker-sustainer excitati technique for XeC1 lasers," Rev. Sci. Instrum 65(8), pp. 2475-2481 (Aug. 1994).

Hansson, et al., "Xenon liquid jet laser-plasma source for EUV lithography," Emerging Lithographic Technologies IV, Proc. Of SPIE, vol. 3997:729-732 (2000).

Jahn, Physics of Electric Propulsion, McGraw-Hill Book Company, (Series in Missile and Space U.S.A.), Chap. 9, "Unsteady Electromagnetic Acceleration," p. 257 (1968).

Kato, Yasuo, "Electrode Lifetimes in a Plasma Focus Soft X-Ray Source," *J. App. Phys.* (33) Pt. 1, No. 8:4742-4744 (1991).

Kato, et al., "Plasma focus x-ray source for lithography," *Am. Vac. Sci. Tech. B.*,6(1): 195-198 (1988).

Lebert et al., "Comparison of laser produced and gas discharge based EUV sources for different applications," *International Conference Micro- and Nano-Engineering 98*, Sep. 22-24, 1998, Leuven, Belgium, 6 pages.

Lebert, et al., "Soft x-ray emission of laser-produced plasmas using a low-debris cryogenic nitrogen target," *J. App. Phys.*, 84(6):3419-3421 (1998).

Lebert, et al., "A gas discharge based radiation source for EUV-lithography," Intl. Conf. Micro and Nano-Engineering 98 (Sep. 2-24. 1998) Leuven, Belgium.

Lebert, et al., "Investigation of pinch plasmas with plasma parameters promising ASE," Inst. Phys. Conf. Ser No. 125: Section 9, pp. 411-415 (1992) Schiersee, Germany.

Lee, Ja H., "Production of dense plasmas in hypocyloidal pinch apparatus," *The Phys. Of Fluids*, 20(2):313-321(1977).

Lewis, Ciaran L.S., "Status of Collision-Pumped X-ray Lasers," *Am Inst. Phys.* pp. 9-16 (1994).

Lowe, "Gas plasmas yield X rays for Lithography," Electronics, pp. 40-41 (Jan. 27, 1982).

Malmqvist, et al., "Liquid-jet target for laser-plasma soft x-ray generation," *Am. Inst. Phys.* 67(12):4150-4153 1996).

Mather, "Formation of a High-Density Deuterium Plasma Focus," The Physics of Fluids, 8(2), 366-377 (Feb. 1965).

Mather, et al., "Stability of the Dense Plasma Focus," *Phys. Of Fluids*, 12(11):2343-2347 (1969).

Matthews and Cooper, "Plasma sources for x-ray lithography," SPIE, 333, Submicron Lithography, pp. 136-139 (1982).

Mayo, et al., "A magnetized coaxial source facility for the generation of energetic plasma flows," *Sci. Technol.* vol. 4;pp.47-55. (1994).

Mayo, et al., "Initial Results on high enthalpy plasma generation in a magnetized coaxial source," *Fusion Tech* vol. 26:1221-1225 (1994).

Nilsen, et al., "Analysis of resonantly photopumped Na-Ne x-ray-laser scheme," *Am Phys. Soc.* 44(7):4591-4597 (1991).

Partlo, et al., "EUV (13.5nm) Light Generation Using a Dense Plasma Focus Device," *SPIE Proc. On Emerging Lithographic Technologies III*, vol. 3676, 846-858 (Mar. 1999).

Pearlman and Riordan, "X-ray lithography using a pulsed plasma source," J. Vac. Sci. Technol,. pp. 1190-1193 (Nov./Dec. 1981).

Porter, et al., "Demonstration by Population Inversion by Resonant Photopumping in a Neon Gas Cell Irradiated by a Sodium Z Pinch," *Phys. Rev. Let.*, 68(6):796-799, (Feb. 1992).

Price, Robert H., "X-Ray Microscopy using Grazing Incidence Reflection Optics," *Am. Inst. Phys.*, pp. 189-199, (1981).

Qi, et al., "Fluorescence in Mg IX emission at 48.340 Å from Mg pinch plasmas photopumped by A1 XI line radiation at 48.338 Å," *The Am. Phys. Soc.*, 47(3):2253-2263 (Mar. 1993).

Scheuer, et al., "A Magnetically-Nozzled, Quasi-Steady, Multimegawatt, Coaxial Plasma Thruster," *IEEE: Transactions on Plasma Science*, 22(6) (Dec. 1994).

Schriever, et al., "Laser-produced lithium plasma as a narrow-band extended ultraviolet radiation source for photoelectron spectroscopy," *App. Optics*, (Mar. 1998).

Schriever, et al., "Narrowband laser produced extreme ultraviolet sources adapted to silicon/molybdenum multilayer optics," *J. of App. Phys.*, 83(9):4566-4571, (May 1998).

Shiloh et al., "Z Pinch of a Gas Jet," Physical Review Lett., 40(8), pp. 515-518 (Feb. 20, 1978).

Silfvast, et al., "High-power plasma discharge source at 13.5 nm and 11.4 nm for EUV lithography," *SPIE*, vol. 3676:272-275, (Mar. 1999).

Silfvast, et al., "Lithium hydride capillary discharge creates x-ray plasma at 13.5 nanometers," *Laser Focus World*, p. 13. (Mar. 1997).

Stallings et al., "Imploding argon plasma experiments," Appl. Phys. Lett., 35(7), pp. 524-526 (Oct. 1, 1979).

Wilhein, et al., "A slit gating spectrograph for quantitative soft x-ray spectroscopy," *Am. Inst. Of Phys. Rev. Of Sci. Instrum.*, 70(3):1694-1699, (Mar. 1999).

Wu, et al., "The vacuum Spark and Spherical Pinch X-ray/EUV Point Sources," *SPIE, Conf. On Emerging Tech. III*, Santa Clara, CA, vol. 3676:410-420, (Mar. 1999).

Zombeck, M.V., "Astrophysical Observations with High Resolution X-ray Telescope," *Am. Inst. Of Phys.*, pp. 200-209, (1981).

International Search Report, Oct. 6, 2003.

Supplemental Search Report, Oct. 12, 2009

\* cited by examiner

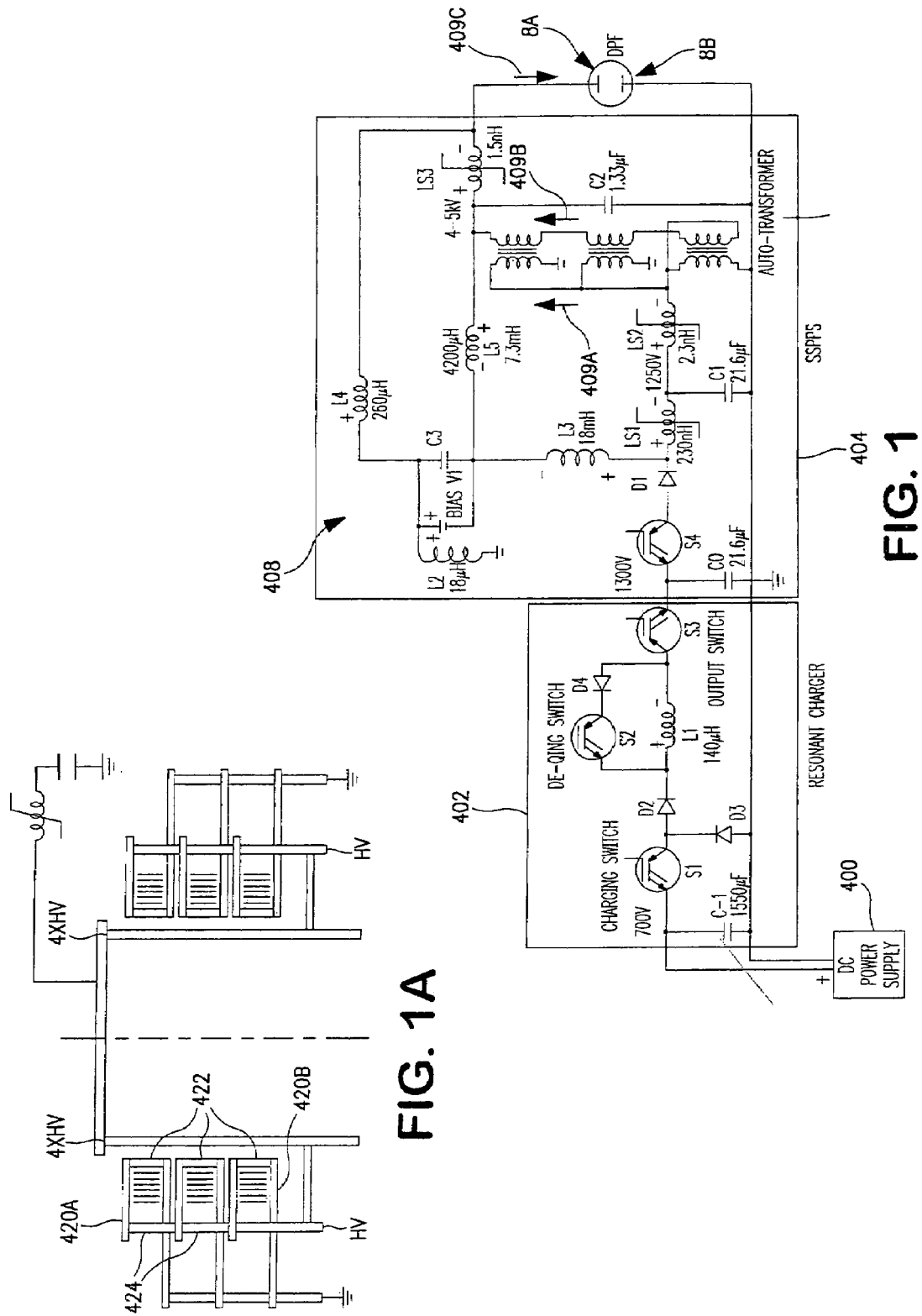

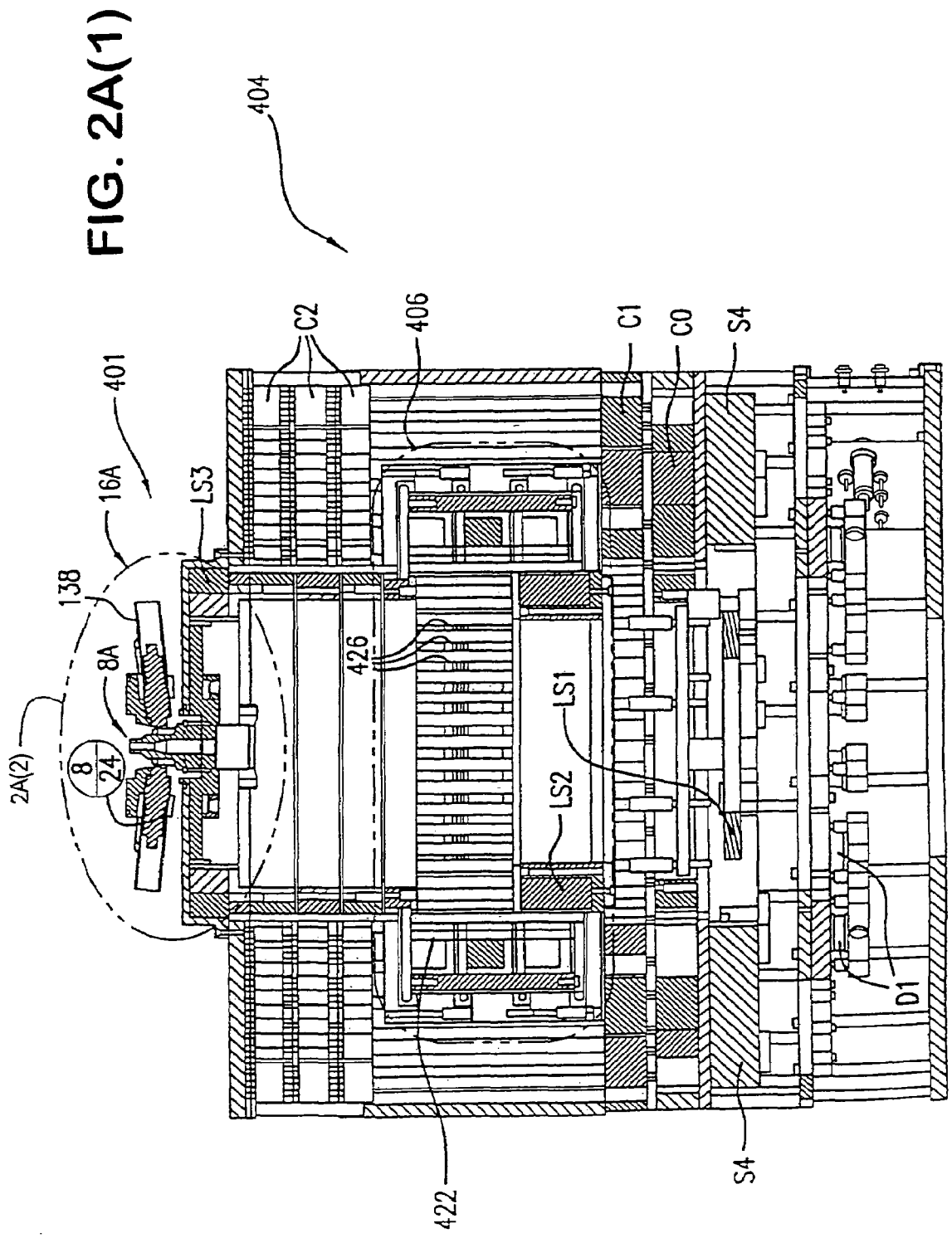
FIG. 2A(1)

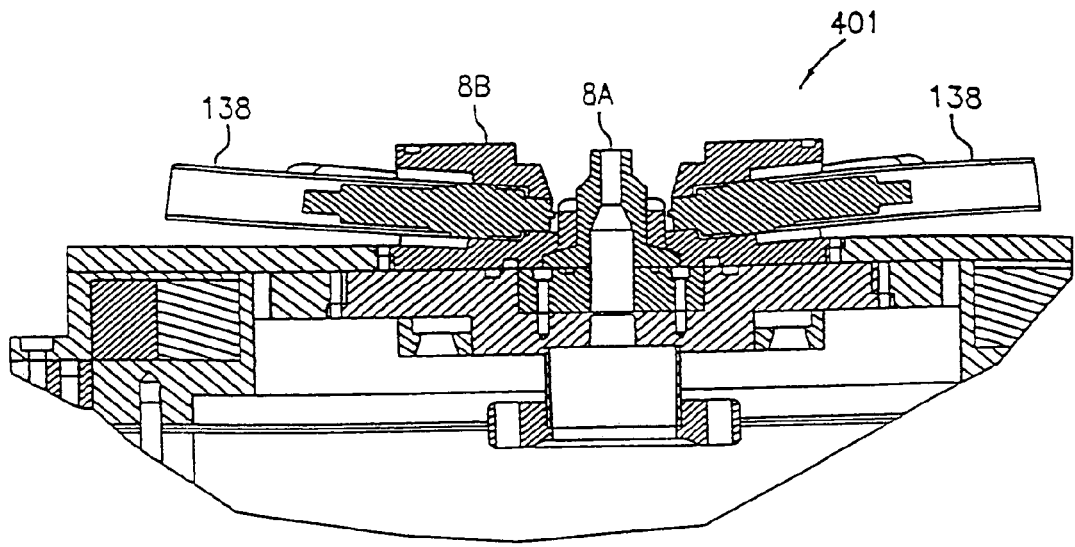
FIG. 2A(2)
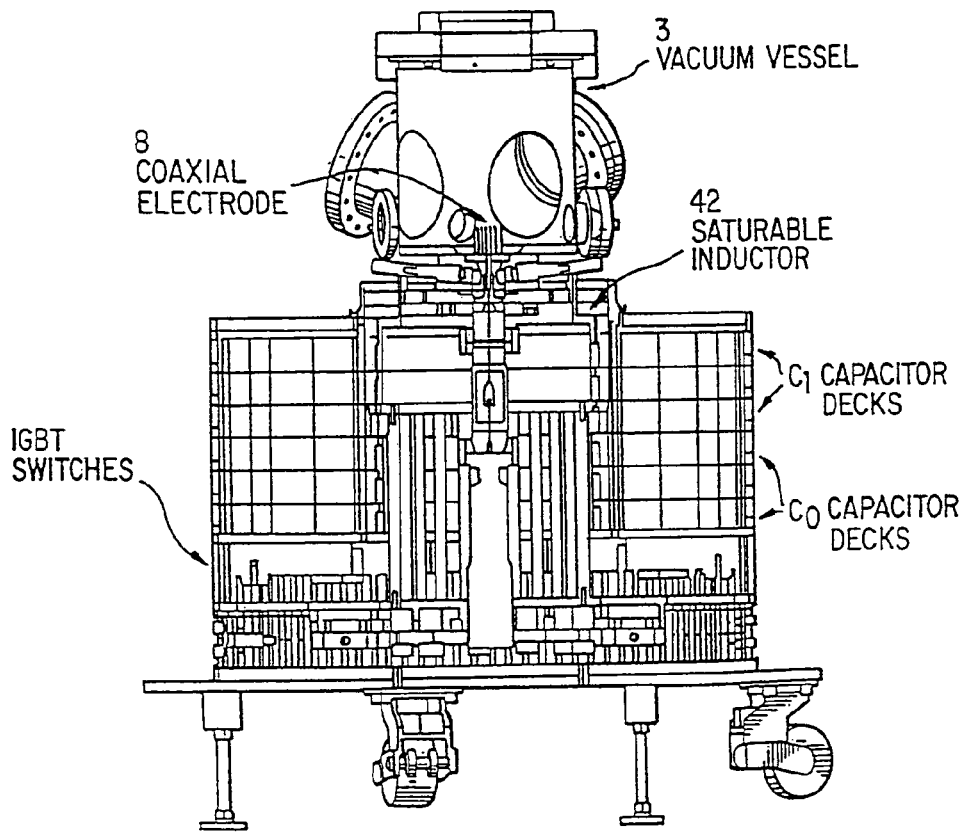
FIG. 2A(3)

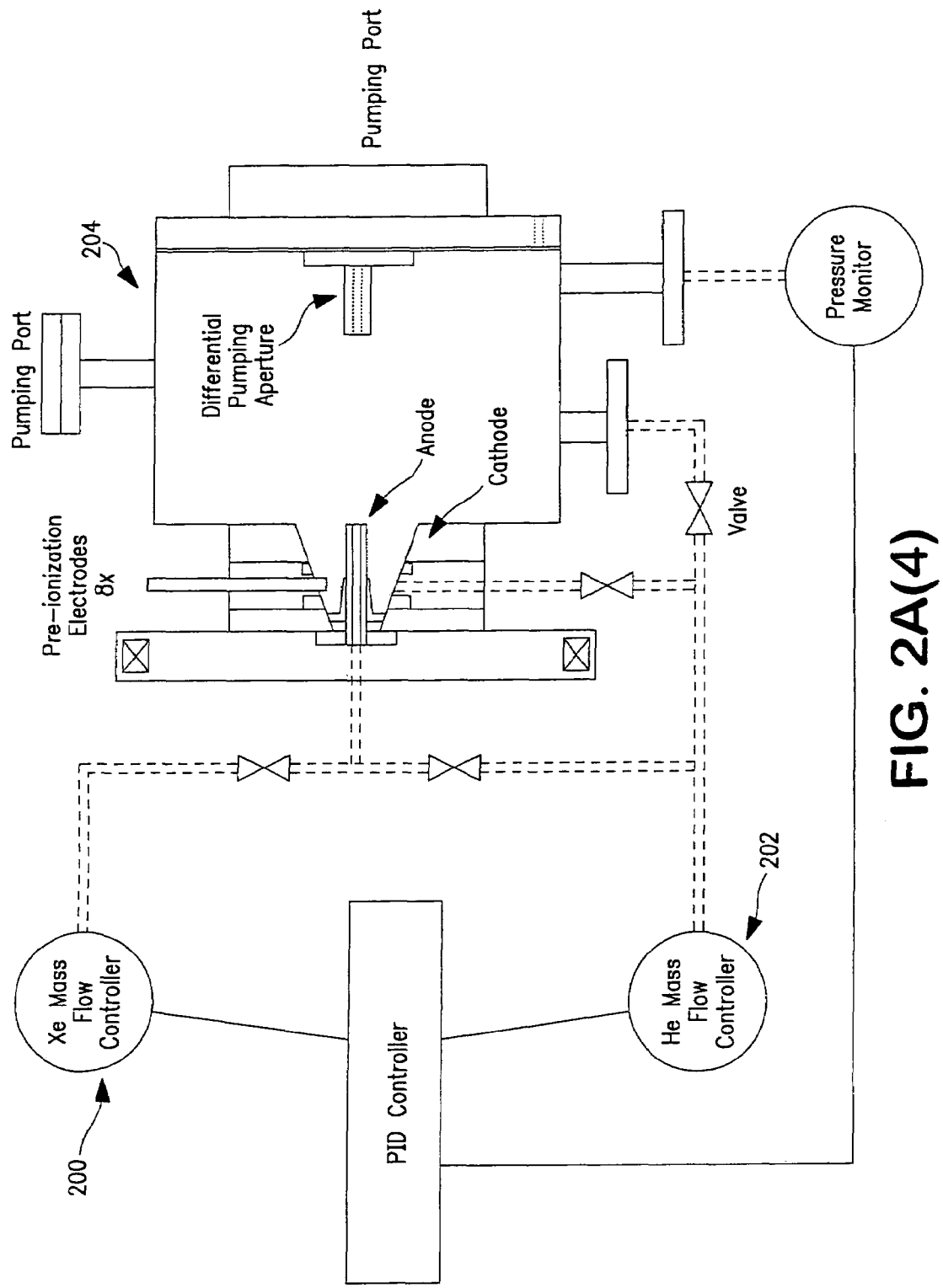
FIG. 2A(4)

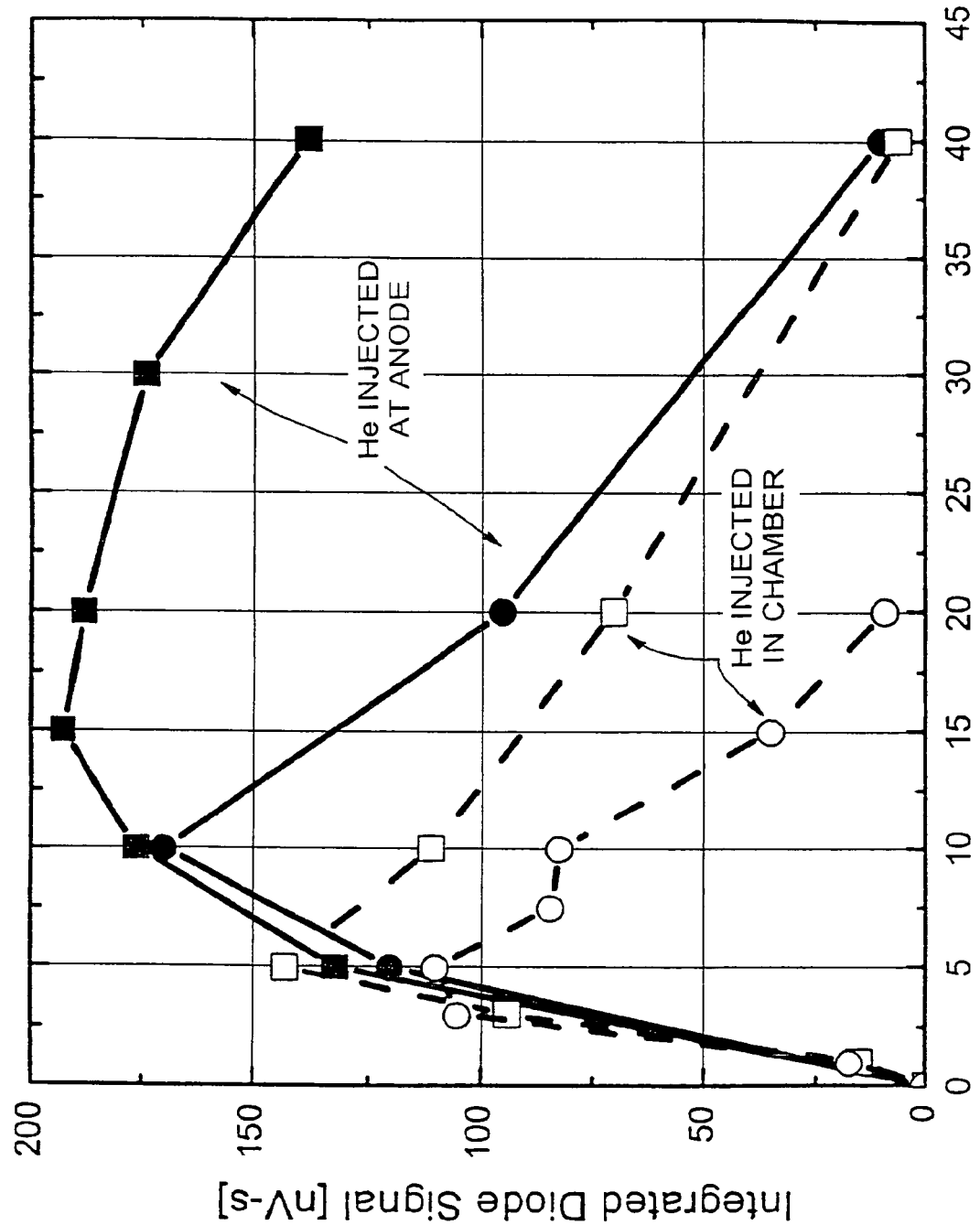
FIG. 2A(5)

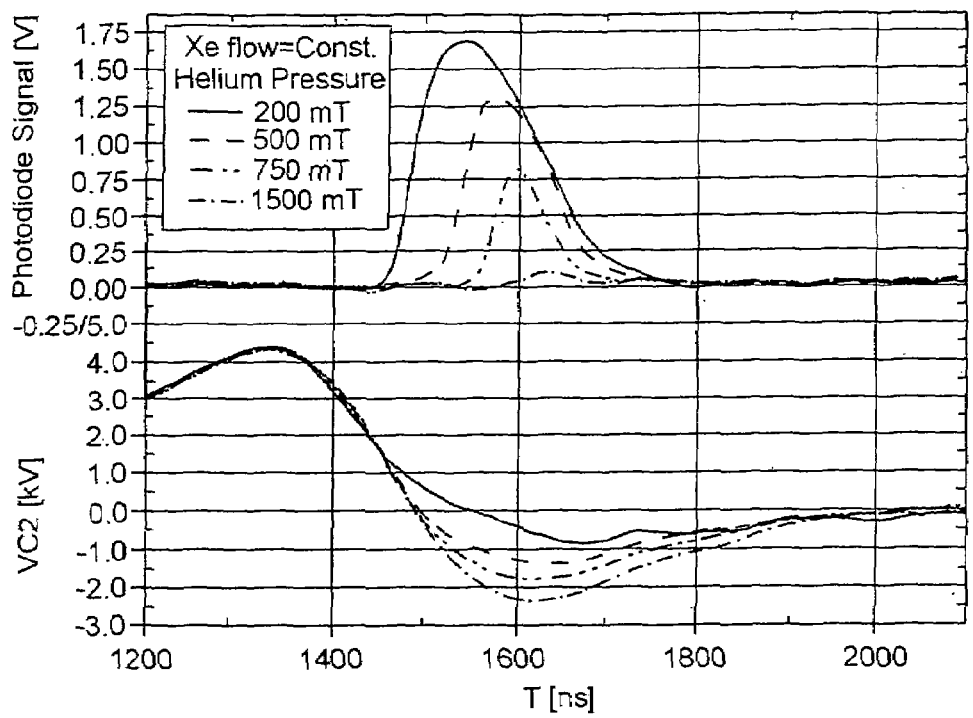
FIG. 2A(6)
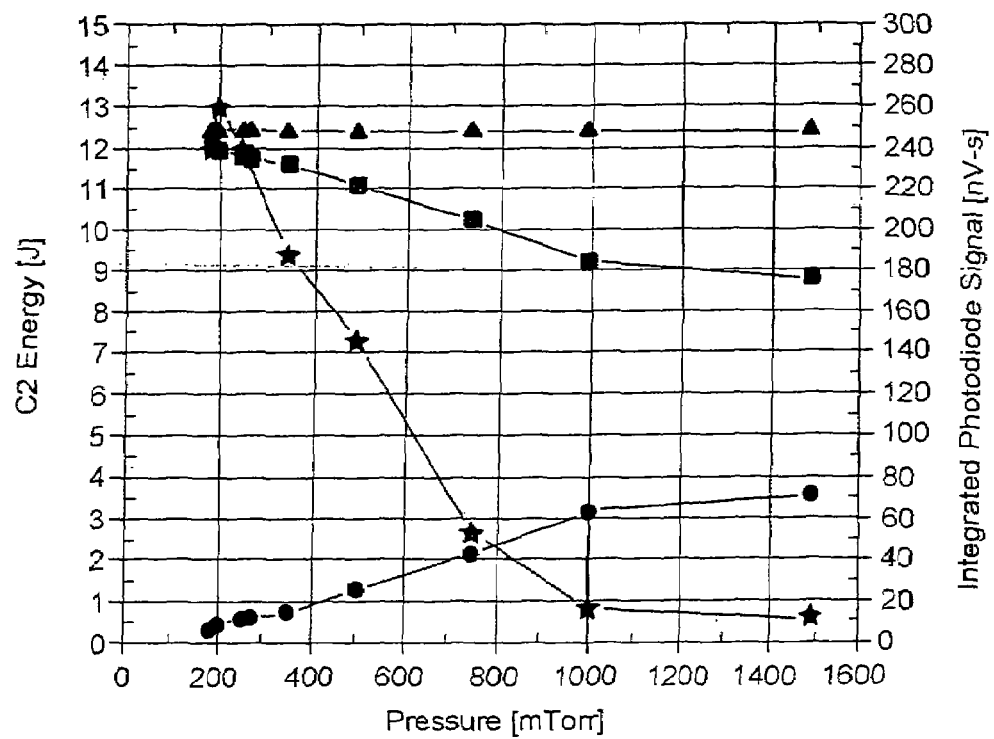
FIG. 2A(7)

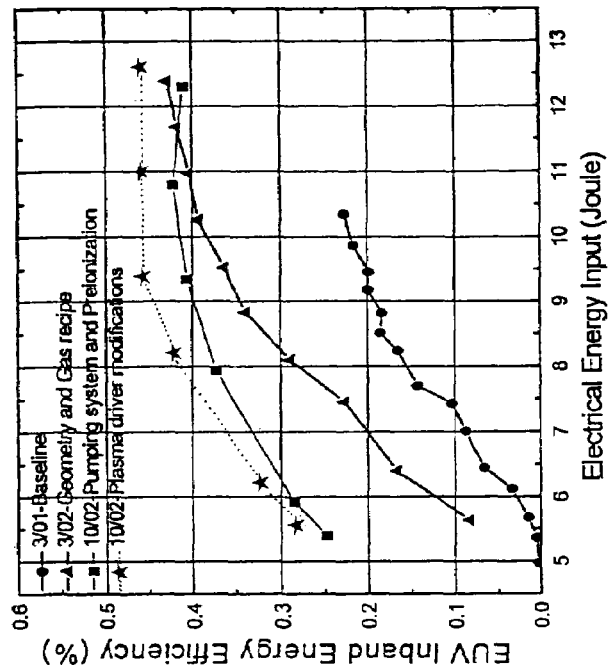
FIG. 2A(9)
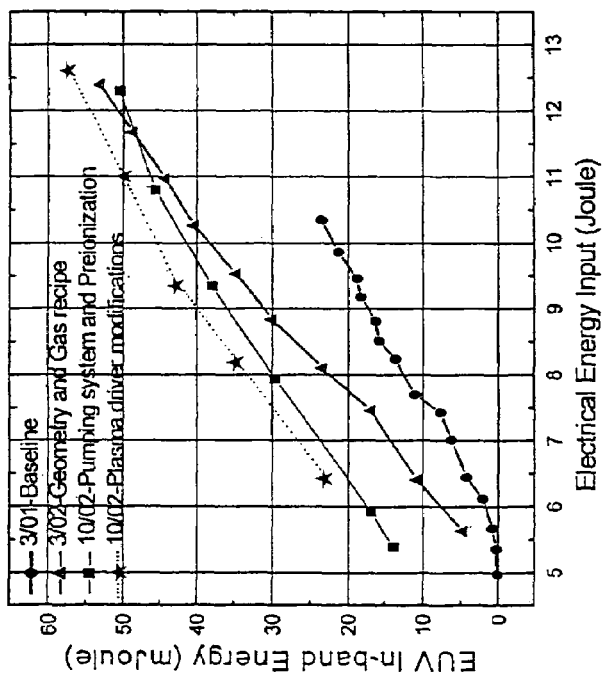
FIG. 2A(8)
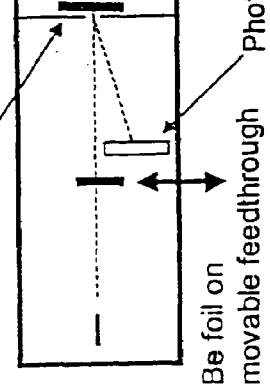
FIG. 2A(10)b
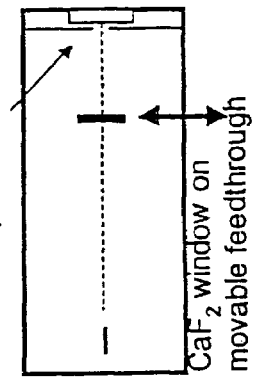
FIG. 2A(10)a

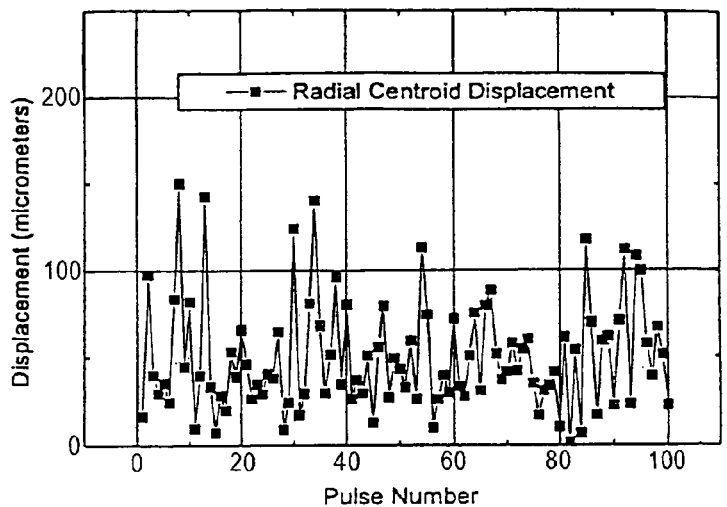
FIG. 2A(11)
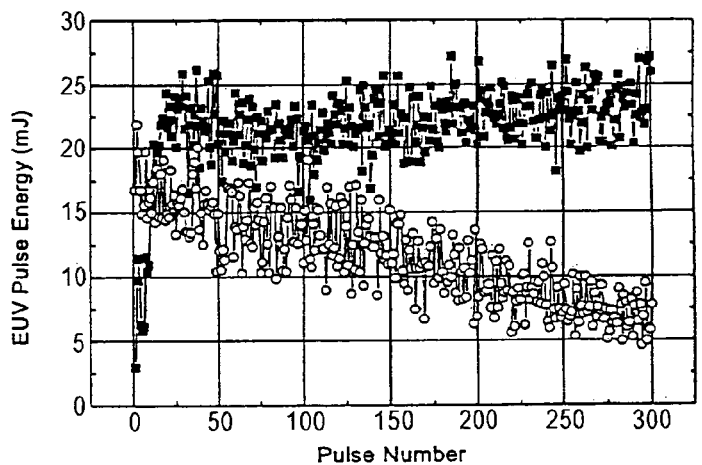
FIG. 2A(12)
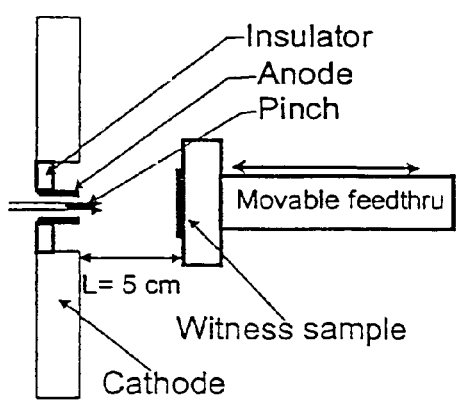
FIG. 2A(13)
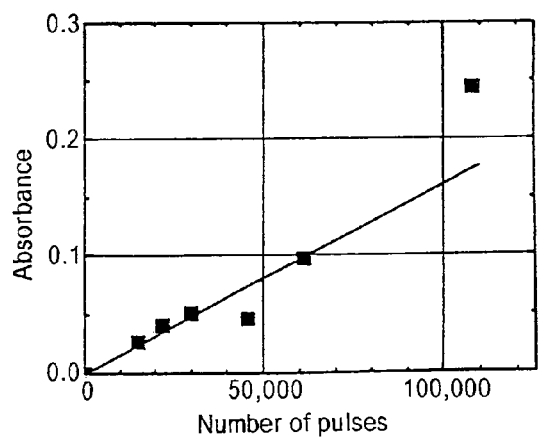
FIG. 2A(14)

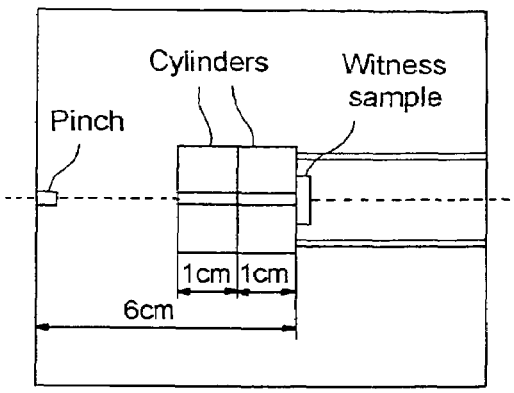
Single channel debris shield
FIG. 2A(15)
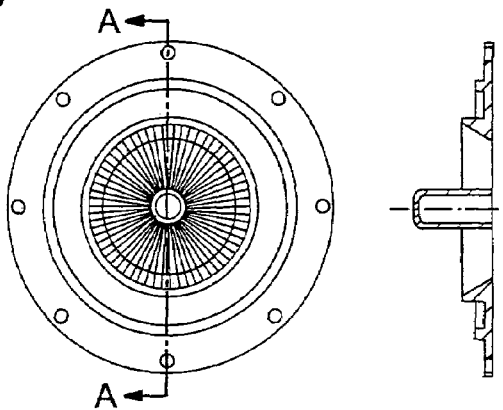
Multichannel debris shield.
Number of channels=60. Length=1 cm.
FIG. 2A(16)
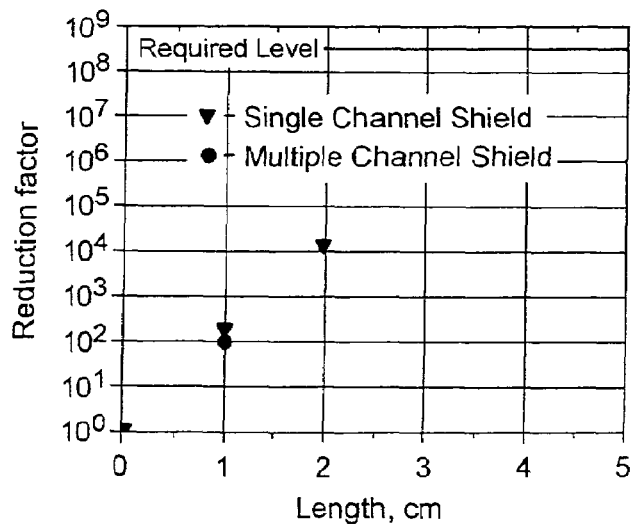
FIG. 2A(17)

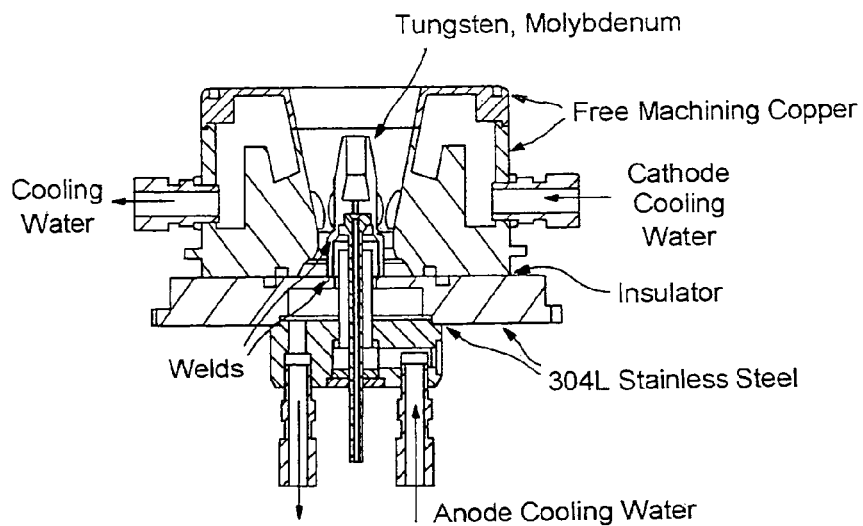
FIG. 2A(18)
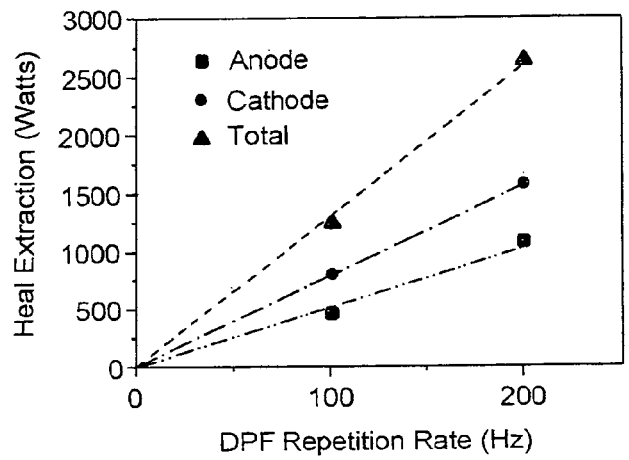
FIG. 2A(19)
| EUV efficiency with Xe, | > 0.4 % |
| --- | --- |
| EUV energy per pulse | 45 mJ |
| Source size | 0.25 x 2 mm |
| Transverse source stability | 50 µm rms |
| Out of band radiation | < 0.5% |
| Continuous repetition rate | 200 Hz |
| Burst repetition rate | 2000 Hz |
| Energy Stability | < 10 % rms |
FIG. 2A(20)

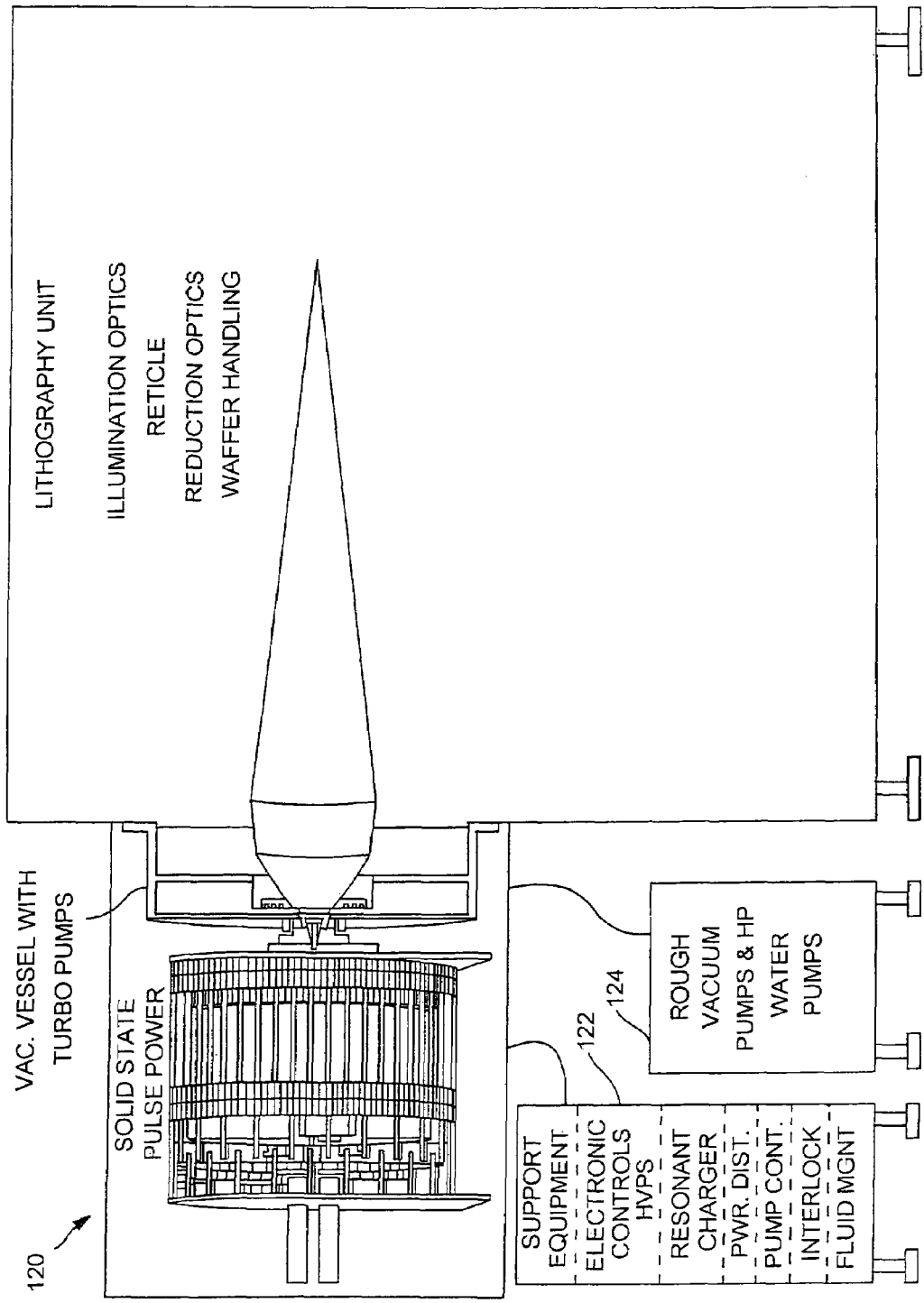
FIG. 2A(21)

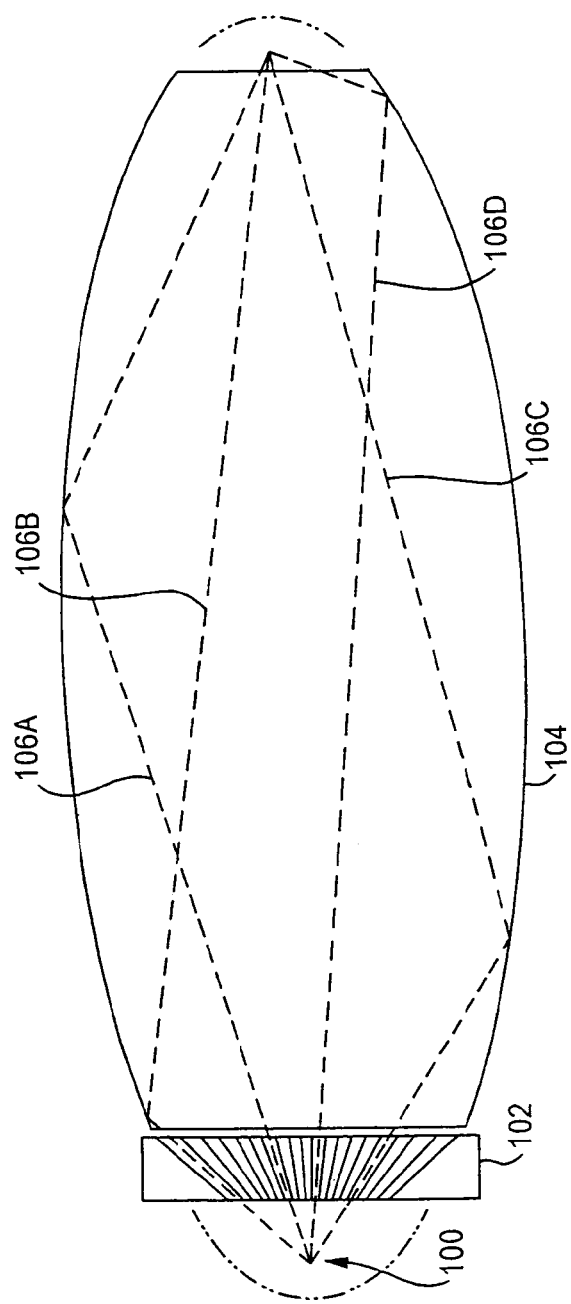
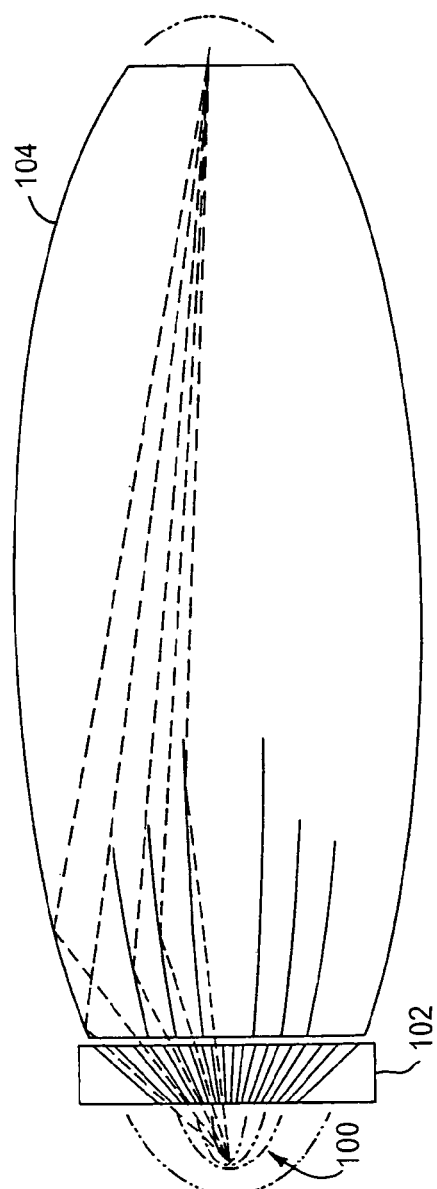

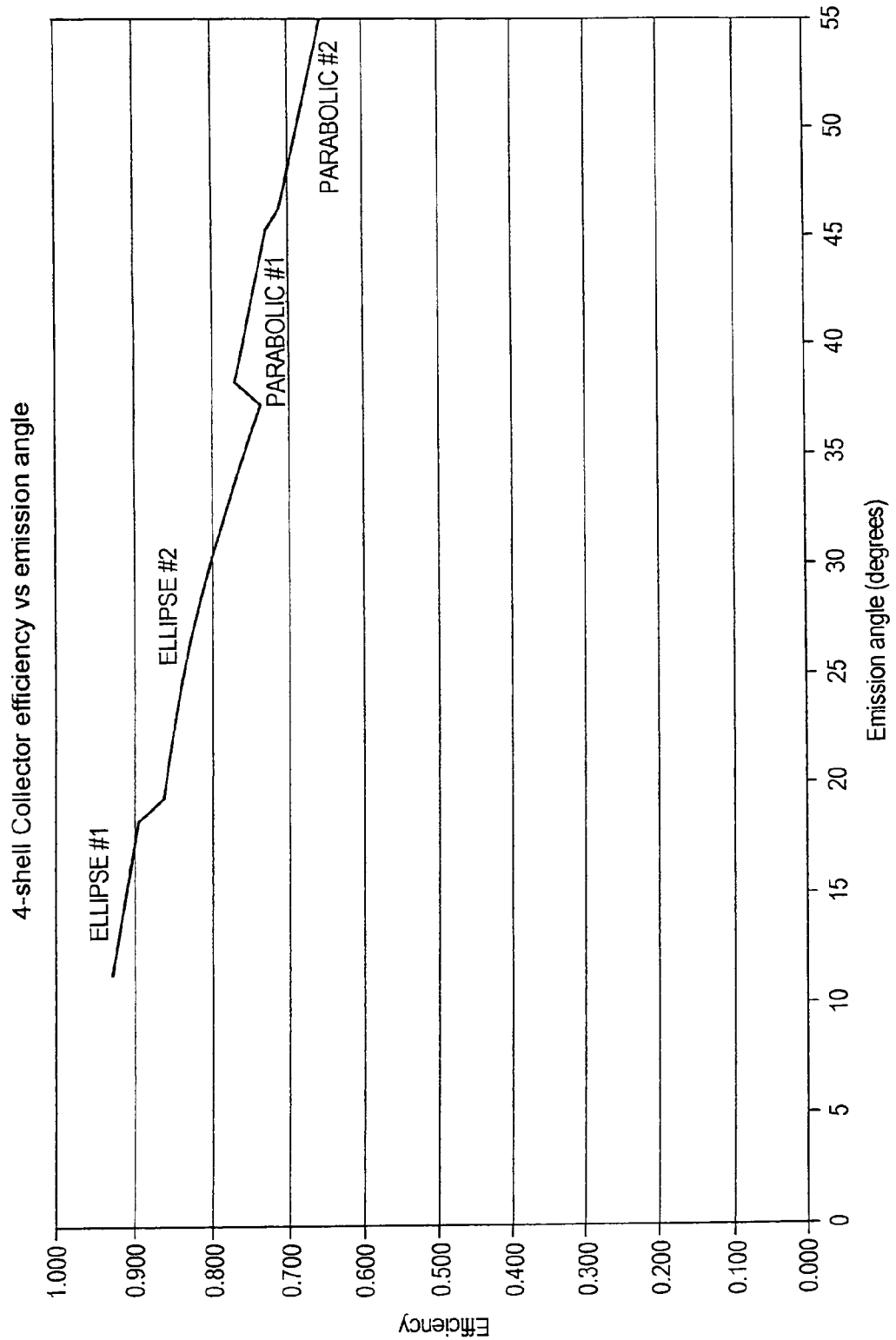

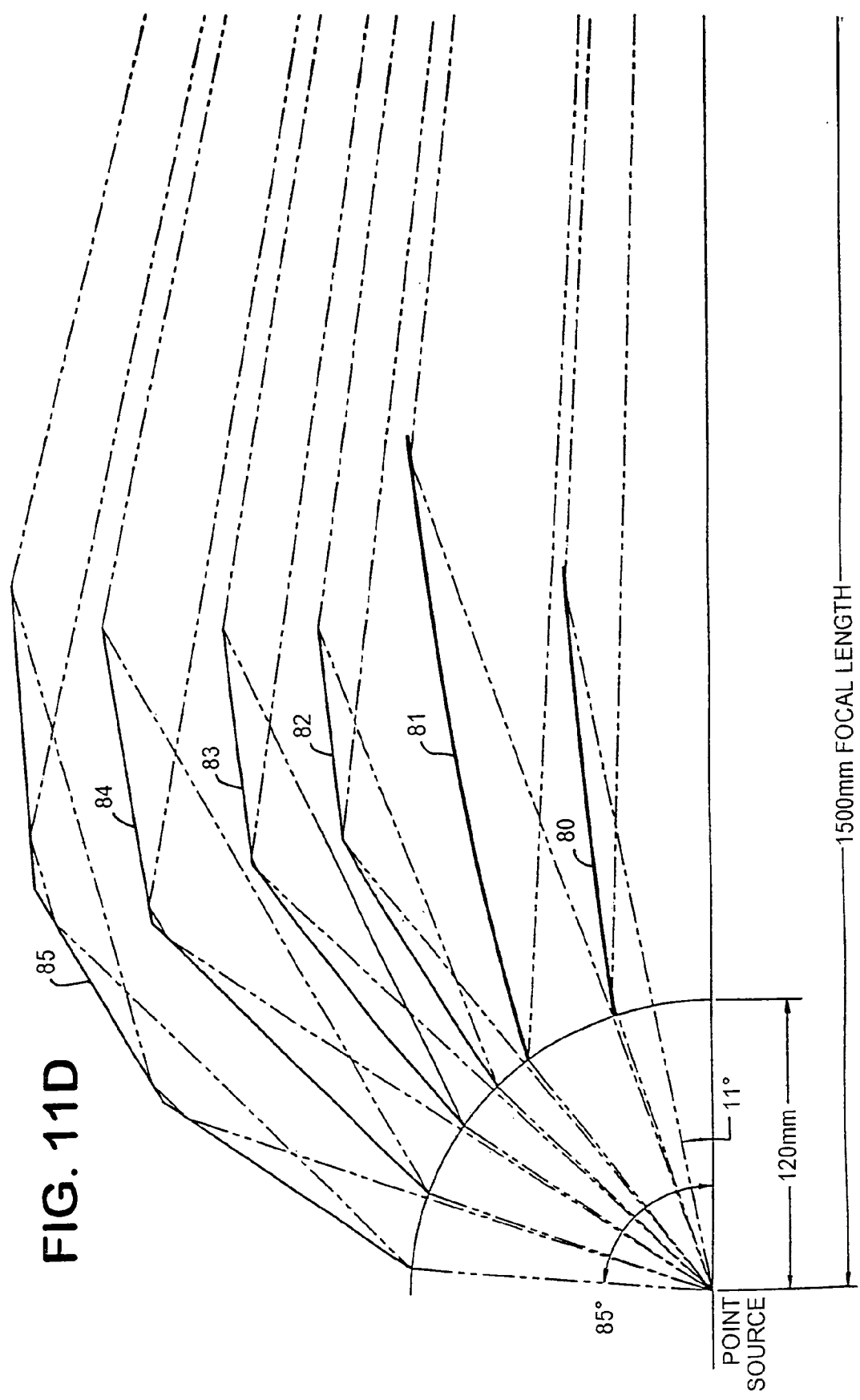

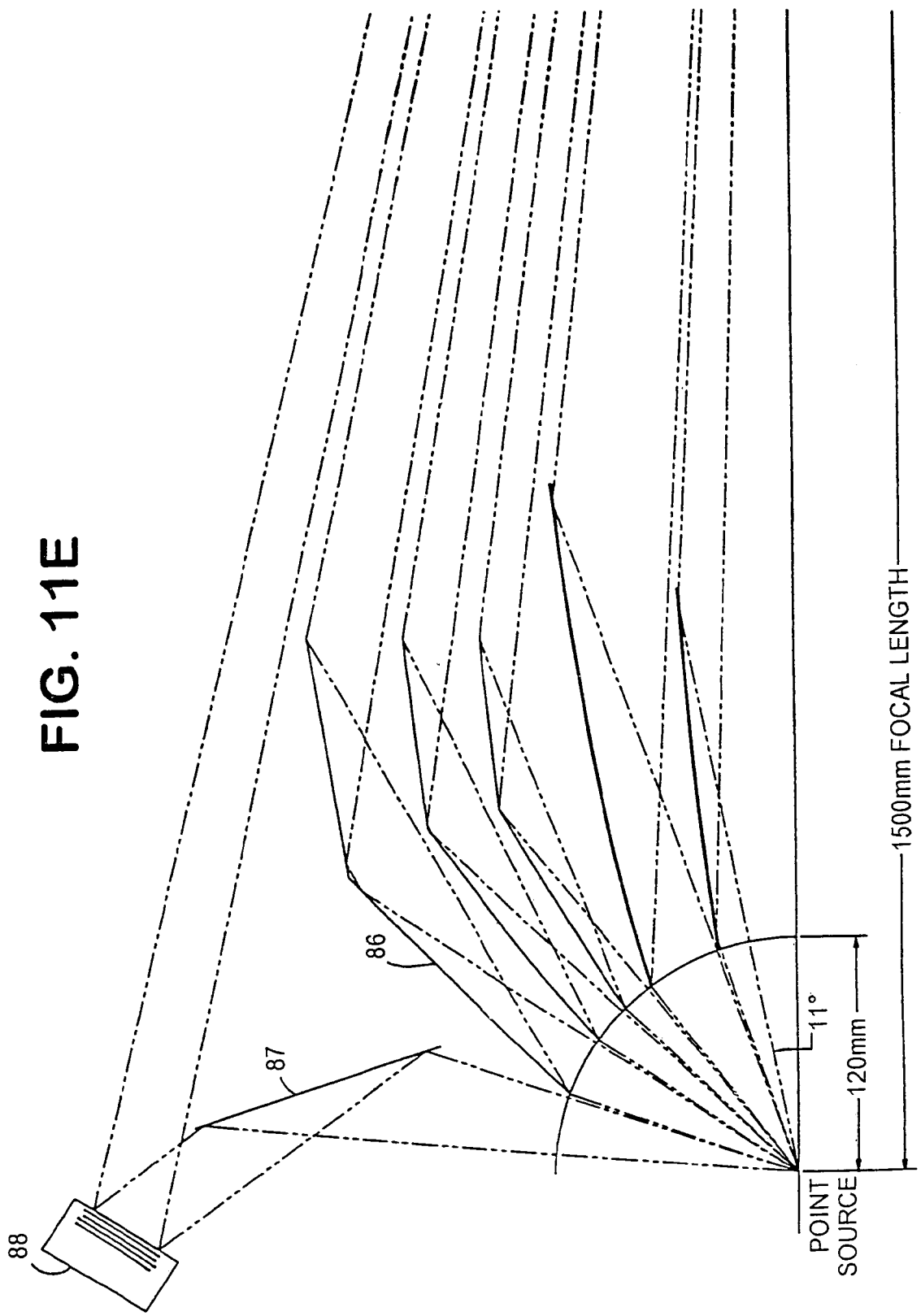

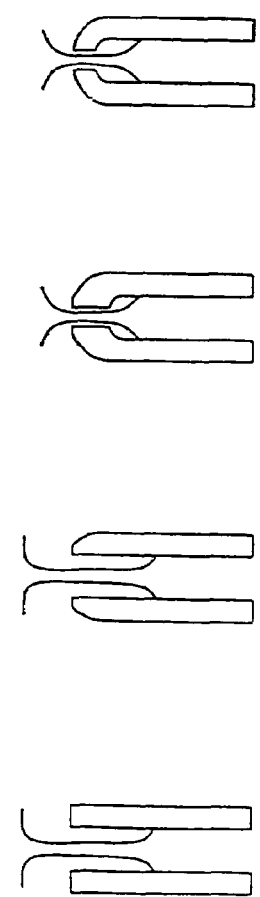
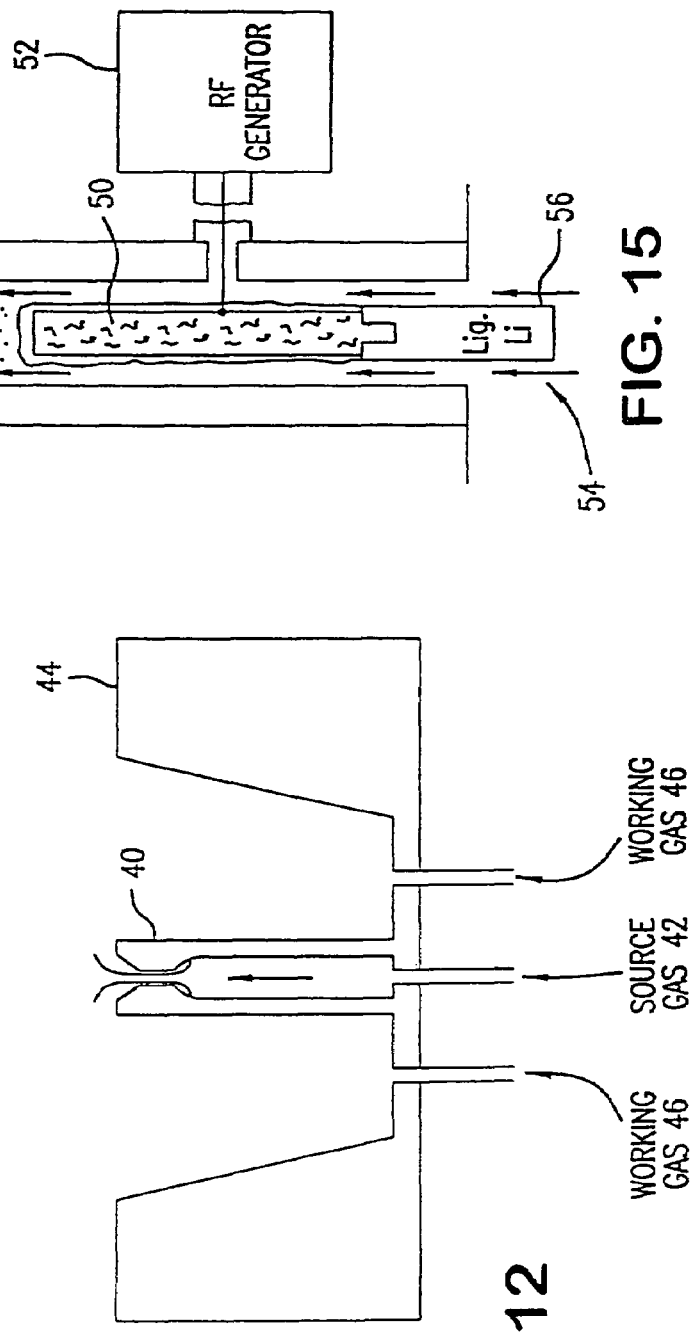
FIG. 14A  FIG. 14B  FIG. 14C  FIG. 14D
FIG. 12
FIG. 15

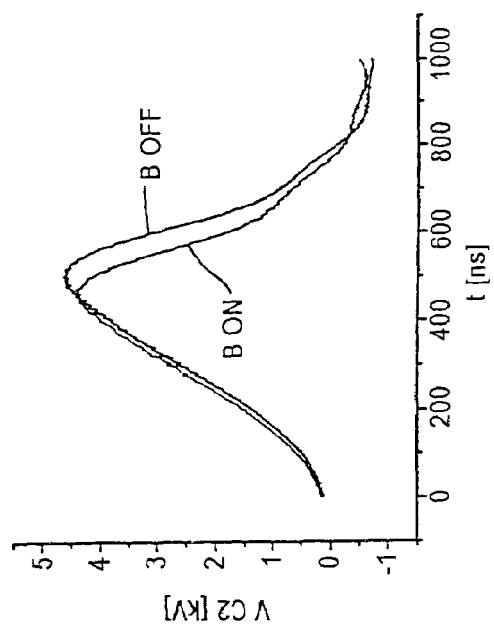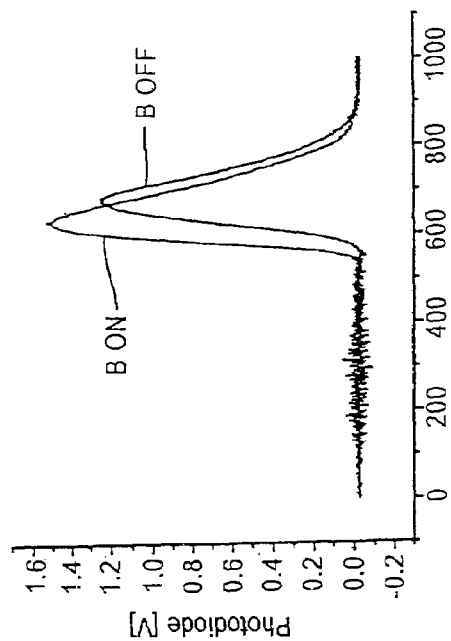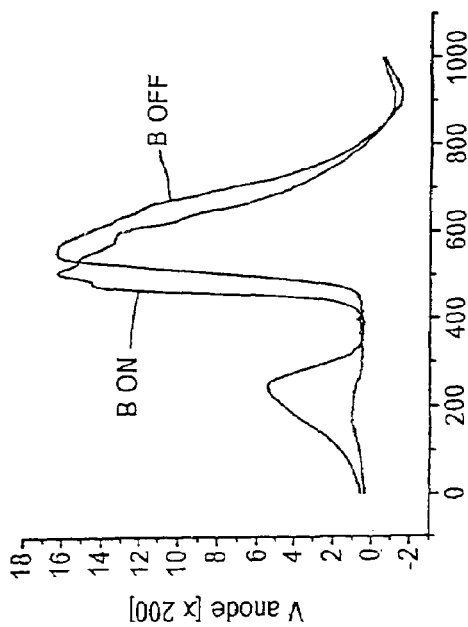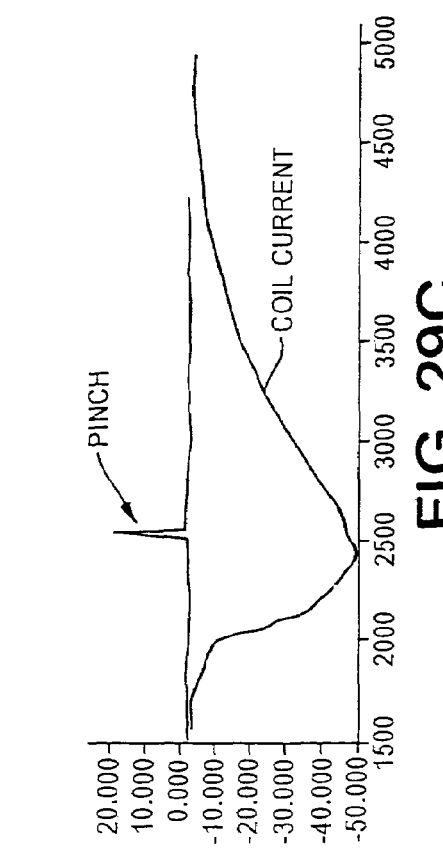
FIG. 29A
FIG. 29B
FIG. 29C
FIG. 30

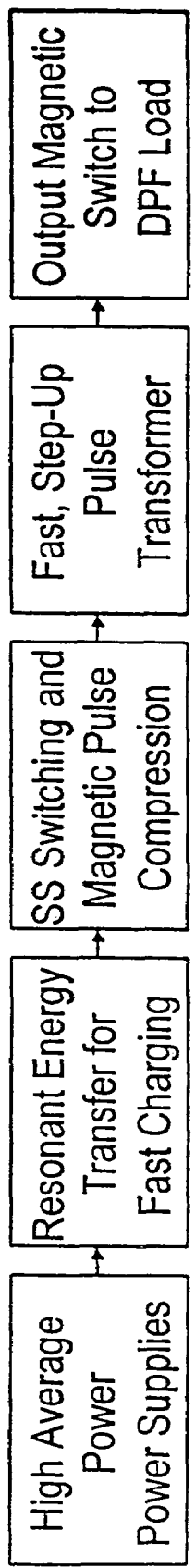

- High Average Power (~30 kW/Module) Power Supplies Provide Initial DC Charging Voltage After Conversion From AC Power Lines

- Resonant Energy Transfer Provides Fast Charging of Pulsed Power System With Tight Regulation to Support High Rep-Rate Operation

- Solid State Switching and Magnetic Pulse Compression Generate Fast Pulses Required by DPF at High Rep-Rates (Up to 10 kHz)

- Fast, Step-Up Pulse Transformer With Low Inductance, Increases Pulse Voltage by 4X While Still Maintaining Fast Risetime

- Output Magnetic Switch Provides Consistent, Reliable Switching of Pulse Energy to DPF Load With Low Inductance, Enabling High Peak Currents and High dI/dt Required for Efficient Pinch Operation

FIG. 33

EXTREME ULTRAVIOLET LIGHT SOURCE

This application continuation of U.S. Ser. No. 11/107,535, filed Apr. 14, 2005 which is a continuation of U.S. Ser. No. 10/409,254, filed Apr. 8, 2003, which is a continuation-in-part of U.S. Ser. No. 10/384,967, filed Mar. 8, 2003, which is a continuation-in-part of Ser. No. 10/189,824, filed Jul. 3, 2002, which is a continuation-in-part of U.S. Ser. No. 10/120,655, filed Apr. 10, 2002, which is a continuation-in-part of U.S. Ser. No. 09/875,719, filed Jun. 6, 2001, which is a continuation-in-part of U.S. Ser. No. 09/875,721, filed Jun. 6, 2001, which is a continuation-in-part of U.S. Ser. No. 09/690,084, filed Oct. 16, 2000; and U.S. Ser. No. 10/409,254 claims the benefit of U.S. Ser. No. 60/422,808, filed Oct. 31, 2002 and U.S. Ser. No. 60/419,805, filed Oct. 18, 2002; all of which are incorporated by reference herein. This invention relates to high-energy photon sources and in particular highly reliable x-ray and high-energy ultraviolet sources.

BACKGROUND OF THE INVENTION

The semiconductor industry continues to develop lithographic technologies, which can print ever-smaller integrated circuit dimensions. These systems must have high reliability, cost effective throughput, and reasonable process latitude. The integrated circuit fabrication industry has recently changed over from mercury G-line (436 ram) and I-line (365 nm) exposure sources to 248 nm and 193 nm excimer laser sources. This transition was precipitated by the need for higher lithographic resolution with minimum loss in depth-of-focus.

The demands of the integrated circuit industry will soon exceed the resolution capabilities of 193 nm exposure sources, thus creating a need for a reliable exposure source at a wavelength significantly shorter than 193 nm. An excimer line exists at 157 nm, but optical materials with sufficient transmission at this wavelength and sufficiently high optical quality are difficult to obtain. Therefore, all-reflective imaging systems may be required. An all reflective optical system requires a smaller numerical aperture (NA) than the transmissive systems. The loss in resolution caused by the smaller NA can only be made up by reducing the wavelength by a large factor. Thus, a light source in the range of 10 to 20 nm is required if the resolution of optical lithography is to be improved beyond that achieved with 193 nm or 157 nm. Optical components for light at wavelengths below 157 nm are very limited. However, effective incidents reflectors are available and good reflectors multi-layer at near normal angles of incidence can be made for light in the wavelength range of between about 10 and 14 nm. (Light in this wavelength range is within a spectral range known as extreme ultraviolet light and some would light in this range, soft x-rays.) For these reasons there is a need for a good reliable light source at wavelengths in this range such as of about 13.5 nm.

The present state of the art in high energy ultraviolet and x-ray sources utilizes plasmas produced by bombarding various target materials with laser beams, electrons or other particles. Solid targets have been used, but the debris created by ablation of the solid target has detrimental effects on various components of a system intended for production line operation. A proposed solution to the debris problem is to use a frozen liquid or liquidfied or frozen gas target so that the debris will not plate out onto the optical equipment. However, none of these systems have so far proven to be practical for production line operation.

It has been well known for many years that x-rays and high energy ultraviolet radiation could be produced in a plasma pinch operation. In a plasma pinch an electric current is passed through a plasma in one of several possible configuration such that the magnetic field created by the flowing electric current accelerates the electrons and ions in the plasma into a tiny volume with sufficient energy to cause substantial stripping of outer electrons from the ions and a consequent production of x-rays and high energy ultraviolet radiation. Various prior art techniques for generation of high energy radiation from focusing or pinching plasmas are described in the background section of U.S. Pat. No. 6,452,199.

Typical prior art plasma focus devices can generate large amounts of radiation suitable for proximity x-ray lithography, but are limited in repetition rate due to large per pulse electrical energy requirements, and short lived internal components. The stored electrical energy requirements for these systems range from 1 kJ to 100 kJ. The repetition rates typically did not exceed a few pulses per second.

What is needed are production line reliable, systems for producing collecting and directing high energy ultraviolet x-radiation within desired wavelength ranges which can operate reliably at high repetition rates and avoid prior art problems associated with debris formation.

SUMMARY OF THE INVENTION

The present invention provides a reliable, high-repetition rate, production line compatible high energy photon source. A very hot plasma containing an active material is produced in vacuum chamber. The active material is an atomic element having an emission line within a desired extreme ultraviolet (EUV) wavelength range. A pulse power source, comprising a charging capacitor and a magnetic compression circuit comprising a pulse transformer, provides electrical pulses having sufficient energy and electrical potential sufficient to produce the EUV light at an intermediate focus at rates in excess of 5 Watts on a continuous basis and in excess of 20 Watts on a burst basis. In preferred embodiments designed by Applicants in-band, EUV light energy at the intermediate focus is 45 Watts extendable to 105.8 Watts.

In preferred embodiments the high energy photon source is a dense plasma focus device with co-axial electrodes. The electrodes are configured co-axially. The central electrode is preferably hollow and an active gas is introduced out of the hollow electrode. This permits an optimization of the spectral line source and a separate optimization of a buffer gas. In preferred embodiments the central electrode is pulsed with a high negative electrical pulse so that the central electrode functions as a hollow cathode. Preferred embodiments present optimization of capacitance values, anode length and shape and preferred active gas delivery systems are disclosed. Special techniques are described for cooling the central electrode. In one example, water is circulated through the walls of the hollow electrode. In another example, a heat pipe cooling system is described for cooling the central electrode.

An external reflection radiation collector-director collects radiation produced in the plasma pinch and directs the radiation in a desired direction. Good choices for the reflector material are molybdenum, palladium, ruthenium, rhodium, gold or tungsten. In preferred embodiments the active material may be xenon, lithium vapor, tin vapor and the buffer gas is helium and the radiation-collector is made of or coated with a material possessing high grazing incidence reflectivity. Other potential active materials are described.

In preferred embodiments the buffer gas is helium or argon. Lithium vapor may be produced by vaporization of solid or liquid lithium located in a hole along the axis of the central electrode of a coaxial electrode configuration. Lithium may also be provided in solutions since alkali metals dissolve in amines. A lithium solution in ammonia ($NH_3$) is a good candidate. Lithium may also be provided by a sputtering process in which pre-ionization discharges serves the double purpose of providing lithium vapor and also pre-ionization. In preferred embodiments, debris is collected on a conical nested debris collector having surfaces aligned with light rays extending out from the pinch site and directed toward the radiation collector-director. The reflection radiation collector-director and the conical nested debris collector could be fabricated together as one part or they could be separate parts aligned with each other and the pinch site.

This prototype devices actually built and test by Applicants convert electrical pulses (either positive or negative) of about 10 J of stored electrical energy per pulse into approximately 50 mJ of in-band 13.5 nm radiation emitted into $2\pi$ steradians. Thus, these tests have demonstrated a conversion efficiency of about 0.5%, Applicants estimate that they can collect about 20 percent of the 50 mJ 13.5 nm radiation so that this demonstrated collected energy per pulse will be in about of 10 mJ. Applicants have demonstrated 1000 Hz continuous operation and 4000 Hz short burst operation. Thus, 10 Watt continuous and 40 Watt burst outputs have been demonstrated. Using collection techniques designed by Applicants about half of this energy can be delivered to an intermediate focus distant from the plasma source. Thus providing at least 5 Watts of in band EUV light at the intermediate focus on a continuous basis and at least 20 Watts on a burst basis. Applicants have also shown that the techniques described herein can be applied to provide outputs in the range of 60 Watts at repetition rates of 5,000 Hz or greater. At 2000 Hz, the measured pulse-to-pulse energy stability, (standard deviation) was about 9.4% and no drop out pulses were observed. The electrical circuit and operation of this prototype DPF device is presented along with a description of several preferred modifications intended to improve stability, efficiency and performance.

In other embodiments the plasma may be produced in other plasma pinch devices such as a conventional z pinch device, a hollow cathode z-pinch or a capillary discharge or the plasma may be produced with a pulsed gas discharge laser beam. The pulse power or each of these sources is produced with a pulse power system as described herein and in each the EUV light preferably is produced collected and is preferably delivered to an intermediate focus using one or more of the techniques described herein.

The present invention provides a practical implementation of EUV lithography in a reliable, high brightness EUV light source with emission characteristics well matched to the reflection band of the Mo/Si or Mo/Be mirror systems. Tests by Applicants have demonstrated an improved electrode configuration in which the central electrode configuration in which the central electrode is hollow and configured as a cathode. For this configuration the hollow cathode produces its own pre-ionization so special pre-ionization is not needed.

BRIEF DESCRIPTION OF THE DRAWINGS

FIG. 1 is an electrical drawing of a pulse power system useful as a power source for EUV and soft x-ray sources.

FIG. 1A shows structure elements of a pulse transformer.

FIGS. 2A(1) and 2A(2) are cross-section drawings of a plasma pinch prototype EUV device.

FIG. 2A(3) shows the prototype with vacuum chamber.

FIG. 2A(4) shows flow cooled equipment.

FIG. 2A(5) shows effects of flow on output.

FIGS. 2A(6)-(20) show performance data.

FIG. 2A(21) shows a special DPF configuration.

FIGS. 9, 9A, 9B, and 9C show combinations of radiation collectors and a debris collector.

FIGS. 11B, 11C, 11D, and 11E show collector designs.

FIG. 12 is a drawing showing a technique for introducing source gas and working gas.

FIGS. 14A, 14B, 14C and 14D show the effect of various central electrode designs on the plasma pinch.

FIG. 15 is a drawing showing a technique for using RF energy to operate lithium vapor source gas.

FIG. 25 shows a technique for reducing electrode erosion.

FIGS. 29A, 29B, and 29C show pulse shapes.

FIG. 30 shows a pulse shape.

FIG. 33 shows advantages of dense plasma focus.

DETAILED DESCRIPTION OF PREFERRED EMBODIMENTS

Hot Plasmas

To produce light in the spectral range of 13-14 nm from plasma requires a very hot plasma corresponding to temperatures of in the range of several thousand degrees Celsius. Plasmas at these temperatures can be created by focusing a very high power (very short pulse) laser beam or a high energy electron beam on the surface of a metal target. It is also possible to produce very hot plasma in a gas with electric discharges using any of several special discharge techniques which focus or pinch the plasma. These techniques included (1) a dense plasma focus technique (2) a regular Z-pinch technique, (3) a hollow cathode Z-pinch and (4) a capillary discharge technique. All of these techniques are discussed in greater detail below. For use as a lithography light source for integrated circuit fabrication the light source and the power supply for it should be capable of continuous, reliable, round-the-clock operation for many billions of pulses. This is because the lithography machines and the associated fabrication lines are extremely expensive and any unscheduled down time could represent losses of hundreds of thousands of dollars per hour.

Atomic Sources For 12-14 nm EUV Spectral Lines

Figure 11A:
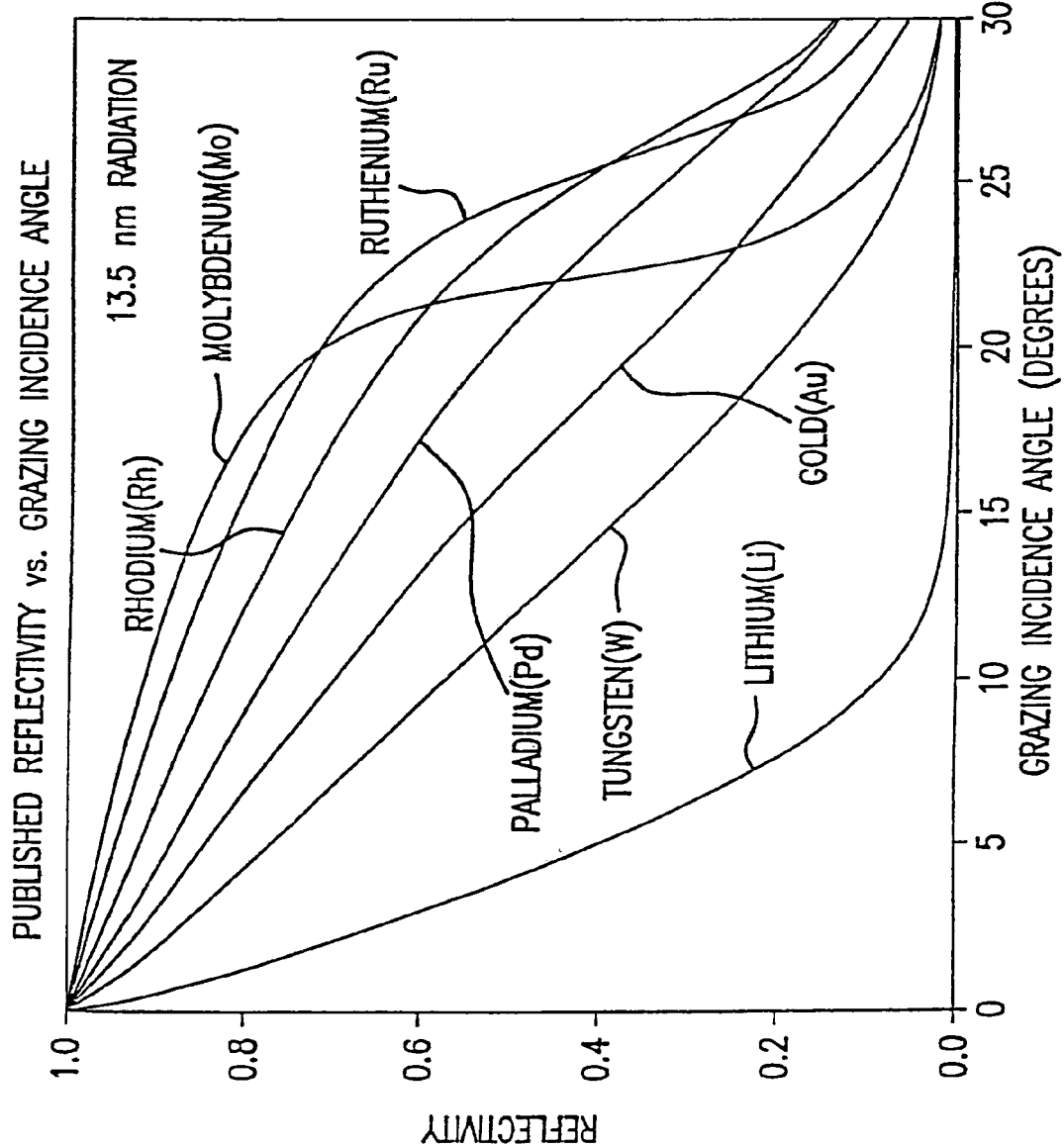
FIG. 11A is a chart showing reflectivity of various materials for 13.5 nm ultraviolet radiation.

As stated in the background section of this specification good mirrors are available providing reflectances in the range of about 70% or higher in the wavelength the range of between about 10 and 14 nm. These mirrors typically provide reflectances at these high values only over a more narrow spectral range within the 12 to 14 nm range. For example, the mirror depicted in FIG. 11A provides reflectances of about 70% over the spectral range of about 13.2 to 13.8 nm. This mirror can be described as having a reflectance of about 0.7 at 13.5 nm with a FWHM bandwidth of 0.5 nm. These mirrors can be effectively utilized for lithography machines for future integrated circuit lithography. Plasma producing devices described below, including those shown in FIGS. 2A through 2D produce spot plasmas with extremely high temperatures in the range of several thousand degrees Celsius but the spectrum of light emitted is spread over a very wide range. To produce light within the desired range of about 13-14 nm, hot spot plasma should include an atomic target material with spectral lines in the 13-14 nm range. Several potential target materials are known including xenon, lithium and tin. The best choice of target materials involve trade-offs relating to spectra available, efficiency of conversion of plasma energy to energy in the desired spectrum, difficulty of injecting the target into the plasma region, debris problems. Some preferred target and techniques for dealing with these issues are discussed below. (The reader should understand that all elements produce spectral lines at high temperature and that these lines are well documented so that if light at other wavelengths is desired, it is a rather straight forward matter to search the literature for a suitable target material which when heated in a plasma will produce a good line at the wavelength of interest).

Xenon

Figure 3B:
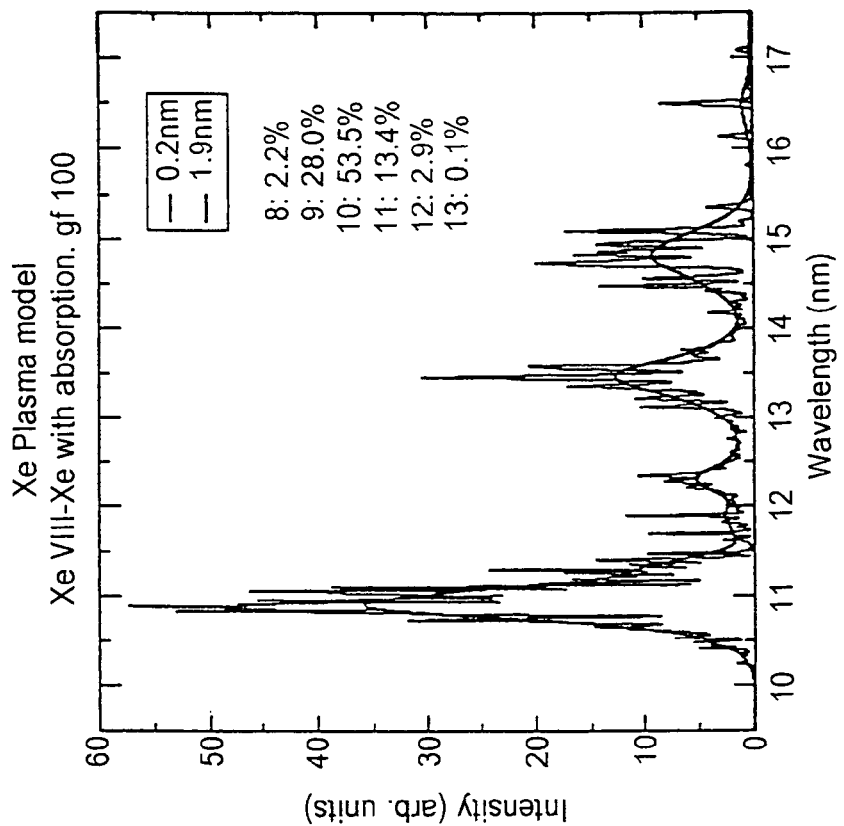
FIGS. 3A and 3B show xenon spectra.
Figure 3A:
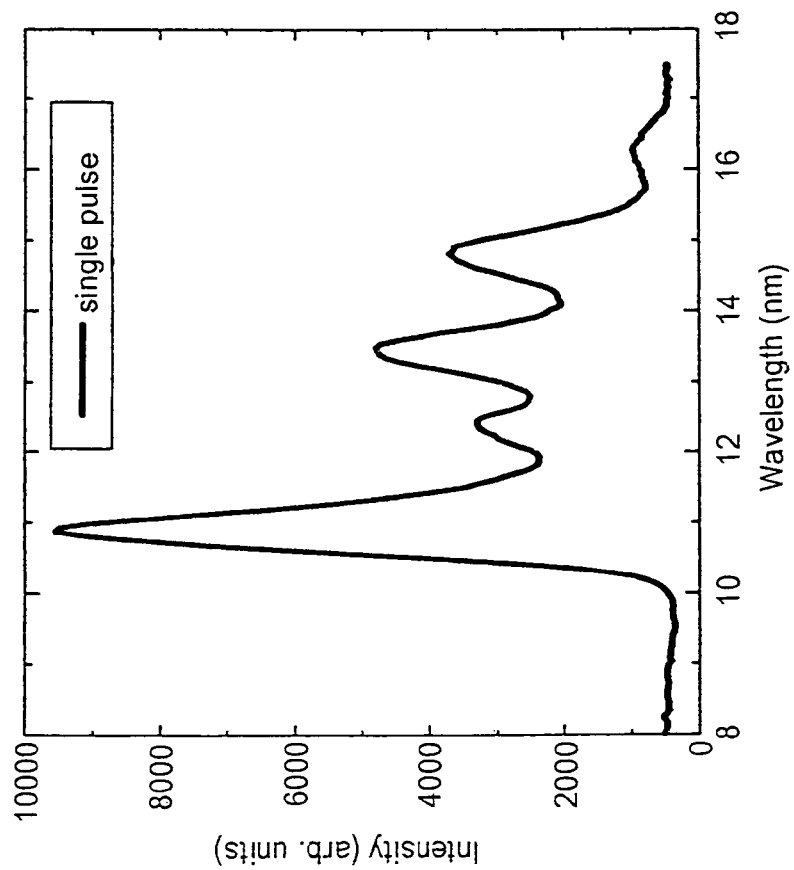

Xenon is a preferred atomic target. It is a nobel gas therefore, it does not present a debris problem. It has relatively good spectral lines within the 13 to 14 nm range as shown in FIGS. 3A and 3B. FIG. 1A shows EUV Xe spectra measured by Applicants. FIG. 3A shows a measured single pulse spectrum. FIG. 3B shows a calculated theoretical Xe spectron. It can can be added as a constituent part of the buffer gas in the discharge chamber, or it an be injected close to the discharge or pinch region so that its concentration is greater there. It can also be cooled to below its boiling point and injected into the discharge or pinch region as a liquid or a solid so that its atomic concentration is greatly increased in the plasma. Certain xenon compounds (such as xenon oxifluoride) might also make good target materials.

Lithium

Lithium is also well known as a potential target material. It is a solid at standard temperatures and it does pose a debris problem. Also, special techniques must be devised when adding atomic lithium to the discharge or pinch region. Some of those techniques are described in the parent patent applications and in prior art sources and other techniques are described below. Lithium can be injected into the chamber as a solid, liquid or a vapor.

Tin

Tin is also a preferred target material since it has some intense spectral lines in the desired range. However, like lithium it is a solid at standard temperatures and does pose a debris problem since it could potentially plate out on optical surfaces.

PULSE POWER SYSTEM

Electrical Circuit

Need for Long Life Reliable Pulse Power

Several prior art pulse power supply systems are known for supplying short electrical high voltage pulses to create the discharges in these devices. However, none of these prior art power supplies provides the reliability and control features needed for high repetition rate; high power long-life and reliability needed for integrated circuit lithographic production. Applicants have, however, built and tested a pulse power system relying in part on technology developed by Applicants for their excimer laser light sources. These excimer lasers producing 248 nm and 193 nm light, are currently extensively used as light sources for integrated circuit fabrication. A long life reliable pulse power system for EUV devices built and tested by Applicants as part of a fourth generation plasma focus device is described in the following sections.

A description of the electrical circuit diagram of this preferred pulse power system with reference to FIG. 1 and occasionally to FIGS. 1A, 2A and B is set forth below.

A conventional approximately 700 V dc power supply 400 is used to convert AC electrical power from utility 208 Volt, 3 phase power into approximately 700 V dc 50 amp power. This power supply 400 provides power for resonant charger unit 402. Power supply unit 400 charges up a large 1550 μF capacitor bank, C-1. Upon command from an external trigger signal, the resonant charger initiates a charging cycle by closing the command-charging switch, S1. Once the switch closes, a resonant circuit is formed from the C-1 capacitor, a charging inductor L1, and a C0 capacitor bank which forms a part of solid pulse power system (SSPPS) 404. Current therefore begins to discharge from C-1 through the L1 inductor and into C0, charging up that capacitance. Because the C-1 capacitance is much, much larger than the C0 capacitance, the voltage on C0 can achieve approximately 2 times the initial voltage of that on C-1 during this resonant charging process. The charging current pulse assumes a half-sinusoidal shape and the voltage on C0 resembles a "one minus cosine" waveform.

In order to control the end voltage on C0, several actions may take place. First, the command-charging switch S1 can be opened up at any time during the normal charging cycle. In this case, current ceases to flow from C-1 but the current that has already been built up in the charging inductor continues to flow into C0 through the free-wheeling diode D3. This has the effect of stopping any further energy from C-1 from transferring to C0. Only that energy left in the charging inductor L1 (which can be substantial) continues to transfer to C0 and charge it to a higher voltage.

In addition, the de-qing switch S2 across the charging inductor can be closed, effectively short-circuiting the charging inductor and "de-qing" the resonant circuit. This essentially removes the inductor from the resonant circuit and prevents any further current in the inductor from continuing to charge up C0. Current in the inductor is then shunted away from the load and trapped in the loop made up of charging inductor L1, the de-qing switch S2, and the de-qing diode D4. Diode D4 is included in the circuit since the IGBT has a reverse anti-parallel diode included in the device that would normally conduct reverse current. As a result, diode D4 blocks this reverse current which might otherwise bypass the charging inductor during the charging cycle. Finally, a "bleed down" or shunt switch and series resistor (both not shown in this preferred embodiment) can be used to discharge energy from C0 once the charging cycle is completely finished in order to achieve very fine regulation of the voltage on C0.

The DC power supply is a 208 V, 90 A, AC input, 800 V, 50 A DC output regulated voltage power supply provided by vendors such as Universal Voltronics, Lambda/EMI, Kaiser Systems, Sorensen, etc. A second embodiment can use multiple, lower power, power supplies connected in series and/or parallel combinations in order to provide the total voltage, current, and average power requirements for the system. The C-1 capacitor in the resonant charger 402 is comprised of two 450 V DC, 3100 μF, electrolytic capacitors connected together in series. The resulting capacitance is 1550 μF rated at 900 V, providing sufficient margin over the typical 700-800 V operating range. These capacitors can be obtained from vendors such as Sprague, Mallory, Aerovox, etc. The command charging switch S1 and output series switch S3 in the embodiment are 1200 V, 300 A IGBT switches. The actual part number of the switches is CM300HA-24H from Powerex. The de-qing switch S2 is a 1700 V, 400 A IGBT switch, also from Powerex, part number CM400HA-34H. The charging inductor L1 is a custom made inductor made with 2 sets of parallel windings (20 turns each) of Litz wire made on a toroidal, 50-50% NiFe tape wound core with two ⅛" air gaps and a resulting inductance of approximately 140 μH. National Arnold provides the specific core. Other embodiments can utilize different magnetic materials for the core including Molypermaloy, Metglas, etc. The series, de-qing, and free-wheeling diodes are all 1400 V, 300 A diodes from Powerex, part number R6221430PS.

Once the resonant charger 402 charges up C0, a trigger is generated by a control unit (not shown) in the resonant charger that triggers the IGBT switches S4 to close. Although only one is shown in the schematic diagram (for clarity), S4 consists of eight parallel IGBT's which are used to discharge C0 into C1. Current from the C0 capacitors then discharges through the IGBT's and into a first magnetic switch LS1. Sufficient volt-seconds are provided in the design of this magnetic switch to allow all of the 8 parallel IGBT's to fully turn on (i.e. close) prior to substantial current building up in the discharge circuit. After closure the main current pulse is generated and used to transfer the energy from C0 into C1. The transfer time from C0 to C1 is typically on the order of 5 μs with the saturated inductance of LS1 being approximately 230 nH. As the voltage on C1 builds up to the full desired voltage, the volt-seconds on a second magnetic switch LS2 run out and that switch saturates, transferring the energy on C1 into 1:4 pulse transformer 406 which is described in more detail below. The transformer basically consists of three one turn primary "windings" connected in parallel and a single secondary "winding". The secondary conductor is tied to the high voltage terminal of the primaries with the result that the step-up ratio becomes 1:4 instead of 1:3 in an auto-transformer configuration. The secondary "winding" is then tied to C2 capacitor bank that is then charged up by the transfer of energy from C1 (through the pulse transformer). The transfer time from C1 to C2 is approximately 500 ns with the saturated inductance of LS2 being approximately 2.3 nH. As the voltage builds up on C2, the volt-second product of the third magnetic switch LS3 is achieved and it also saturates, transferring the voltage on C2 to anode 8a as shown on FIGS. 14A and 14B. The saturated inductance of LS3 is approximately 1.5 nH.

Bias circuitry shown in the FIG. 1 at 408 is also used to properly bias the three magnetic switches. Current from the bias power supply V1, passes through magnetic switch LS3. It then splits and a portion of the current passes through bias inductor L5 and back to the bias power supply V1. The remainder of the current passes through the pulse transformer secondary winding and then through magnetic switches LS2 and LS1 and bias inductor L3 back to the bias power supply V1. Bias inductor L2 provides a path back to the power supply from current through the pulse transformer primary to ground. Bias inductors L3 and L5 also provide voltage isolation during the pulse in the SSPPS since the bias power supply V1 operates close to ground potential (as opposed to the potentials generated in the SSPPS where the bias connections are made).

The C0, C1 and C2 capacitances are made up of a number of parallel, polypropylene film capacitors mounted on a printed circuit board with thick (6-10 oz.) copper plating. The printed circuit boards are wedge shaped such that 4 boards make up a cylindrical capacitor deck which feeds a cylindrical bus for both the high voltage and ground connections. In such a way, a low inductance connection is formed which is important to both the pulse compression and to the stability of the plasma pinch in the DPF itself. The total capacitance for C0 and C1 are 21.6 μF each while the total capacitance for C2 is 1.33 μF. The C0 and C1 capacitors are 0.1 μF, 1600 V capacitors obtained from vendors such as Wima in Germany or Vishay Roederstein in North Carolina. The C2 capacitance is made up of three sections of capacitors stacked in series to achieve the overall voltage rating since the voltage on the secondary of the pulse transformer is about 5 kV. The C2 capacitors are 0.01 pF, 2000 V dc components, again from Wima or Vishay Roederstein. The SSPPS switches are 1400 V, 1000 A IGBT switches. The actual part number is CM1000HA-28H from Powerex. As noted earlier, 8 parallel IGBT switches are used to discharge C0 into C1. The SSPPS series diodes are all 1400 V, 300 A diodes from Powerex, part number R6221430. Two diodes are used for each IGBT switch, resulting in a total of sixteen parallel devices.

Magnetic switch LS1 is a custom made inductor made with 16 sets of parallel windings (6 turns each) of Litz wire made on a toroidal, ferrite core. The specific core is provided by Ceramic Magnetics of New Jersey and is made of CN-20 ferrite material. The toroid is 0.5" thick with an I.D. of 5.0" and an O.D. of 8.0". Magnetic switch LS2 is a single turn, toroidal inductor. The magnetic core is tape wound on a 8.875" O.D. mandrel using 2" wide, 0.7 mil thick, 2605-S3A Metglas from Honeywell with 0.1 mil thick Mylar wound in between layers to an outside diameter 10.94". Magnetic switch LS3 is also a single turn, toroidal inductor. The magnetic core is tape wound on a 9.5" O.D. mandrel using 1" wide, 0.7 mil thick, 2605-S3A Metglas from Honeywell with 0.1 mil thick Mylar wound in between layers to an outside diameter of 10.94".

The pulse transformer is shown at 406, also shown in FIG. 1A has three transformer core. Each of the three transformer cores is tape wound on a 12.8 inch O.D. mandrel 422 using 1" wide, 0.7 mil thick, 2605-S3A Metglasθ from Honeywell with 0.1 mil thick Mylar wound in between layers to an outside diameter of 14.65". Each of the three cores 418 are ring shaped, 12.8 inch I.D. and about 14 inch O.D. having heights of 1 inch. FIG. 1A is an axial cross section sketch showing the physical arrangement of the three cores and the primary and secondary "windings". Each of the primary windings actually are formed from two circular rings 420A and 420B bolted to mandrel 422 and rod-like spacers 424. The secondary "winding" is comprised of 48 circularly spaced bolts 426. The transformer operates on a principal similar to that of a linear accelerator, as described in U.S. Pat. No. 5,142,166. A high voltage current pulse in the three primary "windings" induce a voltage rise in the secondary "winding" approximately equal to the primary voltage. The result is a voltage generated in the secondary winding (i.e., rods 426) equal to three times the primary voltage pulse. But since the low voltage side of the secondary winding is tied to the primary windings a four-fold transformation is provided in this "auto-transformer" configuration.

Bias inductors L3 and L4 are both toroidal inductors wound on a Molypermalloy magnetic core. The specific core dimensions are a height of 0.8", an I.D. of 3.094", and an O.D. of 5.218". The part number of the core is a-430026-2 from Group Arnold. Inductor 13 has 90 turns of 12 AWG wire wound on the toroid for an inductance of ~7.3 mH while L4 has 140 turns of 12 AWG wire wound on it for an inductance of ~18 mH. Bias inductor L6 is merely 16 turns of 12 AWG wire wound in a 6" diameter. Bias inductor L4 is 30 turns of 12 AWG wire in a 6" diameter. Bias inductor L2 is 8 turns of 12 AWG wire in a 6" diameter. Resistor R1 is an array of twenty parallel resistors, each of which is 27 ohm, 2 W carbon composition resistor.

Polarity

Figure 1B:
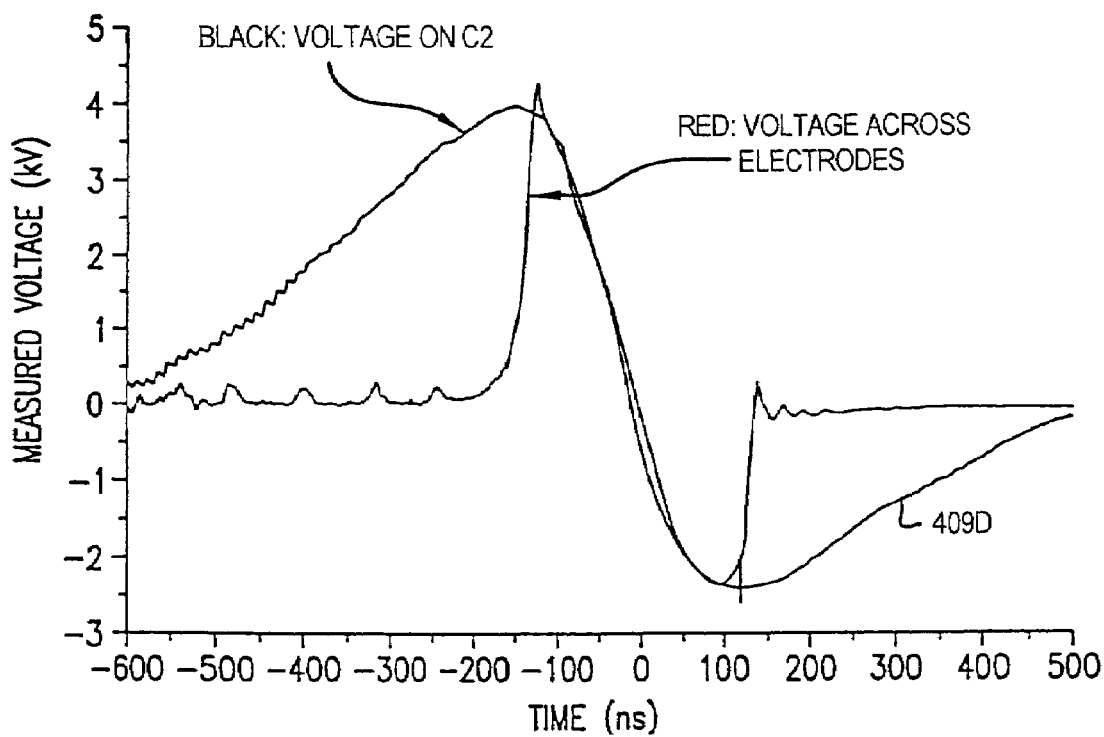
FIGS. 1B and 1C show test data.
Figure 1C:
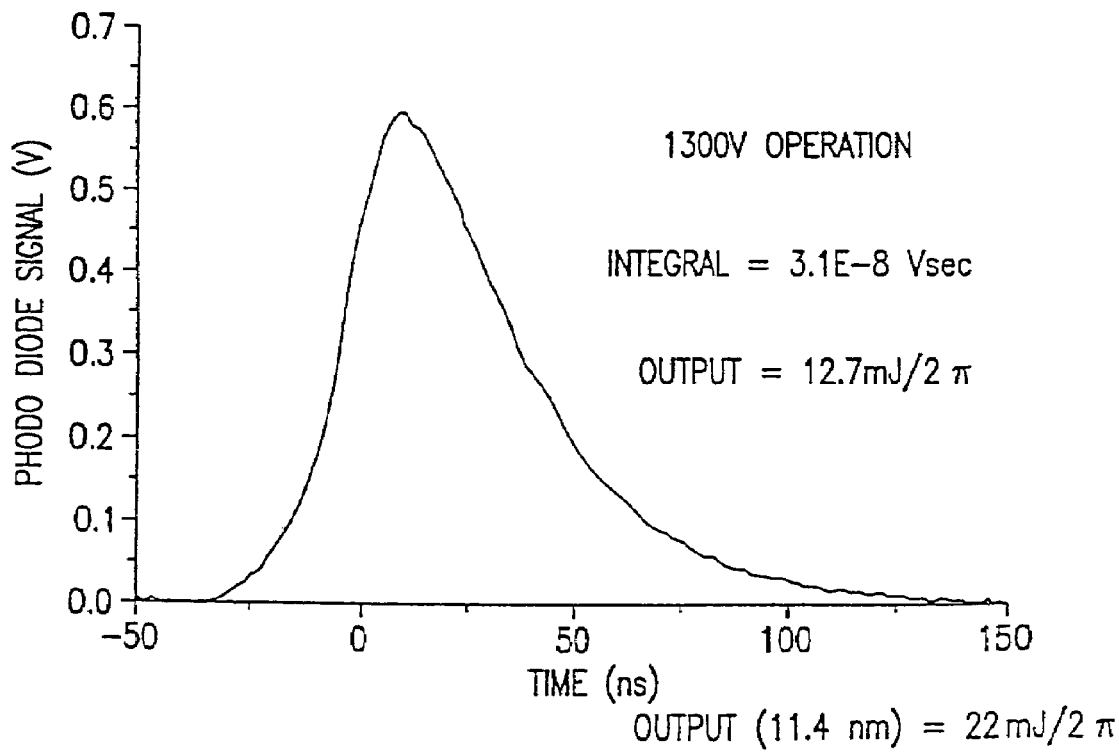
Figure 1D:
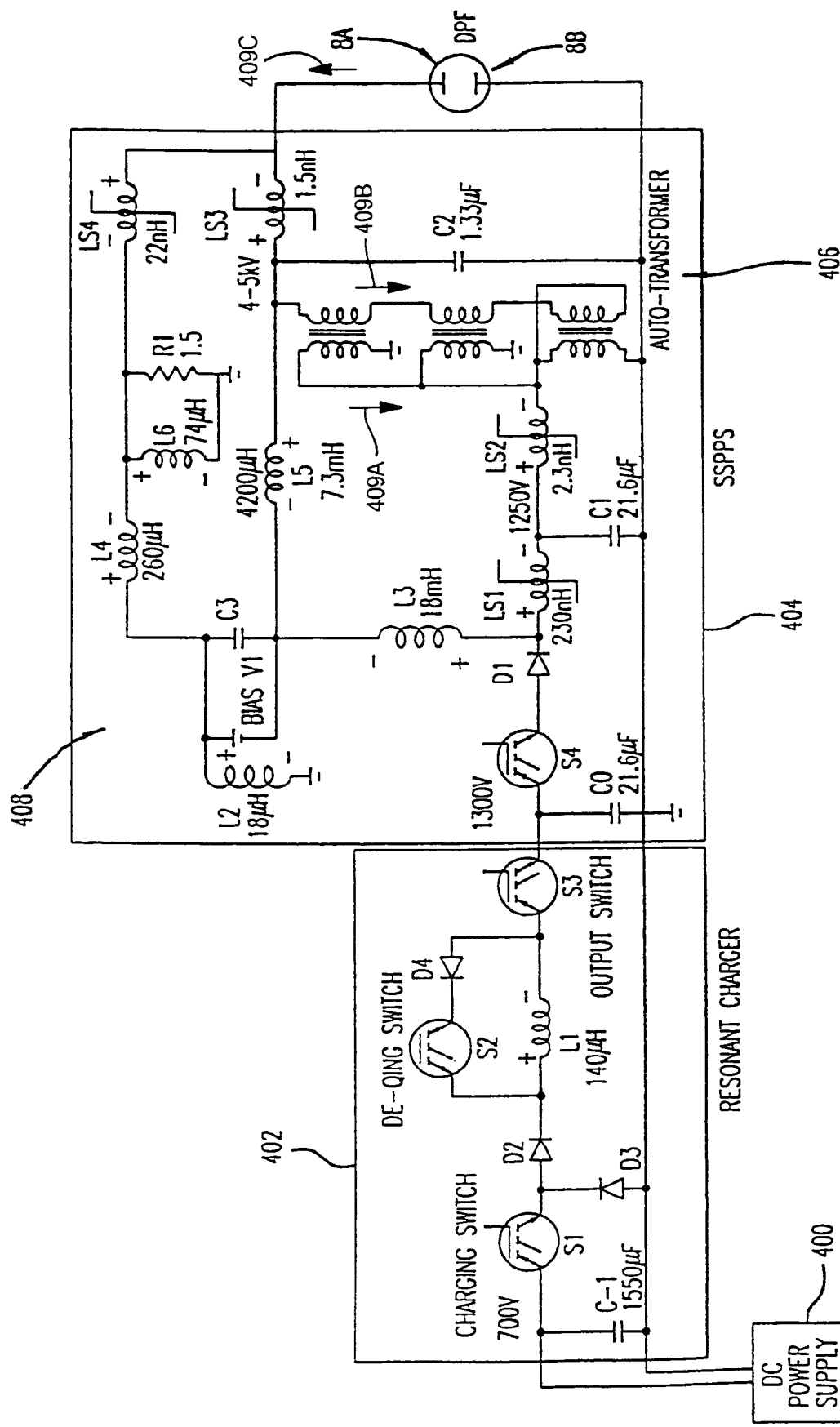
FIG. 1D shows a reverse polarity pulse power source.
Figures 2A, 2B, 2C, 2D:
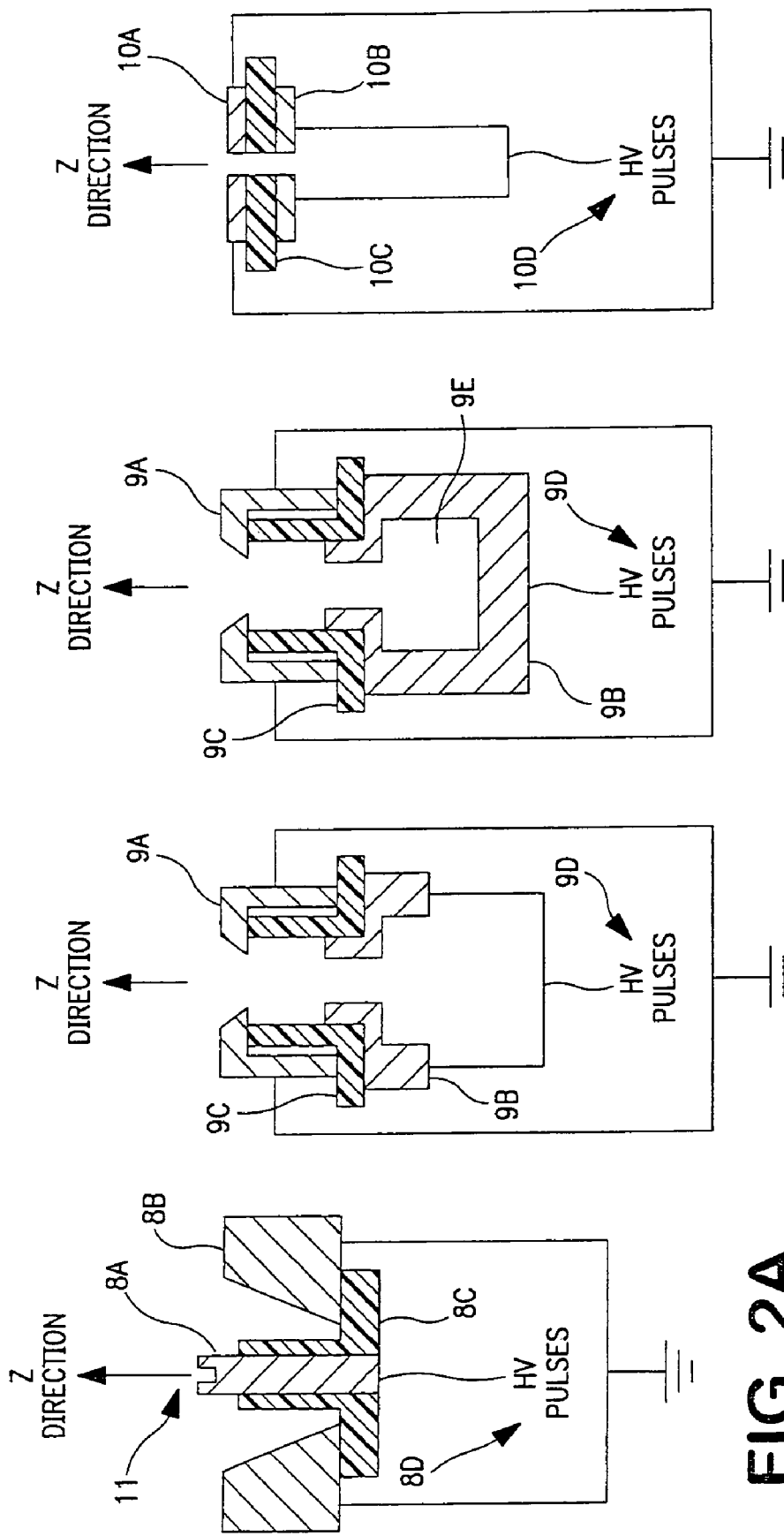
FIG. 2A shows electrical features of a dense plasma focus EUV device.
FIG. 2B shows features of a conventional Z-pinch device.
FIG. 2C shows features of a hollow cathode Z-pinch device.
FIG. 2D shows features of a capillary discharge device.

In a preferred embodiment of the present invention, the electrical circuit as shown in FIG. 1 provides positive high voltage pulses to the center electrode 8A as shown in FIG. 2, FIG. 2B1, and FIG. 2B2. The direction of current flow of each portion of each initial pulse is shown by arrows 409A, 409B and 409C respectively through the primary and secondary sides of the transformer 406 and between the electrodes. (The reader should note the direction of electron flow is opposite the direction of current flow). The reader should note also that during the latter portion of each pulse the current actually reverses as indicated by the trace shown at 409D in FIG. 1B so that the voltage on C2 rises to about +4 kV then rises to about zero.

Reverse Polarity

In prior art dense plasma focus devices, the central electrode is typically configured as an anode with the surrounding electrode configured as cathode. Thus, the polarity of the electrodes of the embodiment shown in FIG. 2B is consistent with this prior art technique. It is known in the prior art to reverse the polarity of the electrodes; however, the results have typically been a substantial reduction in performance. (For example, see G. Decker, et al., "Experiments Solving the Polarity Riddle of the Plasma Focus," *Physics Letters*, Vol. 89A, Number 8, 7 Jun. 1982).

Applicants have in a preferred embodiment of the present invention demonstrated excellent performance by reversing the electrode polarity of a dense plasma focus device. To do this Applicants modified the circuit shown in FIG. 1 to provide a circuit as shown in FIG. 1D. The basic design of the FIG. 1 circuit made this task relatively easy. The connections on DC power supply 400 were switched, switches S1, S2, S3 and S4 were reversed and diodes D1, D2, D3 and D4 were reversed. Also the polarity of bias power supply V1 was reversed. As a result the initial current flow for each pulse was in the directions shown at 409A, 409B, and 409C in FIG. 1D. Thus, the central electrode 8A as shown in the figures including FIG. 2B2 is initially charged negative and the initial current flow in this embodiment is from ground electrodes 8B to central electrode 8A. The electron flow is in the opposite direction; i.e., from central electrode 8A to surrounding electrode 8B. Another technique for reversing polarity is to modify the pulse transformer design to eliminate the "onto" aspect of the transformer. That is to connect the low voltage side to ground instead of the primary high voltage. If this is done polarity can be reversed by merely changing the secondary leads of the pulse transformer. This of course would mean in this case there would be only a factor of 3 increase in voltage rather than 4. But to compensate another primary section could be added.

Applicants' experiments have demonstrated some surprising improvements resulting from this change in polarity. An important improvement is that pre-ionization requirements are greatly reduced and may be completely eliminated. Applicants believe this improved performance results from a hollow-cathode type effect resulting from the hollow portion at the top of electrode 8A as shown in FIG. 2A. According to Applicants measurements under various conditions, the quality of pinches is better than pinches produced with the positive central electrode polarity. Applicants estimate increases in EUV output could be up to about a factor of two.

Energy Recovery

In order to improve the overall efficiency this fourth generation dense plasma focus device provides for energy recovery on a pulse-to-pulse basis of electrical pulse energy reflected from the discharge portion of the circuit. Energy recovery is achieved as explained below by reference to FIG. 1.

After the discharge C2 is driven negative. When this occurs, LS2 is already saturated for current flow from C1 to C2. Thus, instead of having energy ringing in the device (which tends to cause electrode erosion) the saturated state of LS2 causes the reverse charge on C2 to be transferred resonantly back into C1. This transfer is accomplished by the continued forward flow of current through LS2. After the transfer of charge from C2 to C1, C1 then has a negative potential as compared to C0 (which at this time is at approximately ground potential) and (as was the case with LS2) LS1 continues to be forward conducting due to the large current flow during the pulse which has just occurred. As a consequence, current flows from C0 to C1 bringing the potential of C1 up to about ground and producing a negative potential on C0.

The reader should note that this reverse energy transfers back to C0 is possible only if all the saturable inductors (LS1, LS2 and LS3) remain forward conducting until all or substantially all the energy is recovered on C0. After the waste energy is propagated back into C0, C0 is negative with respect to its initial stored charge. At this point switch S4 is opened by the pulse power control. Inverting circuit comprising inductor L1 and solid state diode D3 coupled to ground causes a reversal of the polarity of C0 as the result of resonant free wheeling (i.e., a half cycle of ringing of the L1-C0 circuit as clamped against reversal of the current in inductor L1 by diode D3 with the net result that the energy is recovered by the partial recharging of C0. Therefore, the energy which otherwise would have contributed to the erosion of the electrodes is recovered reducing the charging requirements for the following pulse.

Importance of Output Switch

As shown in FIGS. 1 and 1D, the pulse power system described in this invention possesses an output switch that performs several functions. This switch, LS3 in the figure, is a saturable inductor which we refer to as a magnetic switch. As explained above, it is biased by bias circuitry 408 so as to initially hold off current flow at the beginning of each pulse until the inductor saturates at which time current flows for about 100 nanoseconds after which the bias current re-biases the switch prior to the start of the next pulse which at 5 kHz (for example) comes about 200 micro seconds later. This switch is very important for allowing proper operation of the source at high repetition rates. Although some EUV sources have been developed without such a switch, their operation at high rep-rates can be erratic in output energy. In these cases, no switch exists between the energy storage capacitor and the EUV source load. The issue is that the source load may not fully recover in the short time between the last pulse and the time when voltage is applied to the energy storage capacitor in preparation for the next pulse. At rep-rates of 5 kHz, only 200 μs exists between output pulses. With many of the other source designs, a significant fraction of this inter-pulse period would be required for charging of the energy storage capacitor. Thus, even shorter time may exist between the last pulse generation and the initial voltage application across the capacitor (and also the load since no output switch exists to isolate the two). Problems then exist when this time becomes too short for the plasma from the last pulse to cool down and recover (hold off voltage application in anticipation of the next pulse). As a result, the source may breakdown again prematurely at lower-than-normal voltages when the recovery is not sufficient. Because the breakdown process is statistical in nature, there can also be wide variation in the breakdown voltages, leading to large variations in source output EUV energy levels. This causes significant problems in the lithography application since energy stability and dose control are very important parameters for process control.

The advantage of the output switch, LS3 in the invention described herein, is that it can perform several functions which help to eliminate this issue of premature load breakdown. In the normal pulse generation, the LS3 switch acts as a magnetic switch and a diode to prevent current reversal through the load. As a result, any energy not absorbed by the load is reflected back to the initial storage capacitor, C0 where the energy is recovered and stored for use with the next pulse (as described earlier in the section on Energy Recovery). In this manner, energy is quickly removed from the load after the main pulse generation and is therefore not allowed to continually oscillate until it is finally and completely dissipated in the load plasma. This helps to reduce the energy deposited into the load plasma and allows it to begin the recovery process as soon as possible after the main pulse generation and EUV output. In addition, the LS3 output switch provides isolation between the last energy storage capacitor and the source load, allowing the source additional time to recover prior to the next pulse being generated. This switch allows the last energy storage capacitor C2, which we refer to as the discharge capacitor, to begin charging as soon as the LS3 switch is reverse biased after the energy recovery process is completed. The design of the bias circuit (including bias inductor L4 and bias power supply V1) can be developed to allow LS3 recovery in sufficient time for charging of C2 in the next pulse generation sequence at rep-rates of at least 5 kHz. The LS3 switch is therefore initially reverse biased (not conducting in the forward direction—towards the load) up until the time when it saturates (as the voltage on C2 reaches its maximum value). The switch then allows energy transfer from C2 into the load and remains forward conducting until the energy recovery cycle is completed and reflected energy is recovered all the way back onto C0. After this period of time, energy from the bias circuit is applied to the main pulse compression circuit and completes the cycle by reverse biasing the LS3 switch again. Once this is accomplished, the charging of C2 can take place again without the potential issue of the load breaking down prematurely (since the LS3 switch can now isolate the voltage on C2 from the load).

As rep-rates for EUV sources may eventually have to extend all the way to 10 kHz in order to meet EUV source power requirements, these issues will become even more important since the time between pulses will become that much shorter.

FIGS. 1B and 1C show test results from a fourth generation plasma pinch prototype device. FIG. 1B shows the pulse shape on capacitor C2 and across the electrodes and FIG. 1C shows a measured photo diode signal with Xenon as the active gas.

High Temperature Electric Discharge

EUV X-Ray Devices

The high repetition rate reliable, long-life pulse power system described above can be utilized to provide high voltage electrical pulses to a variety of extreme ultraviolet or x-ray devices. These system included a dense plasma focus device depicted in FIG. 2A, conventional Z-pinch device shown in FIG. 2B, a hollow cathode Z-pinch device shown in FIG. 2C, and a capillary discharge device as shown in FIG. 2D. In each case the light source is generally symmetrical about an axis referred to as the "Z" direction. For this reason these sources especially the first three are often referred to as "Z" pinch light sources.

Dense Plasma Focus

The principal feature of a dense plasma focus EUV device is shown in FIG. 2B. These are anode 8A, cathode 8B and insulator 8C and a high voltage pulse power source 8D. In this case when high voltage is applied a discharge starts between the cathode and the anode running along the outside surface of insulator 8C. Forces generated by the high plasma current, forces the plasma generally upward then inward creating an extremely hot plasma pinch just above the center of the anode. The parameters specified above for the pulse power system shown in FIG. 1 were chosen especially for this light source to produce 12 J pulses of about 5,000 volts with pulse durations of about 100 to about 500 ns. Preferably a preionizer (which may be a spark gap preionizer) is provided as described in more detail in U.S. patent application Ser. No. 09/690,084 which has been incorporated by reference herein. FIG. 2A(1) shows a cross-section of a portion of a fourth generation plasma pinch EUV light source actually built and tested by Applicants which incorporates the pulse power system described in FIG. 1. Many of the electrical components referred to above are designated in FIG. 2A(1). FIG. 2A(2) is a blow-up of the electrode region of the device showing in greater detail the anode 8A, the cathode 8B and the spark gap preionizers 138. FIG. 2A(3) is a drawing of the fourth generation device showing many of the electrical components shows in FIG. 2A(1) and also showing vacuum 3.

Conventional Z Pinch

A conventional Z-pinch light source is shown in FIG. 3. In this case the discharge starts between the anode and the cathode along the inside surface of insulator 9C. The forces generated by the high-current, forces the plasma to the center of the cylindrical volume formed by insulator 9C and causes the plasma to pinch with extremely hot temperatures near the upper end of the volume.

The pulse power circuit shown in FIG. 1 with the components described above would work for embodiments of the conventional Z-pinch design, although persons skilled in the art may choose to make changes to coordinate the parameters of the pulse power electrical components with specific design parameters of the Z-pinch. For example, if 5,000 volt pulses are preferred this can be easily accomplished simply with the same basic circuit as shown in FIG. 1 but with one additional one-turn primary winding on the pulse transformer 406. With this design a preionizer is usually provided to help initiate the plasma at the start of each pulse. These preionizers may be spark gap or other preionizer source and are usually powered from a separate source not shown.

Hollow Cathode Z-Pinch

The hollow cathode Z-pinch shown in FIG. 2C is very similar to the conventional z pinch. The difference being that the cathode is configured to produce a hollow below the cylindrically shaped insulator. This design can avoid the need for a preionizer because a very large number of ions and electrons are naturally produced near the top of the hollow region 9E at the beginning of each pulse when the high voltage increases to a sufficiently high level. For this reason this design does not require a high voltage switch to initiate the discharge. The discharge is referred to as having been self-initiated.

When using the power supply shown in FIG. 1 to provide pulse power for this design, the last saturable inductor L53 could be eliminated or its value reduced substantially since the development of plasma in the hollow in the cathode serves the same purpose as saturable inductor L53 of holding off the discharge until the peaking capacitor C2 is sufficiently charged, then permitting current to flow substantially unimpeded.

This hollow cathode Z-pinch may be designed for significantly higher pulse voltages than the first two designs. This is no problem with the power supply shown in FIG. 1. A discharge pulses of, for example, 10,000 Volts are easily provided by merely increasing the number of one-turn primary windings of the transformer 406 from 3 to 9.

Capillary Discharge

A drawing of a conventional capillary discharge EUV light source is shown in FIG. 2D. In this design the compression of the plasma created by the high voltage discharge between the cathode and the anode is achieved by forcing the plasma through a narrow capillary which typically has a diameter in the range of about 0.5 mm to 4 mm. In this case the pulse duration is in the order of about 0.5 microseconds to 4 microseconds as compared to about 100 to 500 nanoseconds for the embodiment shown in FIGS. 2, 3 and 4. Also, the pulse voltages are typically substantially lower, such as about 1500 volts. However, the same pulse power system provides an excellent electrical power source with minor modifications. A simple modification is to eliminate the last step of magnetic compression which is accomplished by leaving off the C2 capacitor bank and the LS3 saturable inductor. The peak pulse voltage could be reduced to 2,000 by windings in pulse transformer 406 from three to one, or the transformer could be eliminated with an increase in the initial charging voltage to provide electrical pulses of a few microseconds and a peak voltage of about 1500 volts.

Laser Produced Plasma

As described in the background section of this specification, a prior art technique for producing extreme ultraviolet light on soft x-rays is to use short pulse lasers to produce a very hot plasmas which are similar to the plasmas produced in the plasma pinches described above. Prior art techniques typically utilize solid state lasers such as Q-switch Nd-YAG lasers pumped with diode lasers (or flash lamps) to produce very high power nano-second or pico second laser pulses which are focused on a target material which may be the same target materials as the active materials identified above such as lithium and tin which produce debris or xenon which does not produce debris. Some of these prior art light sources are described in U.S. Pat. Nos. 5,668,848, 5,539,764, and 5,434,875, all of which are incorporated herein by reference. These prior art patents teach the use of an Nd-YAG laser for generating the plasma and the use of an Nd-YAG seeded XeCl excimer pre-amplified and an XeCL excimer amplifier for producing the high power (such as $1\times10^{11}$" Watts) very short pulse laser beam for generating plasmas in target material. Other laser systems (including excimer laser systems) have been proposed for producing x-rays (see for example, M. Chaker, et al., J. Appl. Phys. 63, 892 (1988; R. Popil et al, Phys. Rev. A 35, 3874 (1987); and F. O'Neill et al., Proc. SPIE 831, 230 (1987). Applicants have determined that many of the novel features developed by Applicants in connection with Applicants' development of their plasma focus devices can be applied with respect to laser produced plasmas just as well as plasmas produced by the various pinch devices shown in FIGS. 2A-D.

Applicants' employer is the leading supplier in the United States and internationally of excimer laser light sources for integrated circuit lithography. These lasers are KrF excimer lasers operating at 248 nm and ArF lasers operating at 193 nm. These lasers are extremely reliable, typically operating 24 hours per day 365 days per year with up-times, on the average better than 99 percent. During the past several years pulse repetition rates of these lasers have increased from about 100 Hz in 1990 to 4000 Hz in 2003. The average power of these lasers has increased from about 1 Watt in 1990 to about 120 Watts in 2003. The pulse duration is about 20 ns and the current pulse energy is about 30 mJ. Techniques to increase repetition rates of these lasers to 6,000 to 10,000 Hz are described in U.S. patent application Ser. No. 10/187,336 also incorporated herein by reference.

Applicants believe that the excimer laser systems currently in use as the leading lithography light source at 248 nm and 193 nm can be adapted to provide extreme ultraviolet light in the range of 11 to 14 nm. Examples of these laser systems are described in the following U.S. patents and patent applications which are incorporated herein by reference: U.S. Pat. Nos. 6,128,323; 6,330,261; 6,442,181; 6,477,193 and U.S. Patent Applications: Ser. No. 09/854,097, Ser. No. 09/943,343, Ser. No. 10/012,002, Ser. No. 10/036,676, and Ser. No. 10/384,967.

In a laser-produce plasma light source the laser energy is absorbed by the inverse Bremsstrahlung mechanism. Due to their shorter wavelength, excimer lasers can couple energy more efficiently to the target plasma than near infrared or visible laser radiation from (frequency-doubled) solid state lasers. (The plasma frequency and thus the critical density is higher at shorter wavelength of the pump laser.) Due to their shorter wavelength, excimer lasers can (if desired) be focused more tightly to a (diffraction-limited) spot size than longer wavelength (e.g., solid-state) lasers. This increases the power density of the source. The excimer laser should be a Cymer laser, since these are the most reliable ones in the world. If desired several excimer laser beams can be combined in one spot. This permits power scaling.

One or several excimer laser beams are tightly focussed onto a (gaseous, liquid or solid) target inside a vacuum chamber to generate a hot laser-produced plasma. When the proper target material is used and the right mean electron temperature is reached in the plasma, EUV radiation at 13.5 nm can be efficiently generated. Suitable target materials are xenon, tin and lithium. Xenon has advantages with respect to lower debris production. Unfortunately, xenon is not the most efficient target at 13.5 nm, in particular not for a laser-produced plasma. It produces radiation much more efficiently at around 11 nm. One of the best target configurations is a liquid jet of xenon, since the plasma can be generated at a fairly large distance from the nozzle. Tin has advantages with respect to conversion efficiency, since many ionization stages contribute simultaneously to the 4d-4f emission at about 13.5 nm. Indium has advantages, if its corresponding radiation band at 14 nm and above is used. (There, the manufactured multi-layer mirrors have only slightly lower peak reflectance but larger bandwidth. Therefore, a higher integral in-band intensity can be obtained.) Lithium has advantages in case a light source with narrower emission bandwidth should be required, since lithium emits efficiently in a narrow line at 13.5 nm. It may be advantageous to use a small cavity for confinement, in particular, if metals are used as laser targets. Liquid metal targets (molten tin, indium or lithium) offer the possibility of high target density and reproducible target conditions when the source is operated at constant repetition rate. (A crater will be formed, but a given, fairly constant shape will dynamically evolve at a given repetition rate between the laser pulses.)

The excimer pump laser should preferably be operated with krypton-fluoride at 248 nm, since this is the most efficient excimer laser and since associated optics issues for the focussing optics are less severe. The excimer laser preferably is operated broad-band and in a MOPA configuration, since a very high output power is needed. The laser pulse duration should be as very short (a few nano seconds such as about 20 ns), since it has to be matched to the plasma expansion time. The peak power will be high. In preferred embodiment the laser is operated at repetition rates of 10 kHz or higher, at least at more than 5 kHz. To increase the effective repetition rate, one may also combine several lasers operated at suitable different times in the interval. This depends to a large part also on the target configuration and replenishing rate of the target material. It is advantageous to have a tailored laser pulse that is incident on the target. In a preferred embodiment a pre-pulse portion generated for instance by the excimer laser oscillator (which may bypass the power amplifier in order to minimize the travel time to the target) containing up to a few percent of the total laser energy arrives at the target first to form a pre-plasma. This pre-plasma will absorb the main laser pulse much more efficiently. The pre-plasma can also be accomplished by using a different, perhaps smaller-power laser.

The laser beam will be focused by optimized focusing optics mounted immediately in front or behind of a vacuum window. The objective is to achieve a focal spot of less than about 100 µm diameter. The spot size depends to some extent on the laser pulse duration (10 to 30 ns), since the plasma expansion velocity has to be taken into account. In short, the laser pulse duration has to be short enough and the spot size small enough to keep a large portion of the plasma tightly together during the main heating period. Typical expansion times are on the order of 10-100 µm per nanosecond.

The laser systems described in details in the above identified excimer laser patents and patent applications produce a very line-narrowed pulsed laser beams, line narrowed to about 0.5 pm or less. This permits focusing to a quarter micron spot. However, these laser system can be operated broadband in which the bandwidth of the output pulse laser beam is about 35 nm for KrF lasers with the line center at about 248 nm. Broadband operation permits substantial increases in energy of the output beam. For example, a KrF MOPA system of the type described in patent application Ser. No. 10/384,967 could produce 330 mJ pulses (as compared to the 30 mJ line narrowed pulses). The instantaneous pulse power for the 20 ns pulses is about $165 \times 10^6$ Watts. According to experiments performed at Lawrence Livermore Laboratories (*J. Appl. Phys.* 79(5): March 1996) using a Nd/YAG laser, the maximum EUV output occurred at a laser intensity of $2 \times 10^{11}$" W/cm$^2$. While maximum conversion efficiency (EUV energy output/laser energy input) occurred at about $2 \times 10^{11}$" W/cm$^2$. These experiments indicated not much variation in results with changes in wavelength. The pulse duration in the experiments were not much different from the 20 ns pulses of Applicants employers' excimer lasers. For the $165 \times 10^6$ Watt pulses therefore Applicants prefer spot sizes in the range of about 0.1 mm$^2$ which would provide intensities of about $1.6 \times 10^{-11}$ W/cm$^2$ which is in between maximum efficiency and maximum output.

The energy of the laser pulse is about 330 mJ so at a conversion efficiency of about 0.006 the EUV pulse energy is about 2 mJ/pulse. At 6000 Hz this corresponds to an EUV production of about 12 Watts. About 20 percent of this light can be collected and delivered to an intermediate focus such as location 11 in FIG. 19 using technology described herein. So the average in-band EUV power from one excimer laser produced plasma delivered to the intermediate focus is about 2.4 Watts. The combination of two systems would produce about 5 Watts. In some applications, this is sufficient.

Figure 19:
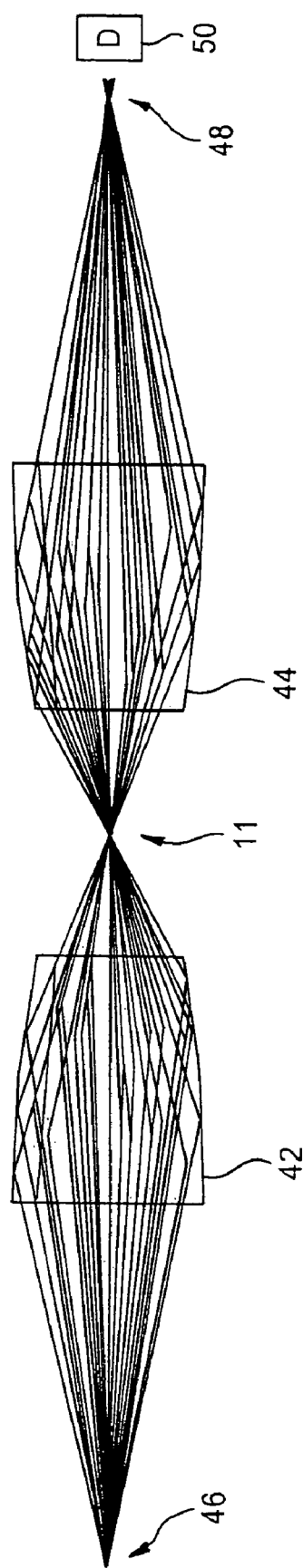
FIG. 19 shows a tandem ellipsoidal mirror arrangement.
Figure 19B:
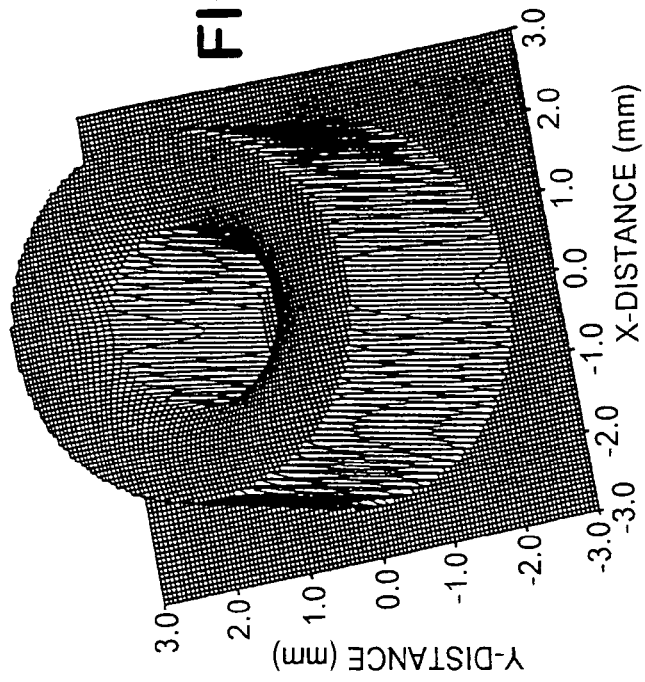
FIGS. 19A, 19B, and 19C show the shape of the EUV profile at just downstream of two focuses.
Figure 19C:
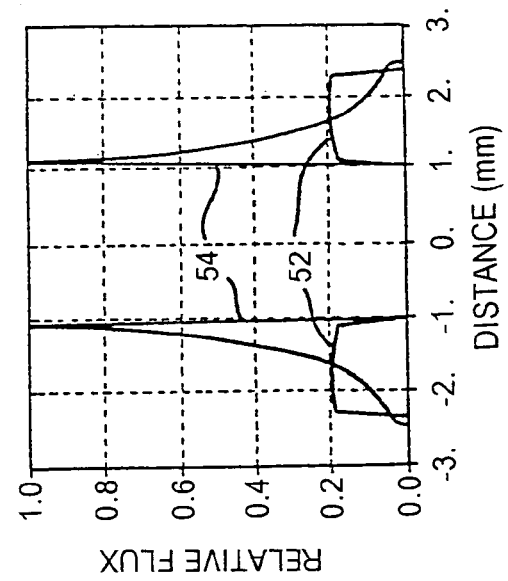
Figure 19A:
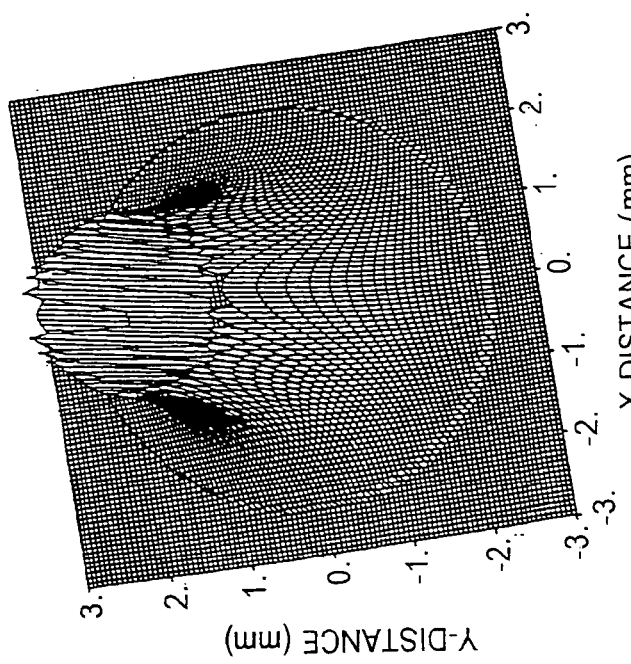
Figure 20:
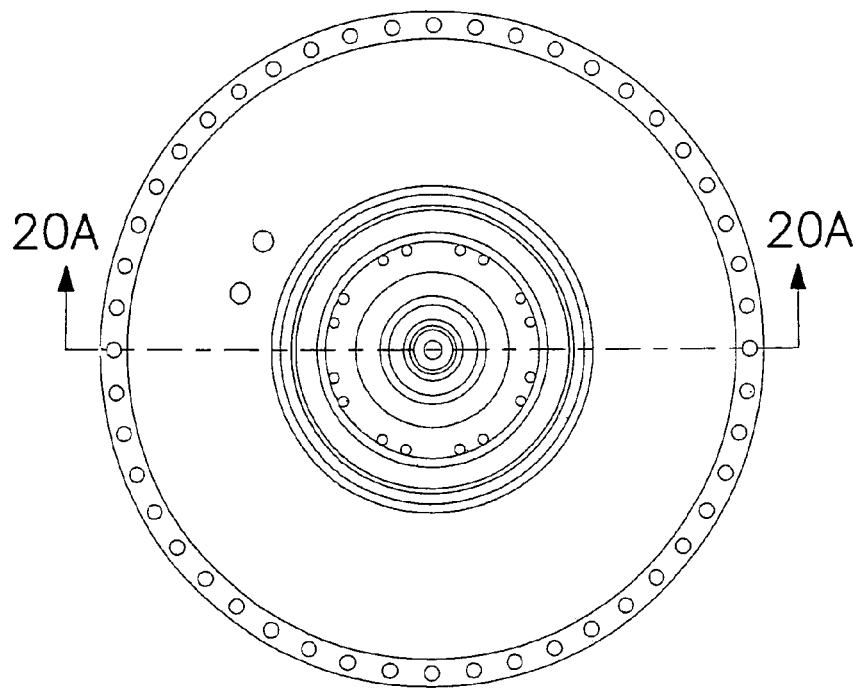
FIGS. 20, 20A, 21 and 22 show a technique for water-cooling of the electrodes.
Figure 20A:
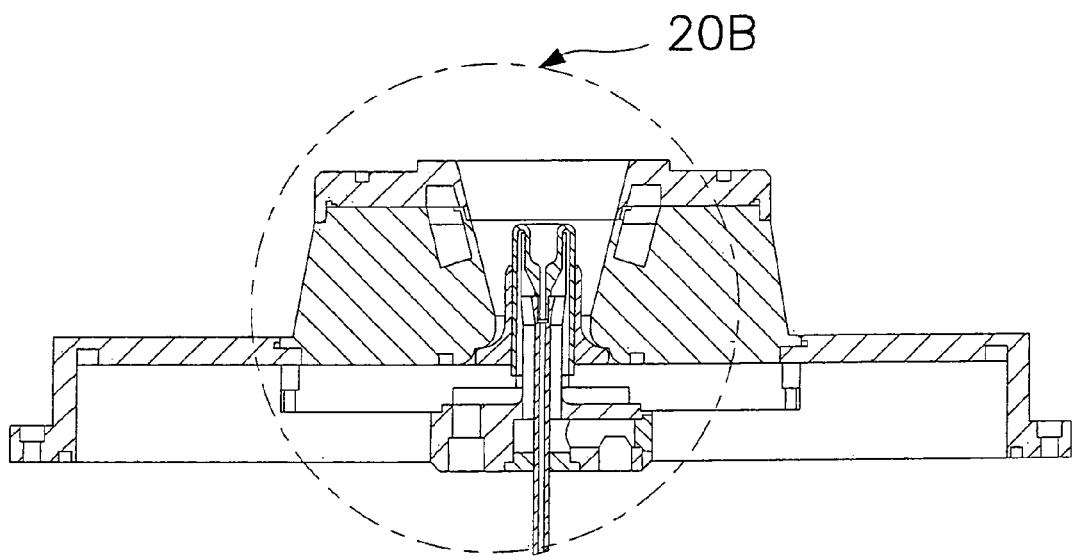

Applicants have been told that makers future EUV lithography machines have desires for an EUV light source of about 45 Watts to about 100 Watts at an intermediate focus such as location 11 in FIG. 19. But this requirement is for several (at least 5) years in the future and the requirement is contingent on development of corresponding lithography systems that can handle EUV power in the 100 Watt range. Since the excimer laser can be expected to couple energy more efficiently to the plasma (shorter wavelength, higher critical density) than a solid-state laser driver at 1.06 μm, the conversion efficiency should be higher for the excimer-laser produced plasma as compared to the prior art NdYAG laser.

About 10 kW of laser power will be needed to generate the required EUV power of about 100 Watt at the intermediate focus of the lithography tool. With expected improvements in demonstrate conversion efficiencies, each KrF module (broad-band operation at 248 nm) can be expected to provide about 1 to 1.2 kW of laser power (e.g. 6 kHz repetition rate operation at 200 mJ/pulse). A total of nine such modules would deliver the required laser power. More than 200 W of in-band EUV radiation would be produced at the source (2% bandwidth into $2\pi$) and about 100 W in-band EUV could be collected and delivered to the intermediate focus.

There are different ways to combine the laser beams (multiplexing). Laser beams can be (nearly) overlapped optically by mirrors and lasers beams can be focused through the same lens from slightly different directions onto the same focal spot. The lasers can also be triggered in a staggered fashion such the effective repetition rate is increased, provided the target is replenished fast enough that it can sustain the high repetition rate. For instance, tripling of the repetition rate with three laser systems to about 18 kHz seems feasible.

Figure 4:
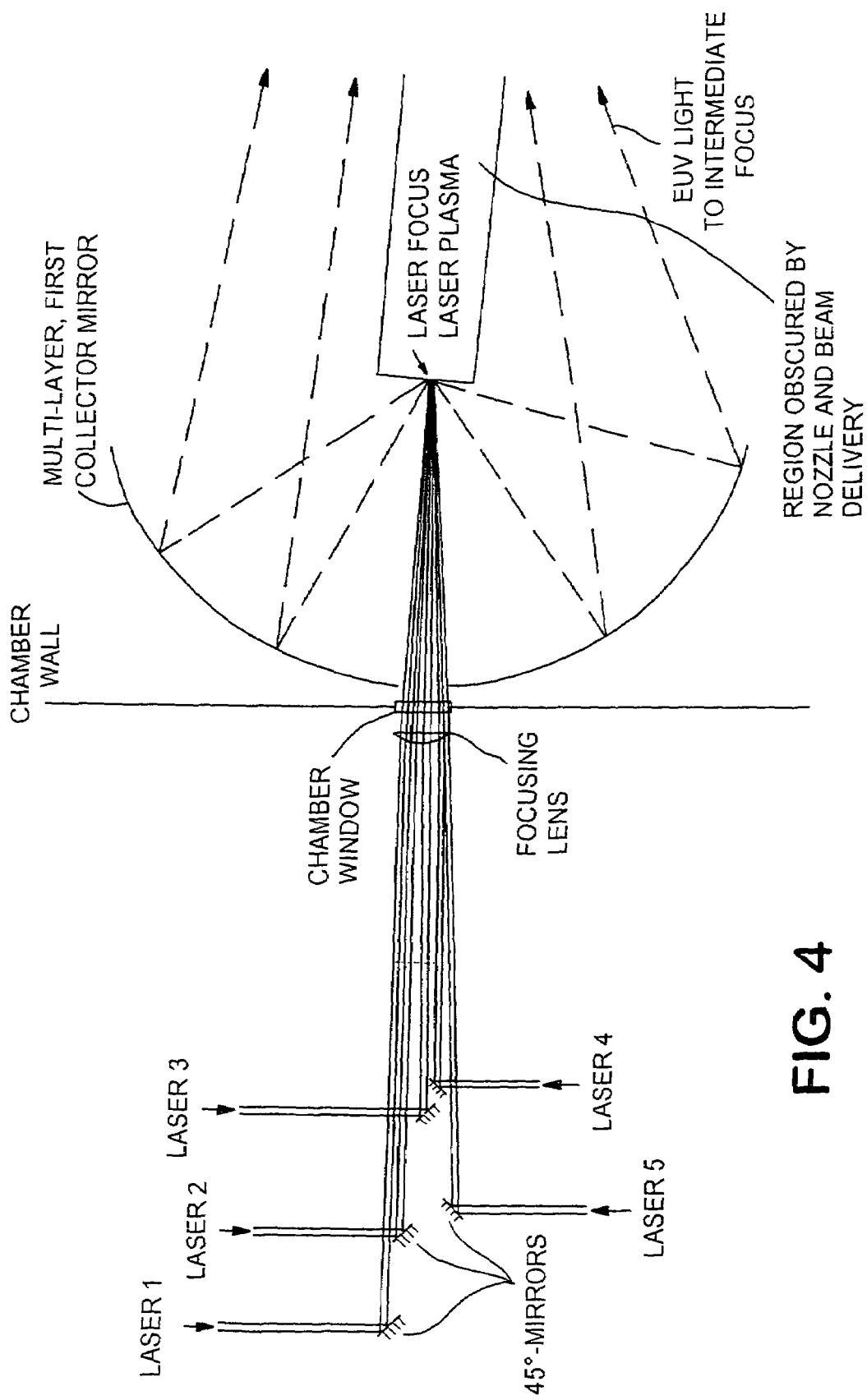
FIGS. 4, 4A and 4B show features of a laser produced plasma systems.

FIG. 4 shows one embodiment where the laser beams from several laser modules can be aimed at different portions of the focusing lens and made to spatially overlap in the common focus which corresponds to the location of the laser-produced plasma. The emitted EUV radiation is collected over a large angular range by the multi-layer coated first collector mirror and directed to the intermediate focus.

Figure 4A:
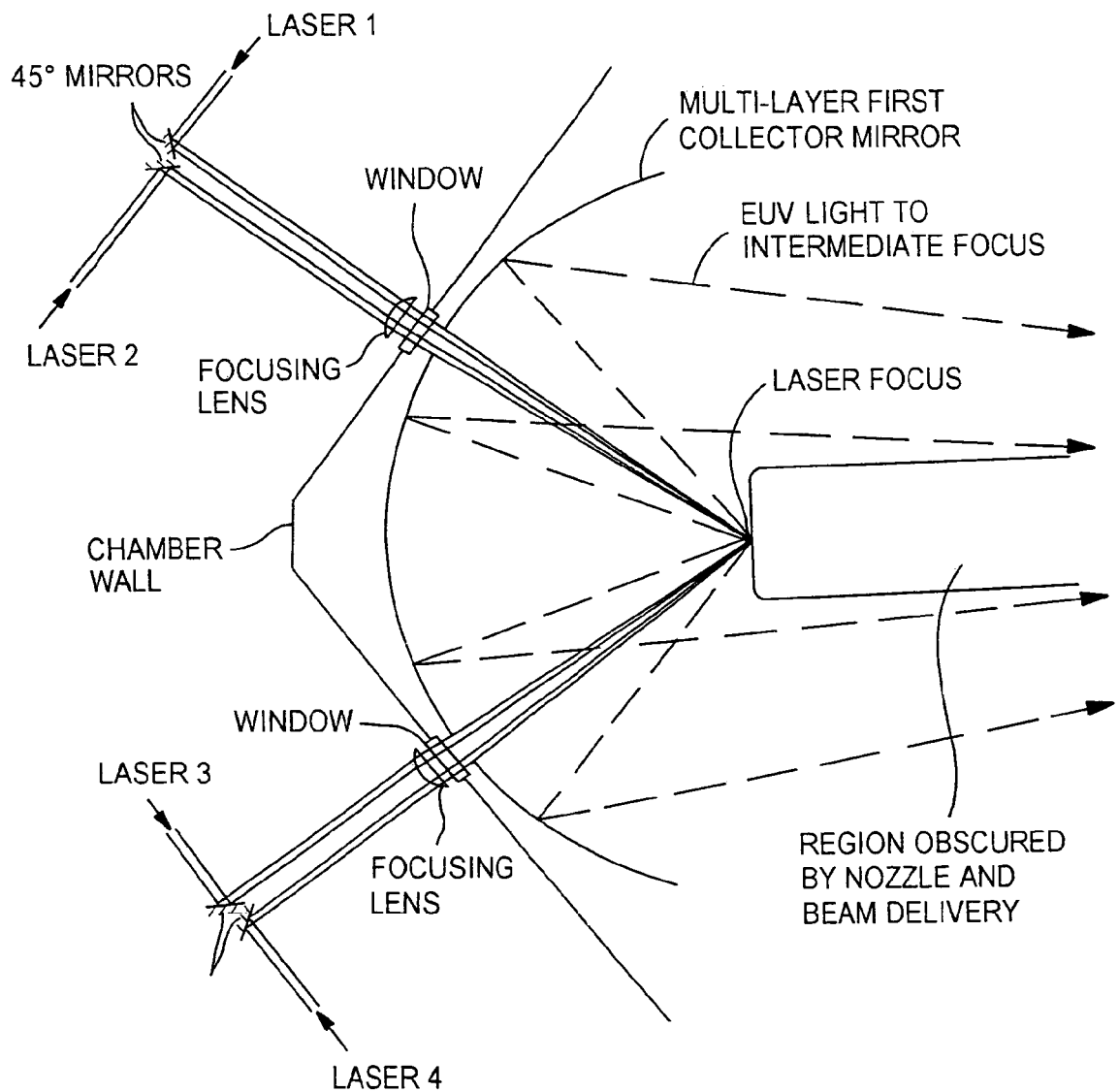

FIG. 4A shows another embodiment where the laser beams from several laser modules are overlapped in a common laser focus with separate focusing optics for some of the laser beams. The laser radiation can be focused through several openings in the first collector mirror. This embodiment makes use of the fact that the EUV radiation generated from the laser plasma has an angular distribution that is peaked to some extent in the direction of the incoming laser beam (and weaker at angles orthogonal to the laser beam). In this embodiment, the regions of strongest emission are not blocked by the space required for the beam delivery device.

Target Delivery

Figure 4B:
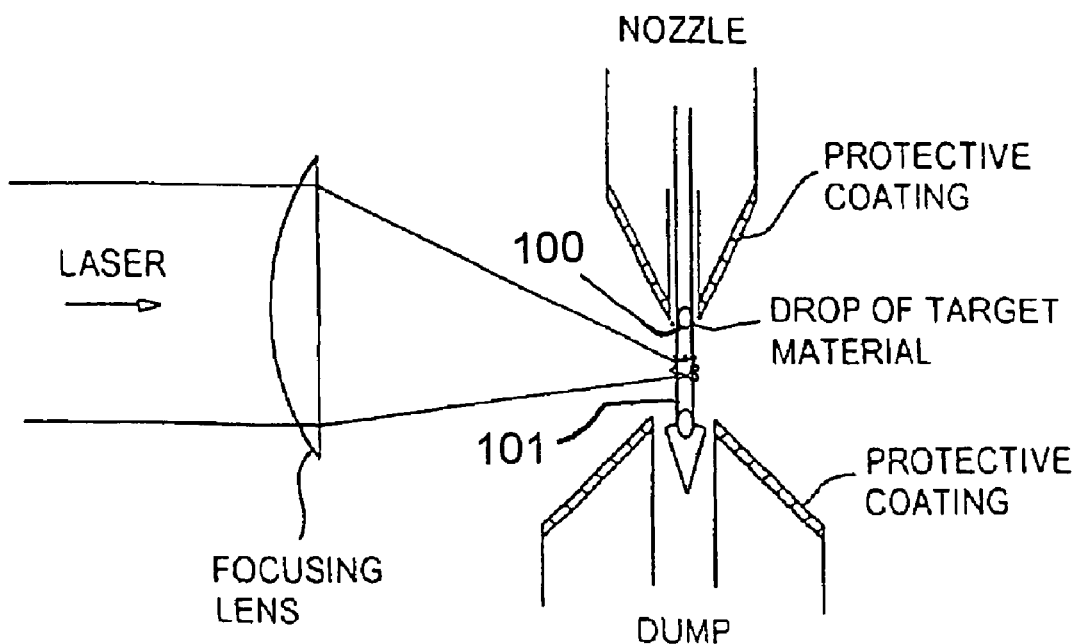

The preferred target for the laser plasma is a so-called mass-limited target. (Just the right amount necessary for the laser-produced plasma is provided, no more, in order not to increase the production of debris unnecessarily. For xenon, a preferred target technique is a thin liquid jet. Cluster beam targets and spray targets may also be employed using erosion resistant nozzles. For metals (tin and indium), liquid metal drops 100, immersed in a helium beam 101, are suitable. A nozzle, mounted from the top, and a target beam dump mounted below, comprise a suitable system. See FIG. 4B. The plasma-facing surfaces may be coated by a thermally conductive thin film, like carbon or diamond coating, to reduce erosion, since ion sputtering is reduced.

Laser Plasma Supported EUV Pinch

The laser plasma source has the advantages of high source brightness (small source volume), no erosion, less debris generation. It has the disadvantages of high cost-of-ownership and inefficient total energy conversion balance. The discharge source has the advantages of direct coupling of the electrical energy into the pinch plasma and of simplicity. It has the disadvantages of electrode erosion and high debris production, as well as thermal management issues.

The laser beam(s) and the laser plasma are used to define the plasma geometry, discharge pathways and plasma pinch location. The arrangement is such that there is a larger distance from the electrodes to the plasma focus than in a pure discharge source. This reduces the power density at the electrode surfaces, since they can be large, and thus also electrode erosion, debris generation and thermal management risks are reduced. On the other hand, the main power input is provided by the low-inductance electrical discharge. This ensures a much more efficient energy coupling to the plasma than would be available for a pure laser plasma source. The arrangement of the electrodes is more spherical than for a conventional Z-pinch. This and the laser-plasma initiation increase the source stability. The timing of pre-ionization, laser plasma generation and main pinch plasma generation gives additional control for optimization of the production of EUV radiation.

Figure 4C:
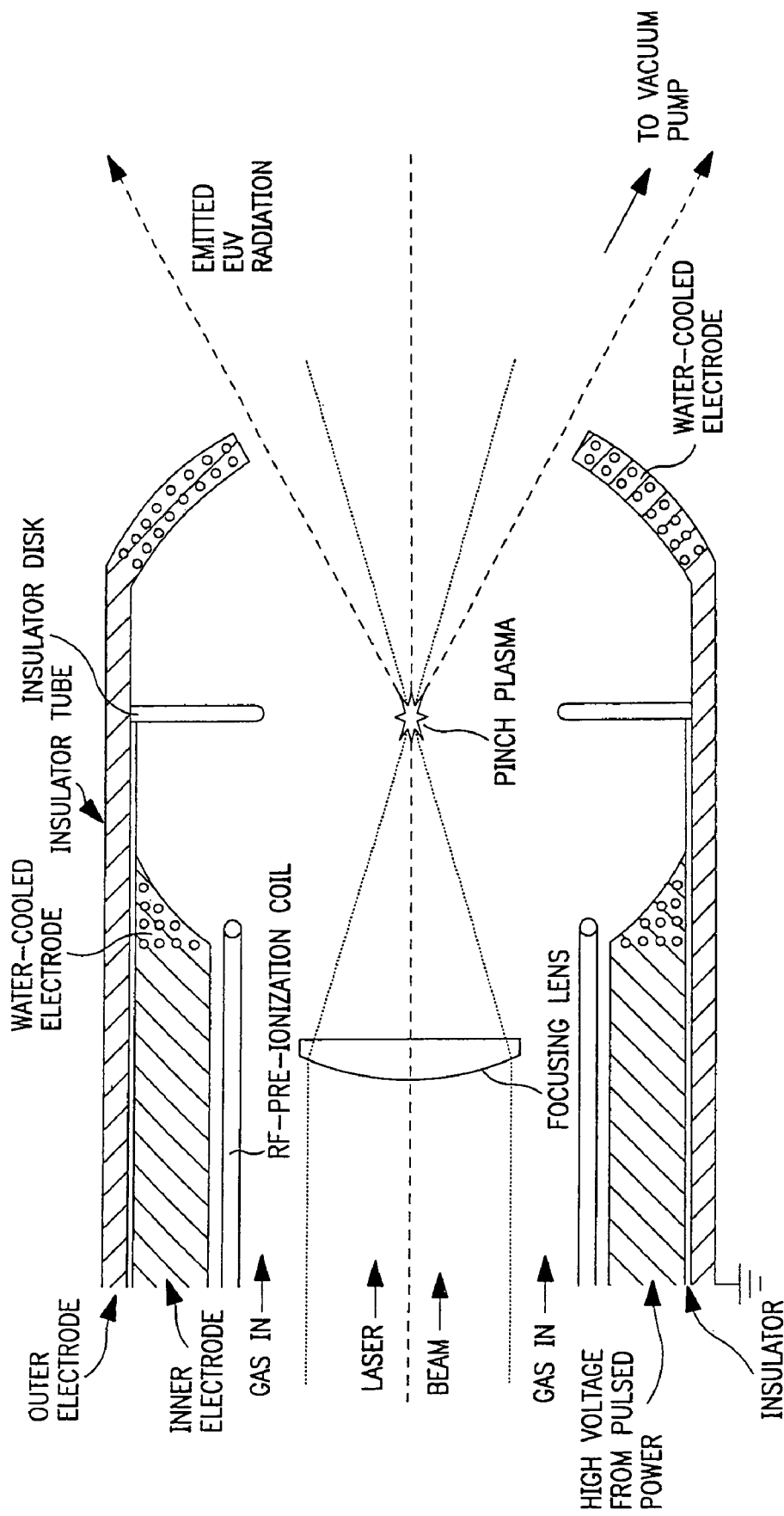
FIG. 4C shows a hybrid EUV system.
Figure 6A:
FIGS. 6A and 6B show features of a second debris collector.
Figure 6B:
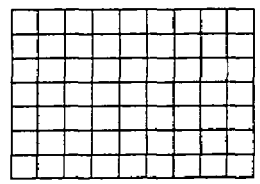

The device is mainly a discharge-produced EUV light source that has the additional benefits of laser-plasma supported discharge initiation. The electrodes can be connected to the same pulsed-power system that is used presently (and in the future) for the DPF machines. (10 J to 20 J delivered pulse energy, 30-100 ns pulse length, repetition rate of several kHz, peak voltage of several kV, peak current several tens of kA.) The inner electrode can be charged positive or negative. The outer electrode is at ground potential. As shown in FIG. 4C the electrode arrangement is somewhat different from the DPF arrangement. The (water-cooled) electrodes are bigger and the electrode surface involved in the discharge is bigger. It is on the order of 30 to 50 $cm^2$. There is an insulator disk between the electrodes to prevent a discharge along the direct line-of-sight.

There is a means of pre-ionization, e.g., pulsed RF-pre-ionization via RF-coil. The pulsed laser beam (excimer laser or solid-state laser) that propagates on-axis is focused by a focusing optics into the center of the arrangement to a focal spot with a diameter of ca. 100 μm. The laser can be a KrF-broad-band excimer laser with 100 mJ to 200 mJ pulse energy, about 10 to 15 ns pulse length and several kHz repetition rate. There could also be several laser beams focused into a common spot in the center of the arrangement. The target gas, xenon or a mixture of xenon and helium, is inserted from inside of the inner electrode and is pumped away by a vacuum pump. Typical operating pressure is in the range of 1 to 0.01 Torr. The discharge can be operated on the left side of the Paschen curve. If the inner electrode is pulsed-charged by a negative high voltage, it can be configured as a hollow cathode.

First, RF pre-ionization is triggered to enable easy breakdown of the low-density gas. Next, the laser beam arrives and generates a well-defined plasma spot at the center of the arrangement. The gas breaks down near the laser focus, since it was pre-ionized. Then the main discharge from the pulse-compression circuit is applied. A pinch will develop on-axis at the laser-plasma spot. Pinching occurs by magnetic self-compression. The laser-plasma spot defines the location of the pinch and increases its positional stability. (In case the inductance in the center should be too high, the laser beam needs to be doughnut-shaped in order to provide a discharge channel. This has to be tested experimentally.) The expanding shock front from the laser plasma will encounter the radial compression front from the main pinch plasma which is stronger. A pinched plasma channel develops which will heat the gas to high ionization levels that will emit the EUV radiation. The counter-propagation of the two plasma shock fronts can effectively increase the duration of the pinch and thus the duration of the EUV emission. The EUV radiation is emitted in all directions. The radiation emitted through the large opening of the outer electrode can be collected by grazing-incidence collection optics. The energy, the size of the focus and the timing of the laser plasma determine the size of the main pinch plasma.

Radiation Collector

Materials

The radiation produced at the radiation spot is emitted uniformly into a full $4\pi$ steradians. Some type of collection optics is needed to capture this radiation and direct it toward the lithography tool. Several materials are available with high reflectivity at small grazing incident angles for 13.5 nm UV light. Graphs for some of these are shown in FIG. 11. Good choices include molybdenum and rhodium in the range of 0 to about 20 degrees and tungsten for very small grazing angles. The collector may be fabricated from these materials, but preferably they are applied as a coating on a substrate structural material such as nickel. This conic section can be prepared by electroplating nickel on a removable mandrel.

Conical Nested Collector

To produce a collector capable of accepting a large cone angle, several conical sections can be nested inside each other. Each conical section may employ more than one reflection of the radiation to redirect its section of the radiation cone in the desired direction. Designing the collection for operation nearest to grazing incidence will produce a collector most tolerant to deposition of eroded electrode material. The grazing incidence reflectivity of mirrors such as this depends strongly on the surface roughness of the mirror. The dependence on surface roughness decreases as the incident angle approaches grazing incidence. Applicants estimate that their devices can collect and direct the 13 nm radiation being emitted over a solid angle of least 25 degrees.

Figure 9:
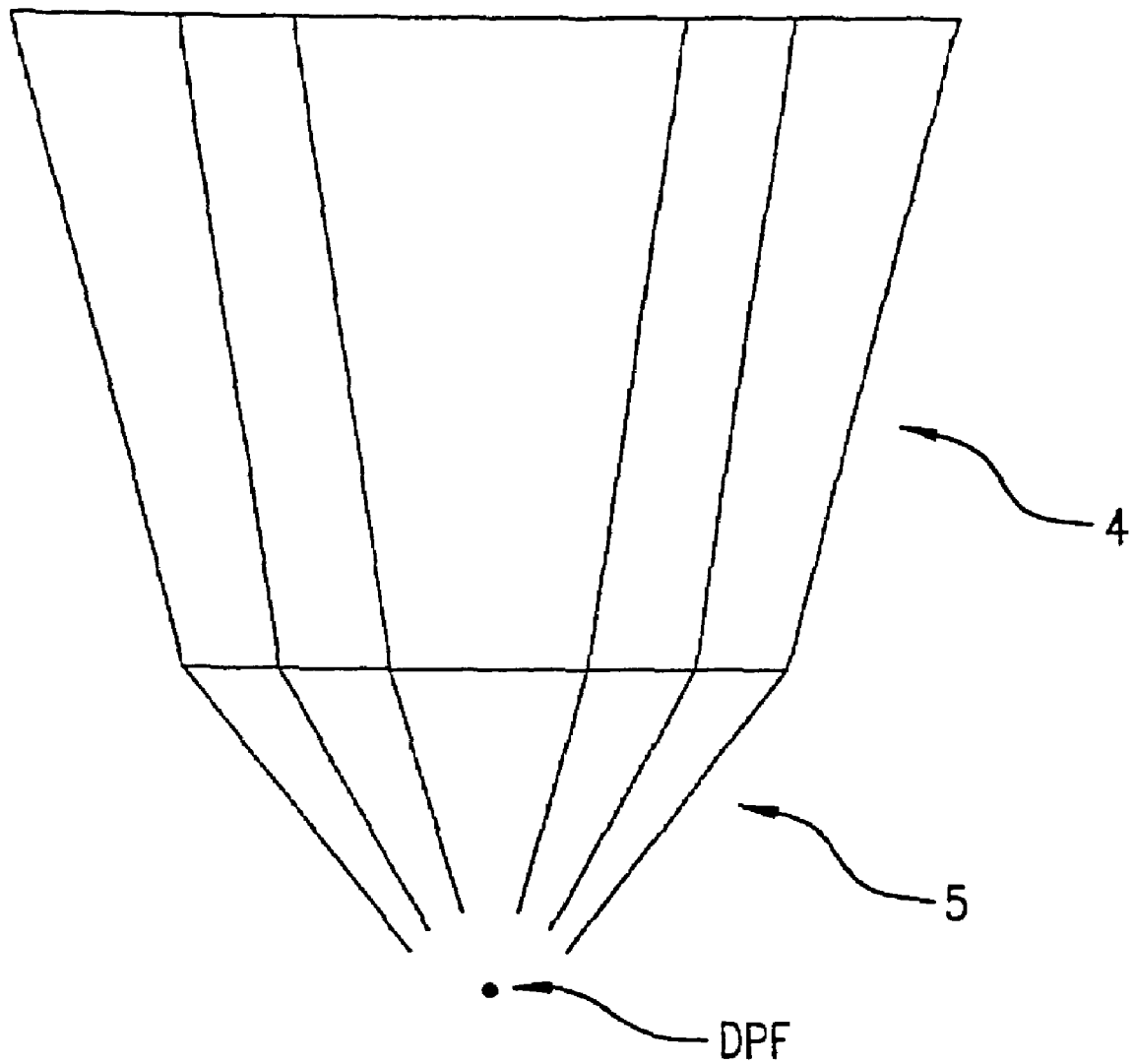

In another preferred embodiment the collector-director is protected from surface contamination with vaporized electrode material by a debris collector which collects all of the tungsten vapor before it can reach the collector director 4. FIG. 9 shows a conical nested debris collector 5 for collecting debris resulting from the plasma pinch. Debris collector 5 is comprised of nested conical sections having surfaces aligned with light rays extending out from the center of the pinch site and directed toward the collector-director 4.

The debris collector collects vaporized tungsten from the tungsten electrodes and vaporized lithium. The debris collector is attached to or is a part of radiation collector-director 4. Both collectors may be comprised of nickel plated substrates. The radiation collector-director portion 4 is coated with molybdenum or rhodium for very high reflectivity. Preferably both collectors are heated to about 400° C. which is substantially above the melting point of lithium and substantially below the melting point of tungsten. The vapors of both lithium and tungsten will collect on the surfaces of the debris collector 5 but lithium will vaporize off and to the extent the lithium collects on collector-director 4, it will soon thereafter also vaporize off. The tungsten once collected on debris collector 5 will remain there permanently.

Parabolic Collector

Figure 8:
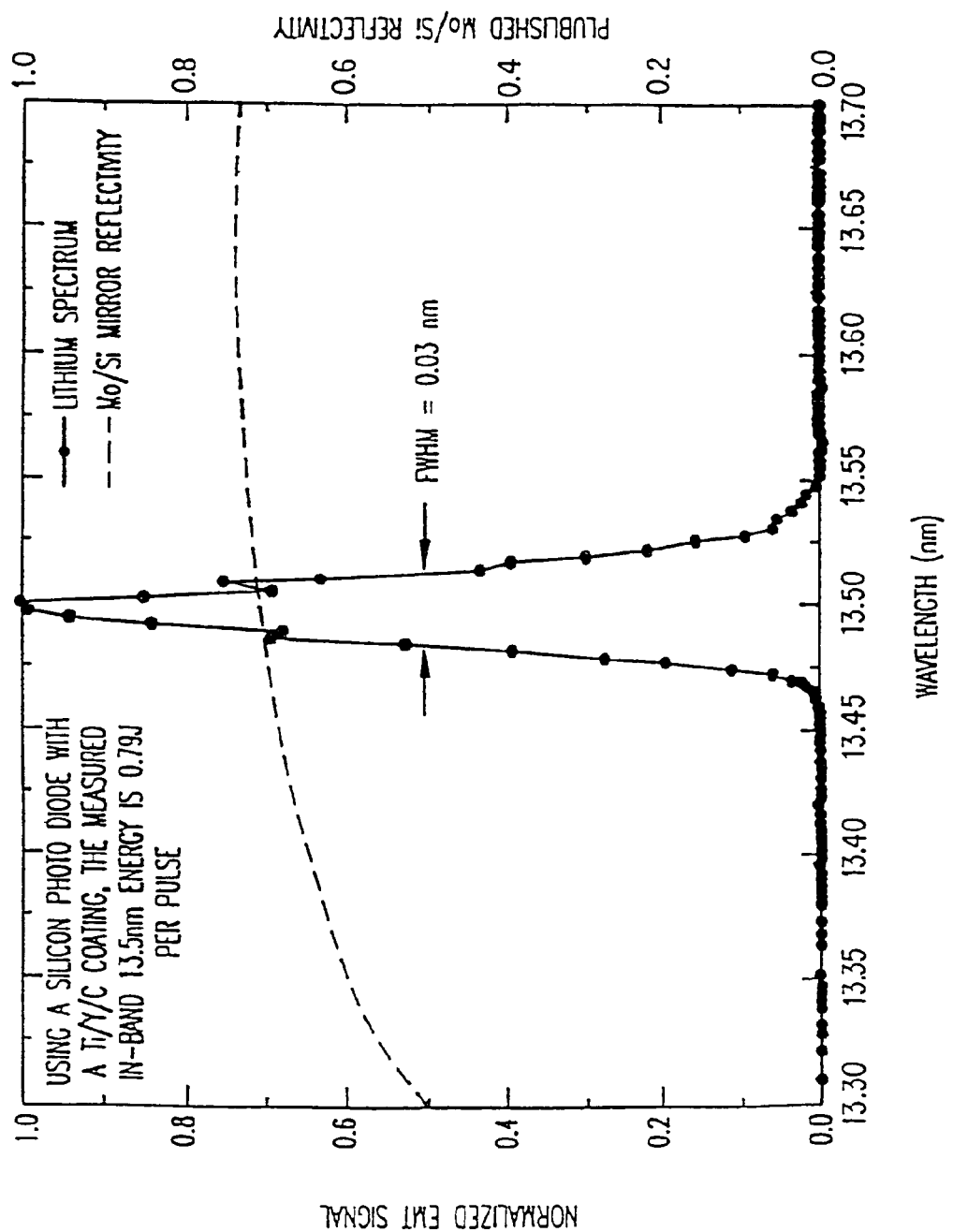
FIG. 8 illustrates the reflectivity of a multilayer mirror in the spectrum for lithium.
Figure 8A:
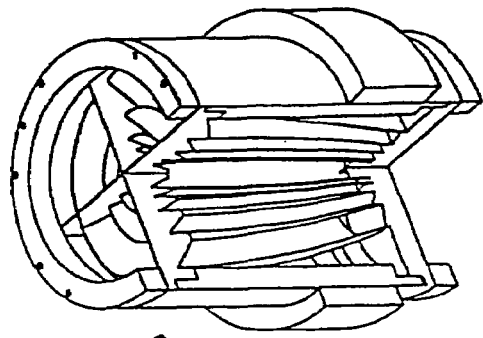
FIG. 8A is a prospective drawing of a hyprobolic collector.
Figure 8C:
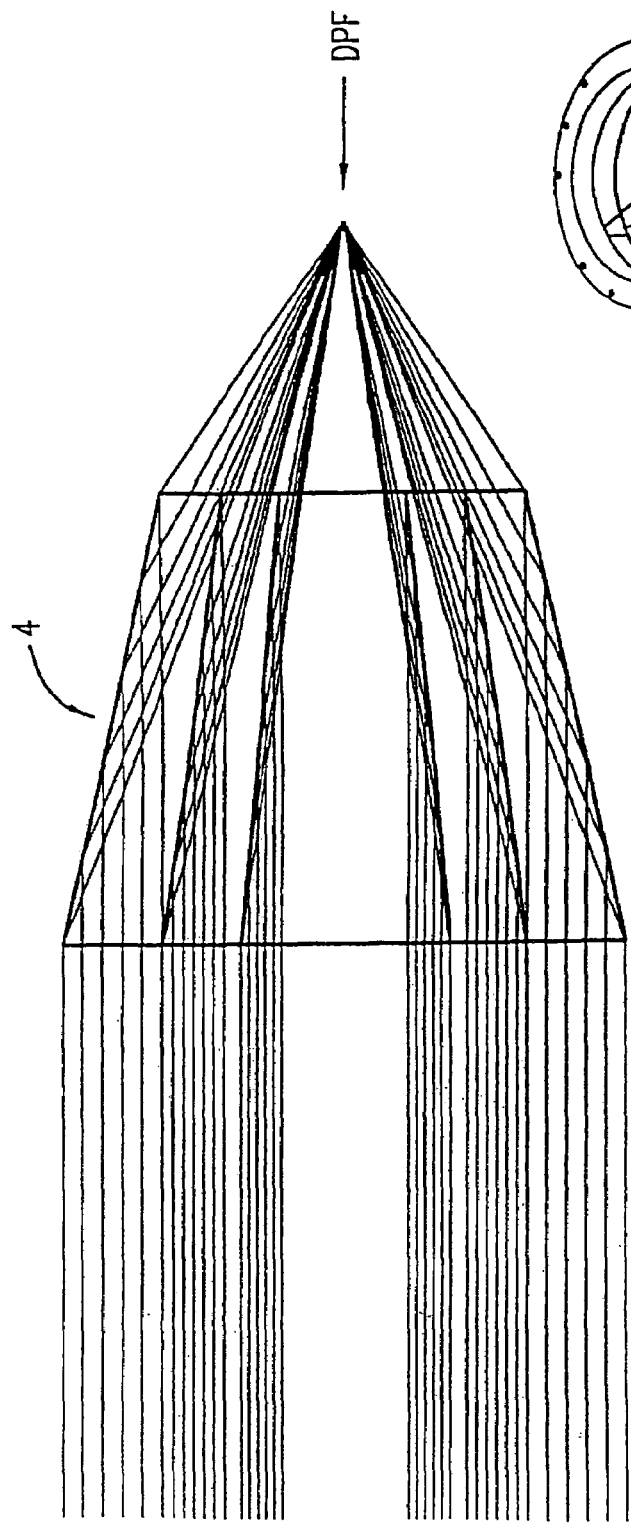
FIG. 8C shows a portion of the EUV beam produced by a hyprobolic collector.
Figure 8B:
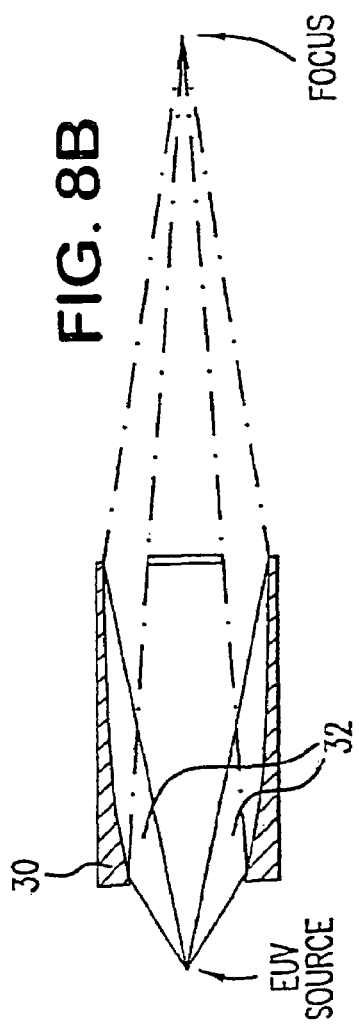
FIG. 8B shows a portion of the EUV beam produced by an ellipsoidal collector.

FIG. 8C shows the optical features of a collector designed by Applicants. The collector as shown in FIG. 8A is comprised of five nested grazing incident parabolic reflectors, but only three of the five reflections are shown in the drawing. The two inner reflectors are not shown. In this design the collection angle is about 0.4 steradians. As discussed below the collector surface is coated and is heated to prevent deposition of lithium. This design produces a parallel beam. Other preferred designs would focus the beam. The collector preferably is coated with a material such as those referred to above and graphed in FIG. 11 possessing high glazing incidence reflectivity in the 13.5 nm wavelength range.

Ellipsoidal Mirror

Another collector-director designed to focus the beam is shown in FIG. 8. This collector-director utilizes an ellipsoidal mirror 30 to focus the EUV source. Mirrors of this type are available commercially from suppliers such as Reflex S.V.O. with facilities in the Czech Republic and are distributed in the United States by Bede Scientific Instruments Ltd. with offices in the United Kingdom and Englewood, Colo. The reader should note that this mirror collects only rays at angles shown at 32 in FIG. 8. However, additional mirror elements could be included inside mirror 30 and outside mirror 30 to collect and focus additional rays. The reader should also note that other mirror elements could be localized downstream of mirror 30 to collect the narrow angle rays or upstream of mirror 30 to collect the wider angle rays.

Tandem Ellipsoidal Mirror

FIG. 19 shows a preferred collector director design for greatly improving the EUV beam profiled. This is a tandem ellipsoidal mirror unit which collects and directs the EUV radiation produced in the plasma pinch.

In most lithography applications the target region needs to be exposed uniformly. A single or nested ellipsoidal mirror of the type shown in FIG. 2A when used to collect and re-focus the EUV radiation produces a very non-uniform annulus of radiation upstream and downstream of focus spot 11 shown in FIG. 2A. This is a natural effect caused by the geometry of the ellipsoidal collector. The front of the mirror collects a greater solid angle of the source emission per unit mirror surface area than the back of the mirror. This effect can be reversed by using a second ellipsoidal mirror 44 in tandem with the first mirror 42 as shown in FIG. 19. (In this embodiment, single ellipsoidal mirrors are used without a second nested ellipsoidal mirror.) The second ellipsoidal mirror 44 is a mirror image of the first ellipsoidal mirror 42 "reflected" about the second focal point of the first mirror. This places the second ellipsoidal mirror on the same optical axis as the first mirror so that its first focal point is at the second focal point of the first mirror. In this case of the tandem ellipsoidal mirror the radiation leaving the second focal point of the second mirror is annular but the radiation within the annulus is uniform. The exposure uniformity is now a function of the surface figure of the ellipsoidal mirrors and not the inherent collection geometry of the ellipsoidal mirror.

Analysis

The optical characteristics of the tandem ellipsoidal mirror were analyzed by Applicants with the ray tracing code, TracePro, supplied by Lambda Research Corporation of Littleton, Mass. The EUV radiation from the DPF source is incoherent. Consequently, a ray tracing code can be used to determine the properties of the radiation collected and leaving the tandem mirror. The EUV radiation requires special reflective surfaces such as molybdenum or ruthenium. This analysis was performed under the assumption that the mirror surface has a perfect ellipsoidal reflector and that the radiation is not polarized during reflection. The mirror surface was assumed to be pure ruthenium reflecting at 13.5 nm. Also, the source has been assumed to be a 50 micron diameter disc and that the radiation emits isotropically from each point on its surface. These assumptions do not detract from the basic ability of the tandem mirror to produce a uniform annular exposure region.

The geometry of the tandem ellipsoidal mirror is illustrated in FIG. 19. Both mirrors have the same parameters. Their minor radius is 40 mm and their focal length is 150 mm. The mirrors are each 100 mm long and have been cut through their minor diameter. The figure also shows a few random rays collected by the first mirror. A fraction of the radiation that leaves the plasma pinch source 46 at the first focal point of the first mirror is collected and re-focused at the second focal point 11 of the first mirror. The radiation leaving focal point 11 at 300 mm from source 46 is collected by the second ellipsoidal mirror and re-focused at the second focal point of the second mirror 48 at 300 mm from focal point 11. At focal point 48 a 1:1 image of the source is produced. As the radiation leaves focal point 48, the rays diverge to produce an annular exposure area at detector 50 which is located 9 mm from focal point 48. The intensity in this annular region is uniform as shown by the TracePro calculation in FIG. 19. The uniformity in the main annular region is within ±2.5% of the mean value. A simulation performed by Applicants of the beam profile at detector 50 is shown in FIG. 19 which may be compared with a similar simulation made for the beam cross section at 9 mm downstream of focal point 11. A cross section of the two profiles is compared in FIG. 19 with the detector 50 cross section shown at 52 and the cross section of the FIG. 19 beam profile at 54.

Fabrication

The techniques for ellipsoidal mirror fabrication have been improved over the past few 10s of years. The surface quality of these mirrors can now be made to satisfy the requirements of surface figure, surface roughness, and the material of the reflecting surface for their use in the EUV region. Four materials have been identified as possible candidates for the EUV ellipsoidal mirror surface: molybdenum, ruthenium, rhodium, and palladium. These materials have relatively high grazing incidence reflectivity at 13.5 nm. The grazing incidence reflectivity must remain high at relatively high angles to allow the mirror to collect a reasonable solid angle subtended from the source. Theoretically, ruthenium has the highest collection efficiency of the four materials listed.

These mirrors are fabricated though a series of processes. First, a mandrel is made that has the outside figure of the desired mirror. Typically, the mandrel is made undersize using aluminum and then coated with electroless nickel containing 15% phosphorus to make the mandrel oversize. The electroless nickel is put on about 0.5 mm thick so that the entire surface can be diamond turned to the desired mirror surface figure by vendors such as Corning Netoptic with offices in Marlborough, Mass. This typically leaves about 0.1 mm of nickel on the mandrel surface. Although the present technology of diamond turning is very good the surface at this stage is not adequate for use as an EUV mirror. The diamond turning can be accurate enough for the figure requirements that include the deviations from the elliptical surface front-to-back and the roundness of the surface but the micro-roughness is too high. The diamond turned surface must be polished to reduce the micro-roughness to less than 0.5 nm RMS. The hardness of the nickel surface imparted by the high phosphorus content of the electroless nickel is required for the high degree of polishing. After the electroless nickel surface is adequately polished and the surface figure is within specifications, the reflecting surface material is coated onto the mandrel surface. The exact procedure used to coat the surface is dictated by the properties of the reflecting material being added to the surface. After the reflecting coating has been placed on the mandrel, nickel is electroformed over this surface to a thickness of about 0.5 mm. The electroformed nickel is removed from the mandrel by applying force along the axis of the mandrel between the mandrel and the electroformed nickel. The reflecting surface stays with the electroformed nickel shell to form the mirror as it slides off the nickel surface on the mandrel. The surface of the highly polished electroless nickel with the high phosphorus content acts as a natural release agent for the reflecting surface. After the mirror has been removed from the mandrel and the mandrel re-polished, the mandrel is then available to make additional mirrors that are exact copies of the first mirror.

Alignment

The positioning of the mirrors relative to the source and to each other is critical to the correct function of the tandem ellipsoidal mirrors. Alignment can be accomplished on an optical bench with a source placed at the same location as the DPF EUV source. One must take advantage of the optical properties of these ellipsoidal mirrors. If a detector plane is placed perpendicular to the optical axis near the second focal point, the small source, 50 microns diameter, e.g., can be placed near the first focal point of the ellipse. The image will only be centered and symmetric if the detector is at the second focal point. After the axial location of the second focal point has been determined, the detector array can be moved away from the focal point. Now the image will only be symmetric if the source is on the mirror axis. This requires positioning the source in two spatial dimensions. The axial location of the first focal point can be determined by moving the detector to the second focal point and then moving the source along the mirror axis until the detector gives a maximum signal in the image center.

This procedure must be repeated for the second mirror. After the two mirrors have been aligned, the entire assembly must be transferred to the DPF. The fixture must be adequately keyed to place the EUV source at the first focal point of the first mirror. The accuracy of positioning must be at least 25% of the effective diameter of the DPF EUV source. The present estimate of the DPF source diameter is 80 microns while looking along the machine axis. Hence, the expected alignment accuracy is 20 microns in the plane perpendicular to the machine axis. The axial alignment of the tandem mirror is not as critical and is expected to be about 0.5 mm.

Lithography Projection Optics

The EUV projection in preferred embodiments is designed to map the source spot into the entrance pupil of the projection optic and to map the far field intensity (i.e. the energy vs. angle) of the source onto the reticle. Such designs are desirable because the uniformity in the entrance pupil, though important, is not critical while the uniformity at the reticle plane is critical. This design concept exploits the fact that the emission is isotropic and thus has uniform intensity vs. angle. The dual mirror concept restores this uniform intensity vs. angle property (at least within the cone of capture angle for the mirrors). The EUV illuminator take the "ring" of intensity versus angle, break it into pieces or arcs, and overlay these arcs onto the reticle. This further improves the uniformity and can be done in EUV systems since they are scanners and thus require illumination only over a slit region.

Debris Mitigation

Both the mid-focal point 11 between the two mirrors and the final focal point 48 allow the DPF source region to be isolated from the lithography exposure region. At these points the EUV radiation can pass through pinholes that block any source debris or active gas (that penetrated into the region of the first elliptical mirror unit) from reaching the exposure chamber but not the EUV radiation. Also, these small pinholes allow the exposure chamber to have a much lower pressure than that required for DPF operation.

Hybrid Collection

Figure 11B:
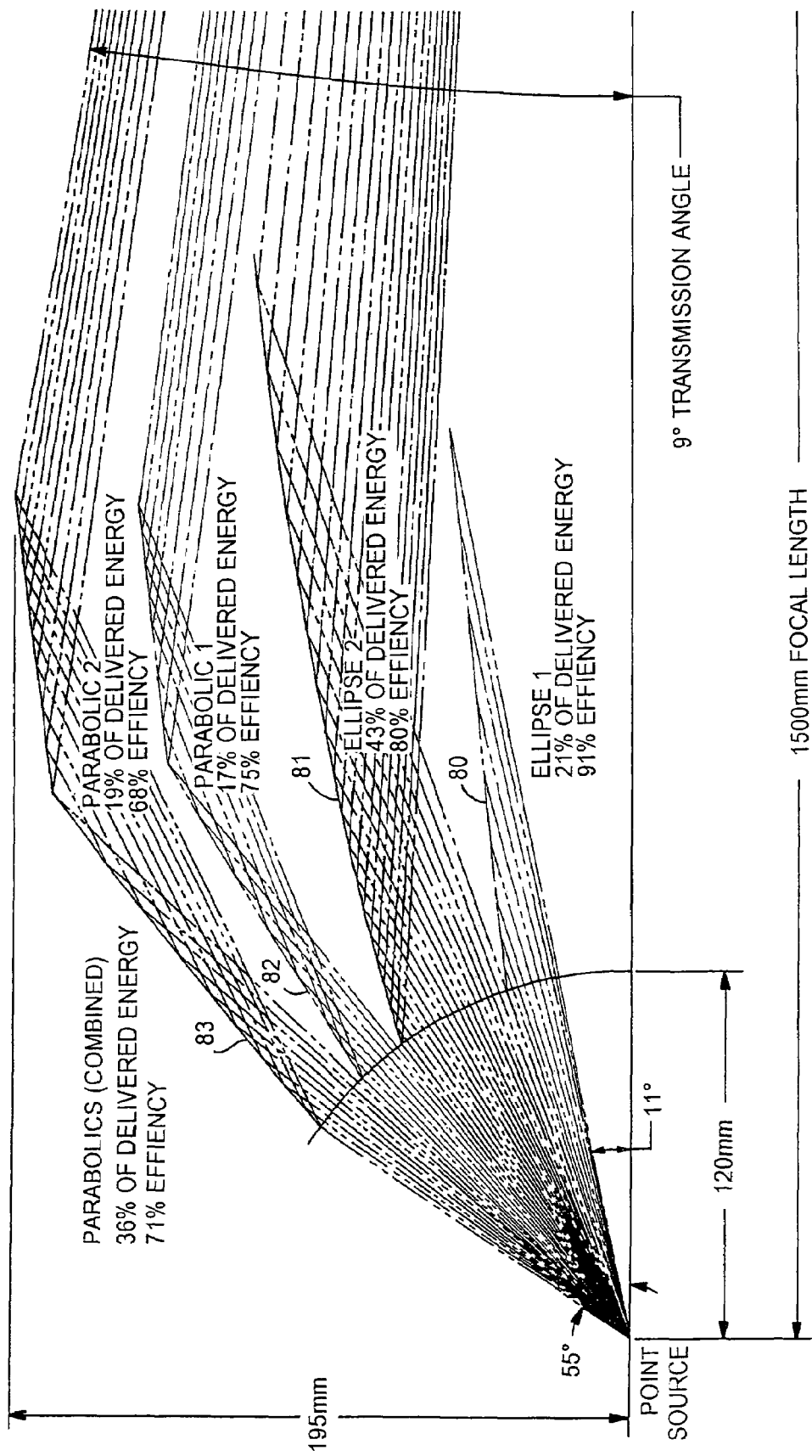

Based on currently available reflector technology, only two types of reflectors exist which provide reflection values in the 0.7 or greater range for this 12-14 nm EUV light. As shown in FIG. 11A a few materials provide good grazing angle reflectors. For example, reflection from smooth molybdenum surfaces is about 90% grazing angles less than 10 degrees, but reflection from molybdenum drops rapidly at grazing angles greater than 15 degrees to less than 10% at 25 degrees. On the other hand, special multi-layer reflectors have been designed that provide reflectivity values in the range of 60% to 70% at normal incident angles but the reflectivity of these multi-layer reflectors remains high for only about 5-8 degrees from normal and drops to less than about 10% at incident angles greater than about 10 to 15 degrees. Other multi-layer mirrors can be designed for about 30 percent reflectivity over a broader range up to about 20 degrees around normal. Using these available mirror technologies Applicants have developed various collector designs for maximizing the collected light. Three of these designs are shown in FIGS. 11B, 11D and 11E. Applicants refer to these collectors as hybrid collectors since they utilize multiple collection designs. For example, the prior art includes nested elliptical mirrors and nested grazing angle by hyperbolic mirrors including double bounce hyperbolic mirrors and most multi-layer reflector designs are single bounce near normal hyperbolic designs. FIG. 11B is a partial cross-section of a hybrid collector utilizing two ruthenium coated ellipsoidal mirrors 80 and 81 and two double bounce ruthenium coated parabolic mirrors 82 and 83 to provide a 1500 mm focal length. FIG. 11C shows the reflection efficiencies of the mirrors at the angles of incident of the light between about 10 degrees and 55 degrees. This design collects significantly more light than prior art elliptical designs or prior art hyperbolic designs. Applicants estimate that about 25 percent of the emitted light is collected and 79 percent of the collected light is delivered to the intermediate focus at 1500 mm. This equates to an estimate 20 percent collection efficiency.

FIG. 11D shows a modified version of the FIG. 11B collector in which an additional parabolic double reflection mirrors 84 and a parabolic triple reflection mirror 85 are utilized to increase the net energy collected to about 28 percent.

FIG. 11E shows a third hybrid version also a modification to the 11B collector which (in addition to the two ellipsoidal reflectors) and the two-bounce parabolic reflectors, Applicants have added a third two-bounce parabolic mirror 86 and a grazing angle curved ray-traced mirror 87 and a multi-layer parabolic mirror 88 reflecting at about 9 degrees from normal to increase the collection efficiency from about 20% to about 25%.

In another embodiment, a multitude of laser beams can be focused through corresponding openings of the electrodes to a common central focal spot. The main discharge follows along the laser channels and converges onto the center plasma.

Debris Shields

Techniques for Making Debris Shield

As described above debris shields are important elements in substantially all EUV light sources now under consideration. The perfect debris shield won't trap all debris and transmit all in band radiation. Since the debris shield will likely have a limited lifetime, it should also preferably not be difficult to make. Three preferred techniques for fabrication debris shields are shown in FIGS. 28A-B, 29A-C and 30A-C.

Figure 26B:
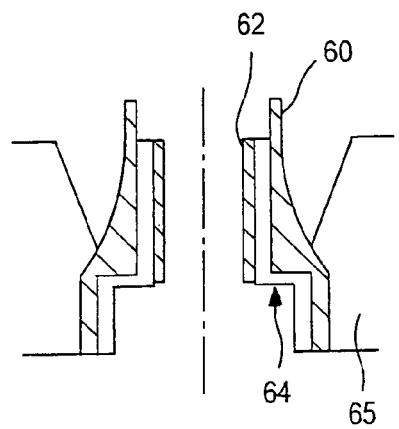
Figure 26A:
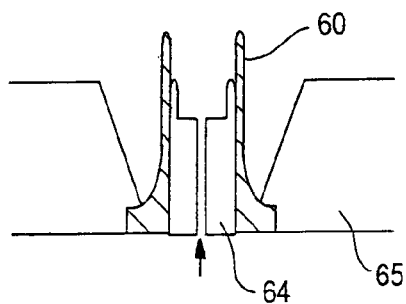

For the technique described in FIGS. 26A and B, removable skinny pyramid shaped forms as shown in FIG. 26A are fabricated and the small end of the forms are inserted in a grid shaped structure such as the one shown in 28B. A spacer plate with tabs matching a hole at the large end of each of the forms is placed over the larger end of the forms to separate each form from other forms by the thickness of the grid which preferably is about 0.01 to 0.1 mm or less. The grid spacing provides a narrow space between the forms which is filled with a liquid metal or liquid ceramic. When the metal or ceramic has hardened the forms are removed to create the debris shield.

Figure 5A:
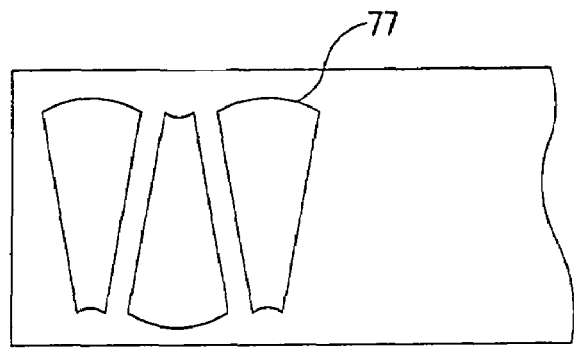
FIG. 5A-C shows methods of making a debris collector
Figure 5B:
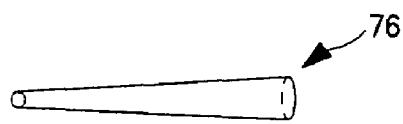
Figure 5C:
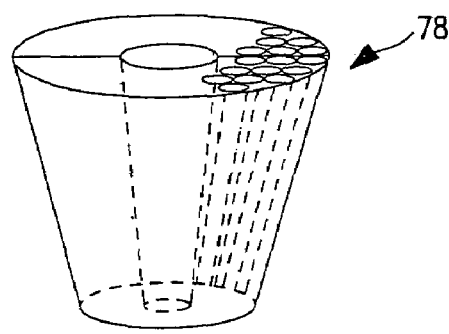

For FIGS. 5A-C technique, hollow cones such as those shown 76 in FIG. 5B are welded from very thin about (0.1 mm) metal foil cut from foil sheets as shown at 77 in FIG. 5A. These hollow cones are inserted into a metal form as shown at 78 in FIG. 5C to form the debris shield.

Figure 7C:
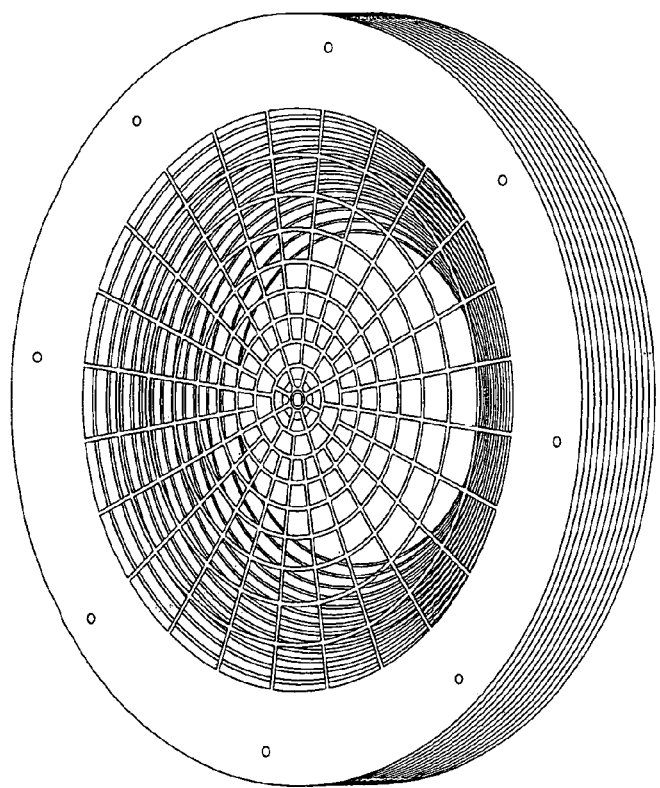
FIGS. 7A, 7B, and 7C show features of a third debris collector.
Figure 7A:
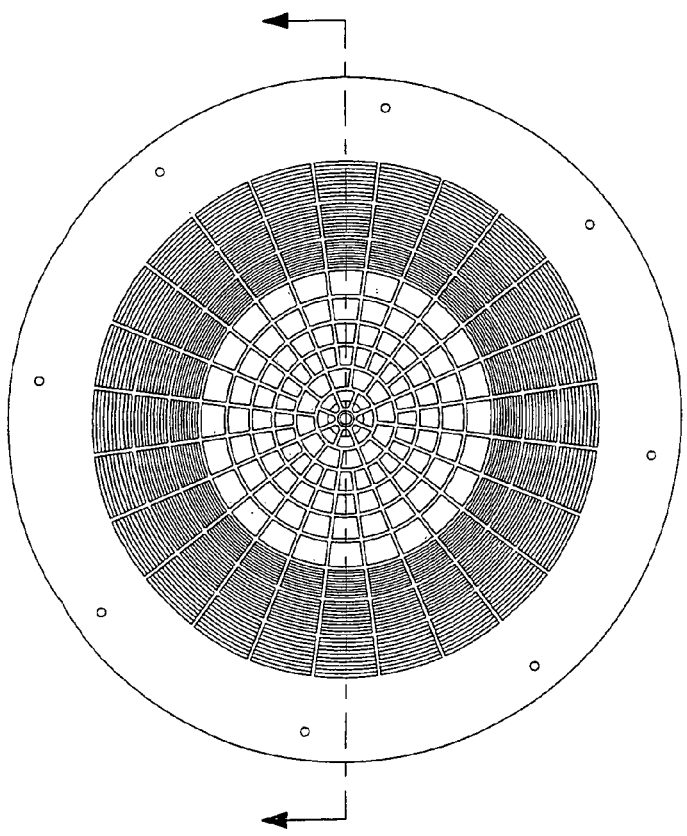
Figure 7B:

As shown in FIGS. 7A-C, a preferred debris shield can be made by laminating thin sheets. Each sheet has its own individual radial grille work with grille work patterns growing larger for each sheet so that when multiple sheets are stacked the desire shape is produced as shown in FIGS. 7A-C.

An advantage of the laminated approach is that the uneven surfaces of the channels provides a torturous path for particulate with multiple eddys for particulate to collect within. Another advantage is that the shield assembly can be constructed of multiple materials. It may prove beneficial to use heat resistant ceramics close to the light source, or perhaps materials with excellent thermal conductivity such as copper that can assist in removing heat from the same region.

Magnetic Suppression

Another technique for increasing the effectiveness of debris shields in these EUV light sources is to apply a magnetic field in the region of the debris shield and the region between the pinch and the shield. The magnetic field preferably is directed perpendicular to the axis of the EUV beam so as to force charged particles into a curved trajectory as it approaches and passes into the debris shield. To enhance the effectiveness of the debris shield the debris can be further ionized post pulse. This can be done with the same components used for preionization or similar ionization components could be used for the post pinch ionization.

In another embodiment a coil with large diameter (larger than the collector mirror diameter) will be mounted co-axially with the mirror and plasma source. Generally, a high current will be applied to the coil to induce a high magnetic field in the axial direction. Preferentially, the current may be pulsed (pulse width on the order of several 10 µs) to achieve a high induction field strength (on the order of 10 Tesla). Constant fields and preferentially super-conducting coils may also be employed to generate these high fields. This is sufficient to deflect most energetic ions to curved paths, such that they miss the collector mirror. The high magnetic filed will lead to a slight elongation of the plasma source volume, but this can be tolerated. The coil has to be mounted on some support structure. It is conceivable, to mount the coil inside or outside of the vacuum chamber.

The radius of the curvature of a charged particle in a magnetic field is governed by the equation of motion:

$$F = q(v \times B)$$

From which we can derive that the magnetic rigidity (B*R) for an ion of mass M, accelerated to a voltage V is given by:

$$B*R = 144(M*V)^{0.5}$$

Applying this case where we want to deflect a singly charge Xe ion (mass 132) accelerated to 1000 Volts we get a rigidity of:

$$B*R = 144(132*1000)^{0.5} \text{ (G-cm)} = 52{,}318 \text{ G-cm}$$

Therefore if we want the ion to move in a circular orbit of radius 10 cm we require a magnetic field of 52,318 G-cm/10 cm which is equal to −5232 gauss.

In general to deflect ions of different masses and energies we may require stronger or weaker fields. The configuration of the magnetic field can also be adjusted to optimize the shielding power for the EUV optics by winding coils in various configurations or using combinations of coils and permanent magnets to achieve the desired field profiles. For these fields a coil can be placed either outside the vacuum vessel or interior to it. The current driving a coil required to produce a given magnetic field can be easily calculated.

Honeycomb Debris Shield

Figure 9A:
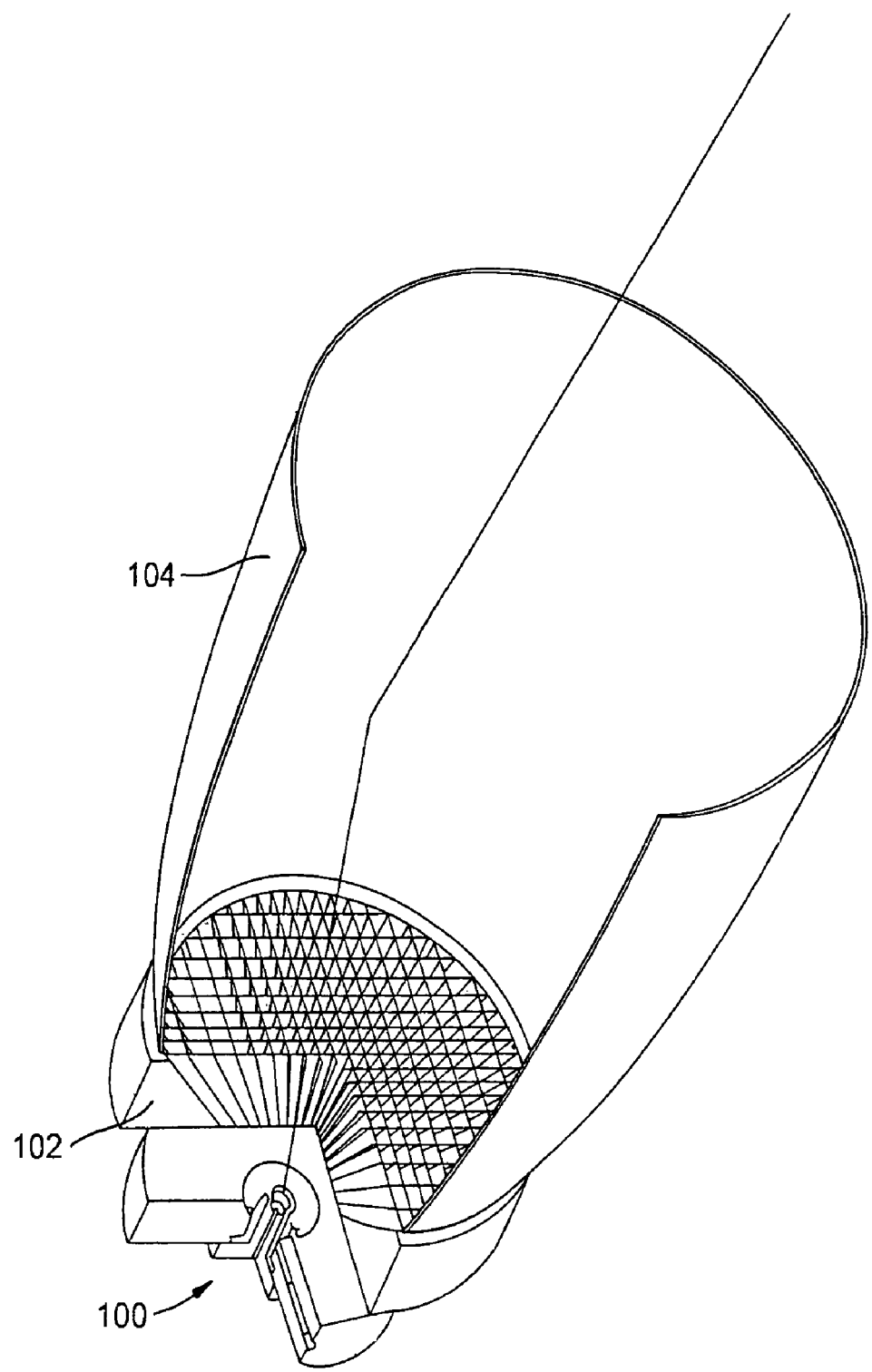

FIGS. 9A, 9B, and 9C show examples of a special preferred embodiment utilizing a tapered powder-formed cellular honeycomb body as the debris collector with an ellipsoidal radiation collector. The debris collector is preferably produced utilizing one of the techniques described in U.S. Pat. No. 6,299,958 which is incorporated by reference herein. The debris shield is produced through a reforming procedure wherein a precursor honeycomb, shaped from a plasticized powder batch material, is filled with a compatible plastic filler material and then shaped by forcing the filled honeycomb through a conical shaped form. The process forces a shrinkage of both the filler material and the honeycomb structure. The structure now conical shaped is then removed from the form and the filler material is removed by a process such as melting it. Then the now conical-shaped honeycomb is then hardened such as by sintering. FIG. 9A is a three-dimensional cutaway drawing showing pinch region 100, honeycomb debris shield 102 and a portion of ellipsoidal shaped radiation collector-director 104. FIG. 9B shows a cross-section view of the FIG. 9A components along with ray traces 106A, B, C and D of four of the rays from pinch region 100. FIG. 9C shows how additional ellipsoidal elements can be nested to focus more of the light. Preferably 9 or 10 elements are nested within the outside ellipsoidal element. The powders, binder material and filler material can be chosen from the ones listed in the U.S. Pat. No. 6,299,958. The choice of material should be made recognizing the need of the debris shield to withstand intense extreme ultraviolet radiation. A preferred choice is powder and other material selected to produce cordierite comprised of silicon manganese and aluminum.

Active Materials and Buffer Gas

Choice of Active Materials and Buffer Gases

Several active materials and buffer gases are available for generating EUV light in the wavelength range of about 13.2 nm to 13.8 nm. Preferred active materials are xenon, tin or lithium. These three active materials are discussed above in the section entitled, "Sources for 12-14 nm EUV". Indium, cadmium and silver are also possible candidates. If one of the above materials are used as the active material than a noble gas such as helium neon or argon should be used as the buffer gas. Nitrogen and hydrogen could be added to the potential list of buffer gases especially if xenon is the active material. The active materials which are metals are in most embodiments added to the discharge chamber as vapors although they could be added as liquids or solids and may be added in the form of a solution or powder.

All of these active materials are chosen because they provide an emission line in the desired range of 13.2 to 13.8 nm and as explained above, this is because reflective optics are available with relatively good properties for UV light in this range. If and when good optical components become available in other wavelength ranges lower or higher than this range, then the periodic table and corresponding emission line literature should be searched for alternative active materials. Also, buffer gases are not limited to the ones set forth above.

Injection Through Anode

Figure 18A:
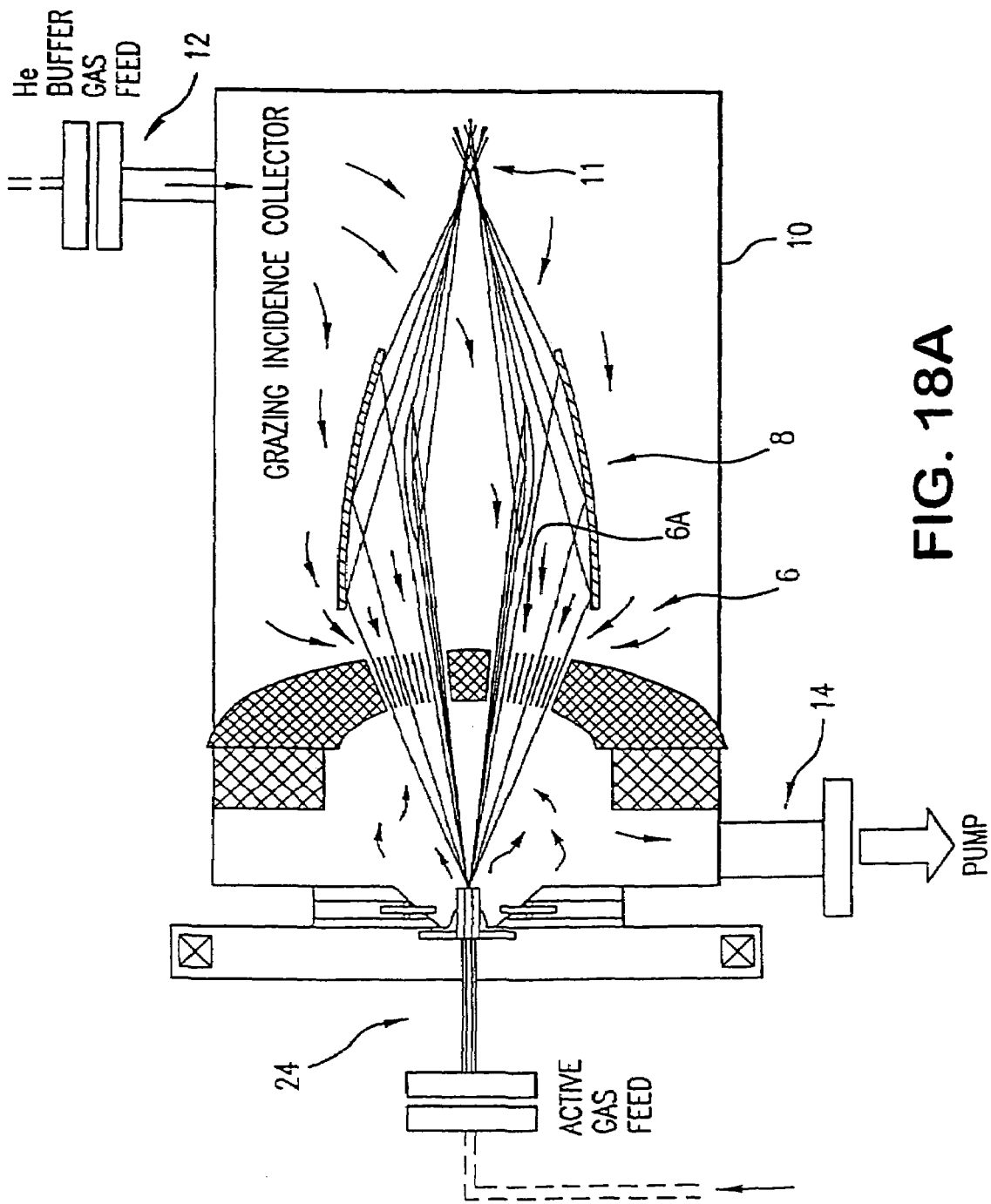
FIGS. 18A, 18B, 18C, and 18D show techniques for controlling active gas and buffer gas in the vacuum vessel of preferred embodiments.

FIG. 18A shows features of a preferred embodiment of the present invention in which the active gas in this case Xe (mixed 1 part and 14 parts with helium) is injected through the anode. The buffer gas (in this case 100% He) is injected at 12 in the region downstream of collector-director 8. Debris collector 6 comprises nested conical sections providing narrow passageways in line with rays extending from the center of the pinch region to collector-director 8. These passageways permit about 85% of the photons directed toward collector-director 8 to pass but retards substantially the passage of debris generated in the pinch region which follows paths much more random than the EUV light. Gas is exhausted from vacuum chamber 10 through port 14 by a 40 liter per second vacuum pump. Therefore, buffer gas flow from gas feed 12 through the narrow passageways in debris collector 6 further retards the passage of debris from the pinch and also retards flow of the Xe active gas from the pinch region into the region of chamber 10. Therefore, substantially all of the debris from the pinch region and active gas injected through port 24 is either exhausted through port 14 or coats the surfaces of the debris collector or the inside walls of the vessel upstream of the debris collector. This avoids contamination of collector-director 8 by debris from the pinch and minimize attenuation of the beam by xenon gas since the flow of buffer gas through the narrow passageway in debris collector 6 prevents any significant quantity of xenon from entering the region downstream of debris collector 6.

Two Direction Gas Flow

Figure 18B:
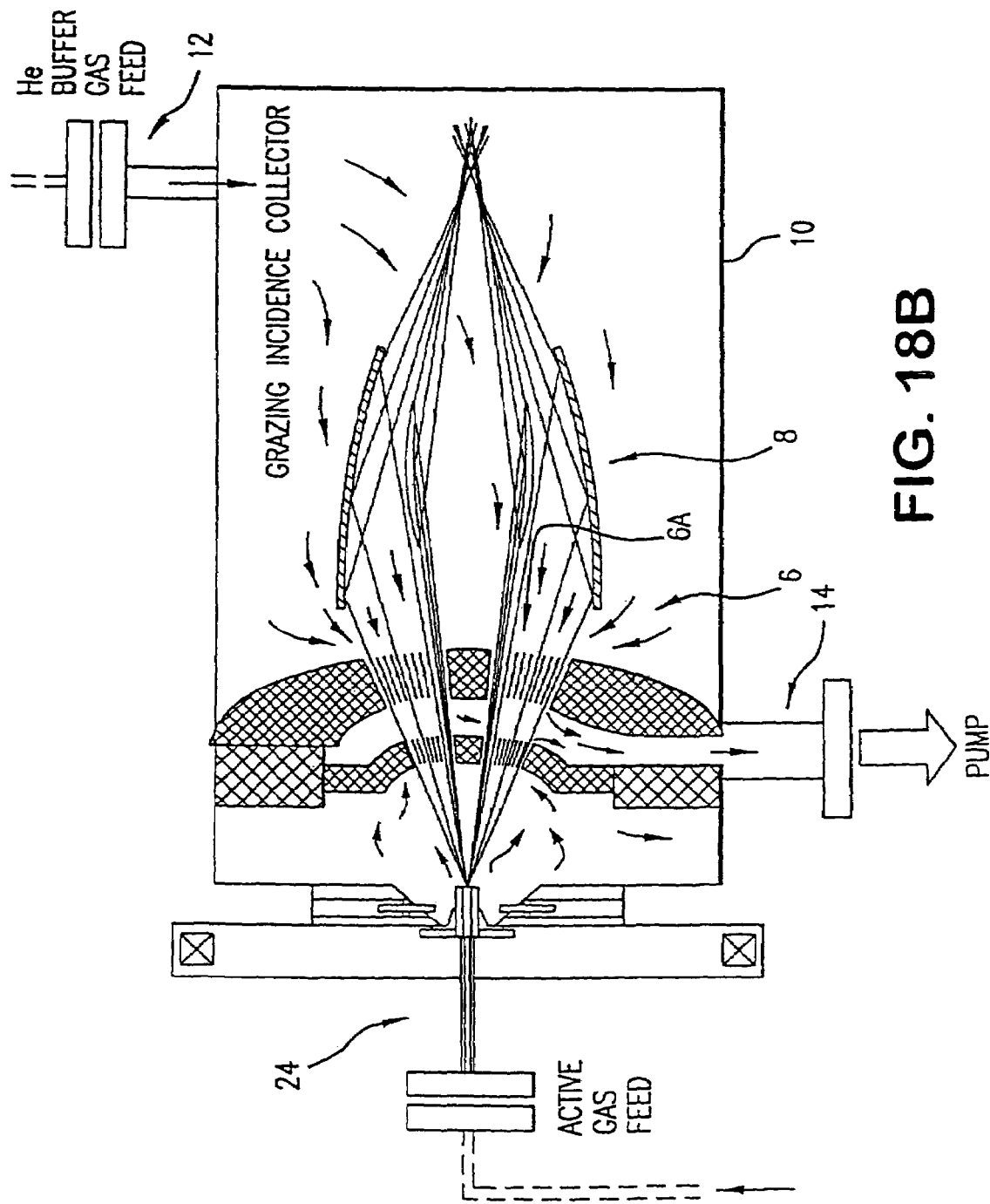

FIG. 18B shows features of an embodiment of the present invention in which two directional gas flow is utilized to permit a controlled concentration of active gas near the pinch region with minimum concentration of active gas in the downstream portion of the EUV beam path. In this case the active gas is introduced through the center of anode 18A as shown at 24 FIG. 18B. In this preferred embodiment, the introduced gas is a $1/15$ to $14/15$ mixture of xenon and helium. Helium is also introduced at 12 as in the above embodiment. The introduced gas from both sources is exhausted at 14 with a vacuum pump of the type described above. Gas flows are controlled to produce a pressure of about 0.75 torr in the pinch region and a pressure of about 1 torr in the collector-director region so that gas flow from the collector director region is much greater than the flow from the pinch region.

Upstream Injection of Active Gas

Figure 18C:
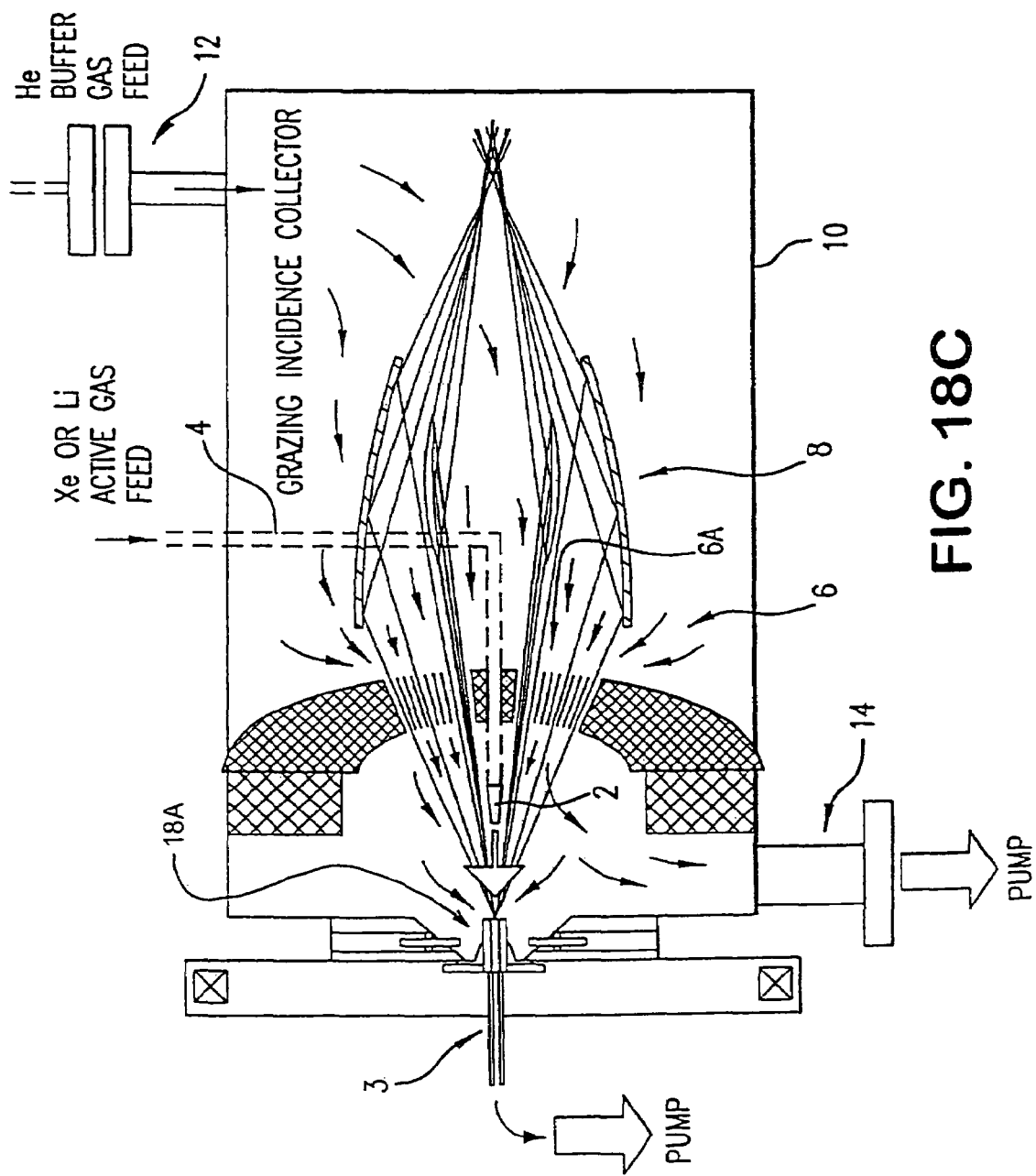

FIG. 18C shows another preferred technique for controlling debris and the active gas and minimizing EUV absorption by the active gas. Gas pressure in the pinch region is about 0.5 torr. In this embodiment, gas flows within vacuum chamber 10 are arranged to help deter debris from the pinch region from reaching the region of collector director unit 8 and to minimize the quantity of active gas in the region beyond the immediate volume surrounding the pinch region. The active gas which could be, for example, xenon is injected about 3 centimeters upstream of the pinch region through nozzle 2 at a rate of about 5 SCCM and almost all of it is exhausted via a exhaust port 3 running through electrode 18A along its axis at a pumping speed of 50 liter/second. The exhaust flow is provided by a vacuum pump such as design blower backed by an Anect Iwata ISP-500 scroll pump available from Synergy Vacuum a Canadian company. This provides a pump speed of 40 liters per second. The xenon is fed into nozzle 2 through gas pipe 4 running through the central region of debris catcher 6. Debris catcher 6 is comprised of nested conical sections at 6A having surfaces aligned with light rays extending out from the center of the pinch site and directed toward collector director 8. These nested conical sections provide a relatively unobstructed passageway for EUV photons produced in the pinch which are directed toward collector director 8. The passageways are narrow and about 10 cm long.

Debris collector 6 collects (by condensation) tungsten vaporized from tungsten electrode 18A. (If the active gas is lithium vapor, the vapor will also condense on the surfaces of debris collector 6.)

Buffer gas which in this embodiment is helium is injected downstream of collector director 8 as shown at 12 and most of the buffer gas is exhausted from vacuum chamber 10 through exhaust port 14 by a vacuum pump (not shown) of the type described above. About 90 percent of the helium flow passes through collector director 8 in the direction toward the pinch region and all of the buffer gas passes through the nested conical section region 6A. As in the above example, this gas flow helps deter debris produced in the pinch region from reaching director-collector 8 and also minimizes the amount of active gas in the path of the light being collected and directed by collector-director 8 to produce the output EUV beam. These features are important because any debris accumulation on the surfaces of debris collector 8 reduces its reflectivity and active gas in the EUV beam path will attenuate the beam.

Gas exhausted through port 3 is preferably filtered and exhausted to the atmosphere. Gas exhausted through port 14 may also be exhausted to the atmosphere without excessive gas cost since total helium gas flow in this system is only about 16 grams per hour. Alternatively, the helium and/or the active gas may be separated and recirculated.

Lithium As Active Gas

Lithium vapor may more efficiently convert the pinch energy into useful light at the desired wavelength range. Lithium is a solid at room temperature and a liquid between the temperature of 180° C. and 1342° C. Many methods are available to introduce lithium vapor into the discharge and pinch regions. Lithium can be heated to its vapor temperature and introduced as a vapor. It could be introduced as a solid or liquid and vaporized by the discharge or the pinch or it could be vaporized with other forms of energy such as a high power laser pulse or by some other form of heating such as a resistance heating element, an electric discharge or rf heating. Lithium can also be introduced as a compound such as $Li_2O$, LiH, LiOH, LiCl, $Li_2CO_3$, LiF, $CH_3OLi$ or their solutions in water or other liquid.

Figure 18D:
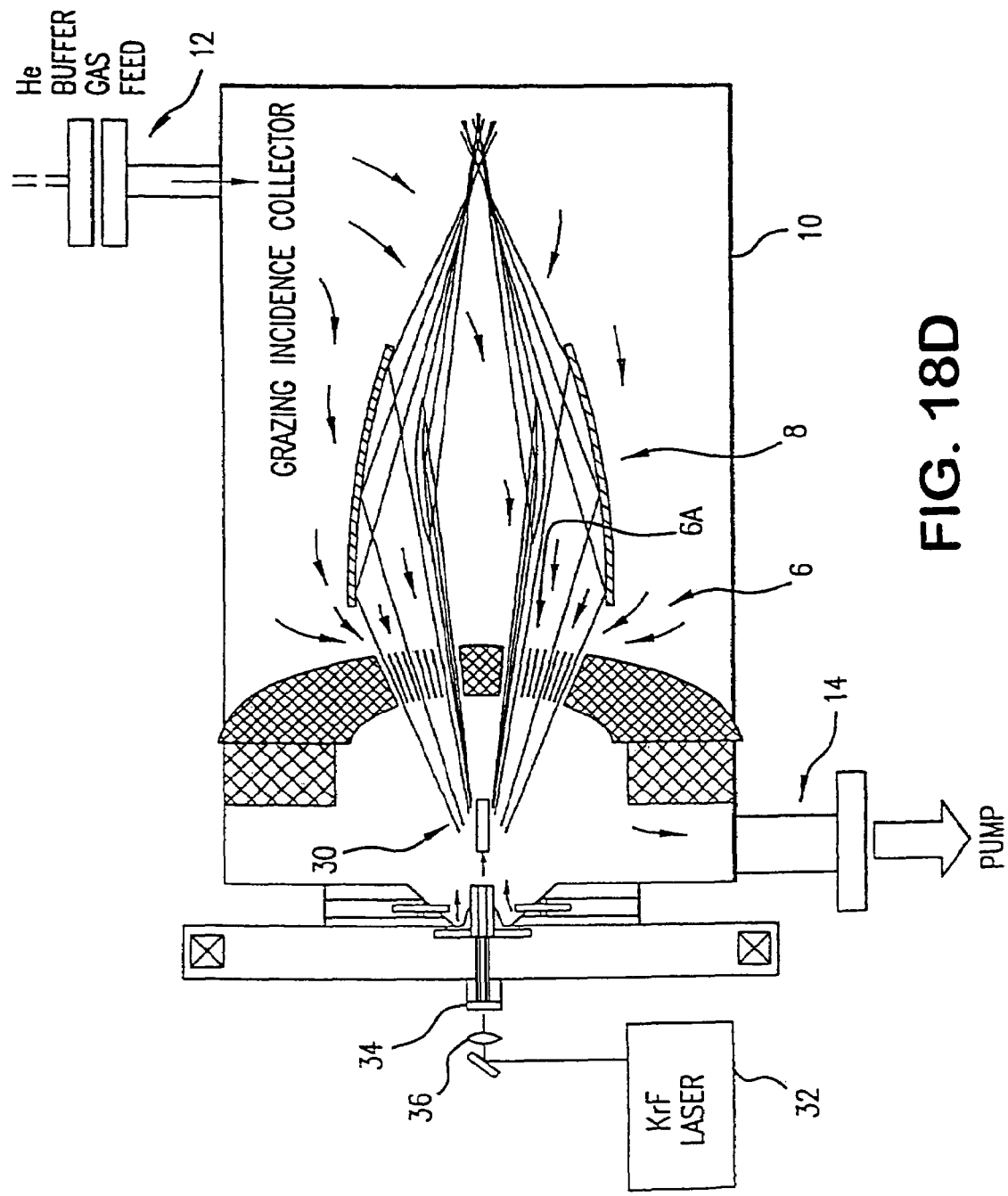

Lithium may also be delivered to the pinch region by means of laser induced evaporation or ablation. Lithium metal target 30 will be attached to a holder mounted from the central disk in the debris collector as shown in FIG. 18D. In one preferred example, a KrF excimer laser 32 produces a pulsed laser beam of 248 nm wavelength and energy of 100 mJ to 200 mJ per pulse, with effective pulse length of 50 ns is passed through a window 34 mounted on the upstream side of the anode. The light will pass through the hollow anode and be focused by means of a lens 36 mounted external to the vacuum chamber to a spot of approximately 1 mm in diameter. This laser intensity and spot size is sufficient to heat the Li metal at such a high rate that the temperature rise is dominated by the latent heat of vaporization. The threshold power density required is about $5 \times 10^7$ W/cm$^2$. At lower power Li can also be evaporated at a rate governed by its vapor pressure at a given temperature.

Figure 17:
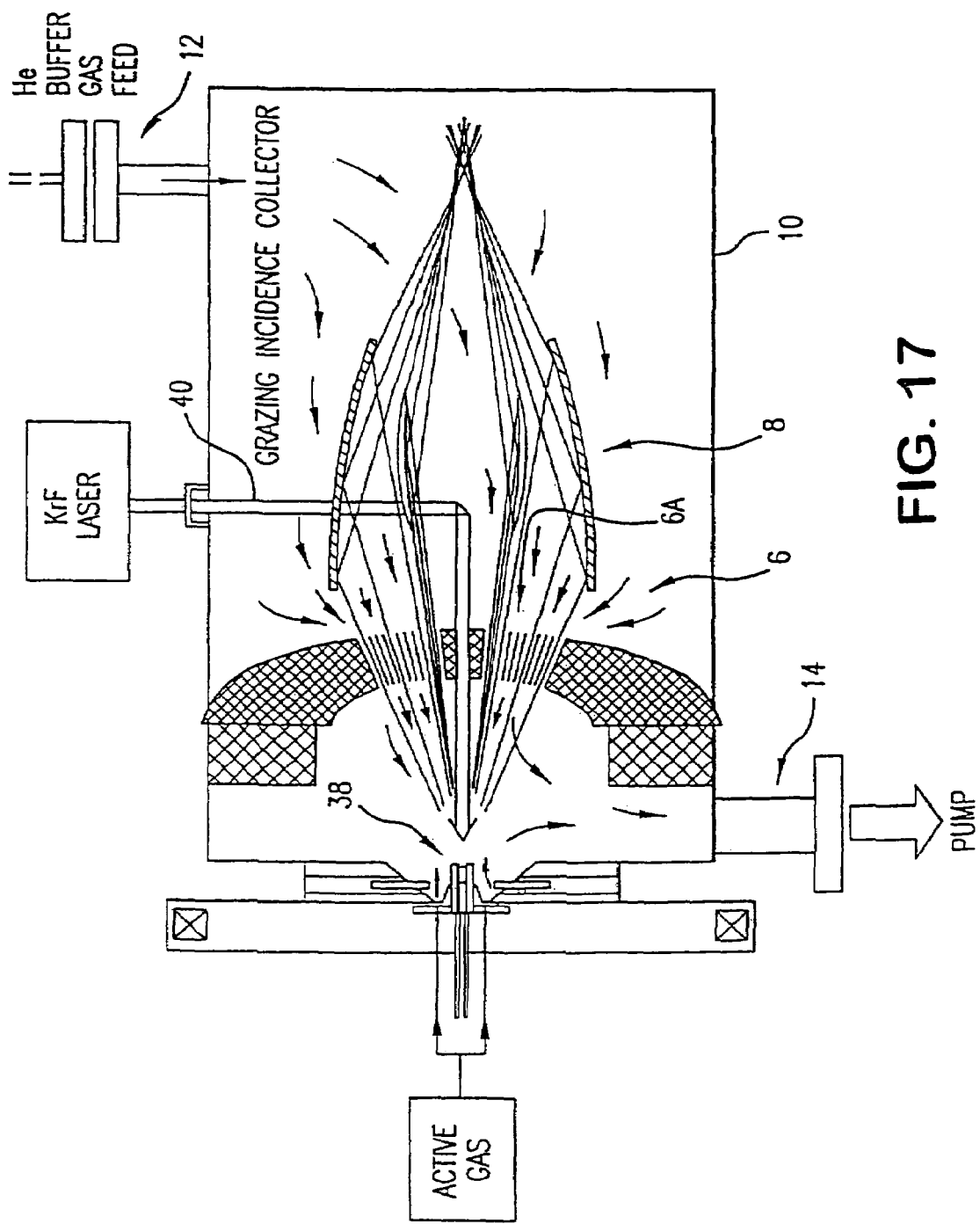
FIG. 17 shows gas control techniques.

In an alternative embodiment the central region of the central electrode as shown in FIG. 18A is packed with Li metal as shown at 38 in FIG. 17 and the laser beam is passed through the center of the debris shield 8 as shown at 40 in FIG. 17.

In another technique by which we can deliver Li to the pinch region is to attach the Li metal to a tungsten plate which is in turn mounted on a housing containing a permanent magnet. This arrangement is mounted on an insulating shaft from the debris collector. Li metal is further covered with a tungsten mask to expose only a small region of Li. A radio frequency produced plasma is generated in the region in front of the Li target by means of an RF generator operating at a frequency of 500 MHz to 2.45 GHz. The discharge may be operated in either pulsed or CW mode. In pulsed mode, the discharge will be synchronized with the plasma pinch. An RF power of 5000 W is generally sufficient.

The generated plasma will be composed of the buffer gas, generally He. He ions will be extracted from the plasma by application of a negative bias voltage onto the Li target. A bias of 500 V to 2000 V will be sufficient. He+ ions striking the Li will sputter Li atoms from the surface. Sputter yields over the bias energies mentioned vary from approximately 0.2 to 0.3 for normal incidence. Significantly higher yields can be expected for grazing incidence and for Li at elevated temperature.

Preionization Improvements

The DPF can be preionized with a variety of different techniques each of which have a beneficial effect on EUV output. The technique originally used in Cymer DPF is based on driving a set of spark plug type pins 138 mounted in the outer electrode of the device as shown in FIG. 2A(2). These pins can be driven by a high voltage pulse such as the RF simulator, or by the unipolar output of the 6000 series commutator. The voltage required to initiate breakdown using the RF simulator or commutator is +/−20 kV. Applicants have also demonstrated that the preionization source can be located remote from the cathode but inside the main vacuum vessel. This is a coiled antenna. Applicants have also successfully used a straight antenna for preionization.

This type of antenna can be either linear or shaped in the form of helical coil. The antenna can be driven either by an RF simulator delivering high voltage (such as about) pulses at 13 MHz for 2 μs, the commutator delivering either a positive or negative polarity pulse or by an RF amplifier. We have demonstrated to support (10 kHz pulse repetition rate). External preionization (antenna located outside of the anode/cathode region) has been shown to be the desirable mode of preionizing the negative polarity deep plasma focus. With positive polarity DPF somewhat better preionization is achieved with the "internal" antenna shown in FIG. 1 above.

Figure 32:
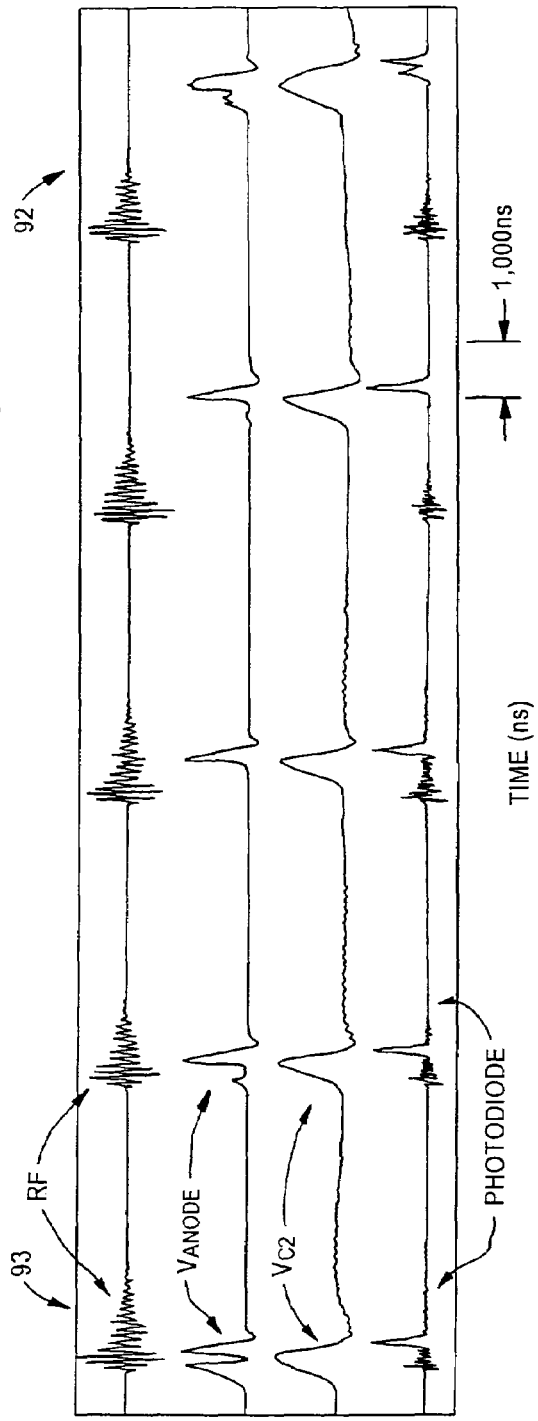
FIG. 32 shows the effects of preionization turning.

FIG. 32 shows that the timing of the preionization pulse must be adjusted relative to the DPF main pulse to achieve optimum effect. If the preionization is too early (as shown at 92) or too late (as shown at 93) the efficiency of the deep plasma focus is adversely affected.

Preionize Injected Gas

Applicants have discovered that gases in metastable states are easier to preionize than stable gas. Gases can be put in metastable states by ionizing them prior to injection into the discharge chamber. For example, FIGS. 2A(4), and 18A-E show gas injection techniques. In each case the injected gas could be placed in a metastable state by a high voltage discharge (such as with 15 kV pulses with durations of a few ns) or by RF preionization. These metastable states last about 50 milliseconds so with a gas flow of about 1 m/sec there will be plenty of metastable atoms if the ionizing discharge is about 5 cm upstream of the origin of the pinch discharge.

Another technique useful when xenon is the active gas is to install an RF coil around the xenon inlet to the discharge region. Applicants propose an RF frequency of 2 MHz to 2.5 MHz which causes a breakdown of the xenon gas in the inlet pipe. Alternatively, a high voltage pulsed discharge in the xenon inlet pipe could be used. In a preferred embodiment a magnetic field is applied to direct xenon ions so generated to specific locations the pinch discharge is initiated.

Nozzle Assisted Preionization

Figure 31:
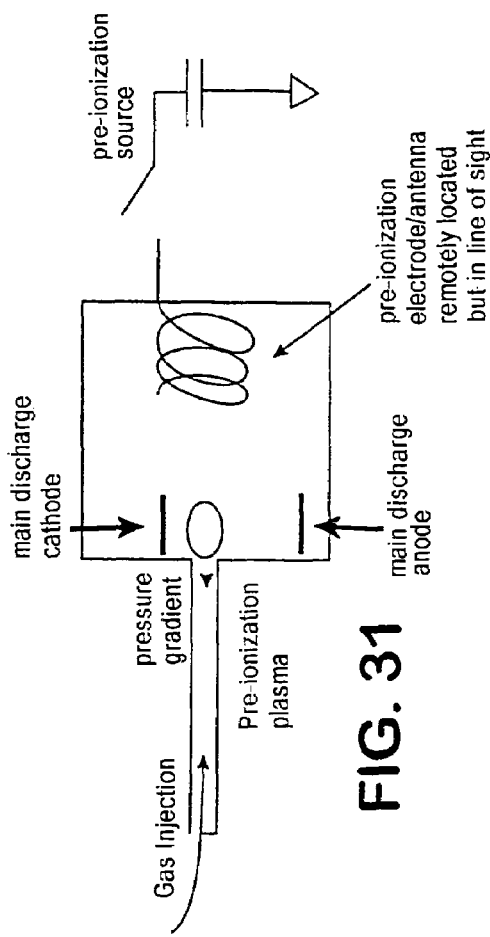
FIG. 31 shows a preionization technique.

The pressure for best production of EUV light in Applicants fourth generation devices is in the range of about 100 mTorr or less. This pressure the discharge puts us on the left side of the Paschen breakdown curve so that very high voltages are required for breakdown to produce ionization. Ionization is much easier at higher pressures. A solution, consistent with the techniques described in the previous section, is to produce the preionization in the nozzle used to inject either the buffer or active gas into the discharge chamber. Techniques for producing ions in the inject pipe are discussed above. Another technique is to direct ionizing radiation to the injection nozzle from inside the chamber as shown in FIG. 31. This radiation is preferably discharge produced UV light or x-radiation.

Hydrogen as Buffer Gas

Applicants have discovered that EUV optics in its prototype devices become contaminated with carbon deposition. A 1 nm layer of carbon can cause a 1% relative reflective loss on multi-layer optics and more (up to about 10% for grazing incident optics). One known technique is to add oxygen to the buffer gas to react with the carbon to produce CO and $CO_2$. However, oxygen can also react with the optics producing oxide which degrades the optics.

Applicants propose to add hydrogen to the buffer gas preferably about 20% to 50%. The hydrogen does not absorb at 13.5 nm, it etches carbon and it also reacts with oxygen. Also, the hydrogen could added only periodically for short time periods as a part of maintenance program to clean the optics and removed after the optics are cleaned.

Optimization Techniques

Optimizing Capacitance

Applicants have discovered that the highest plasma temperature exists when the plasma pinch event occurs simultaneous with the peak of the current flow from the drive capacitor bank. For a given anode configuration and buffer gas density, the plasma front will travel down the length of the anode in a given amount of time for a given amount of charge voltage. Maximum emission efficiency is obtained by adjusting the capacitance value and charge voltage such that the peak capacitor current exists during the plasma pinch event.

If a higher input energy level is desired and thus a higher charge voltage, then the drive capacitance must be reduced so that the timing of the drive waveshape matches the plasma run down time along the length of the anode. Since energy stored on a capacitor scales as the square of voltage and linearly with capacitance, the stored energy will increase linearly with voltage as one decreases capacitance proportional with increases in voltage.

Figure 13:
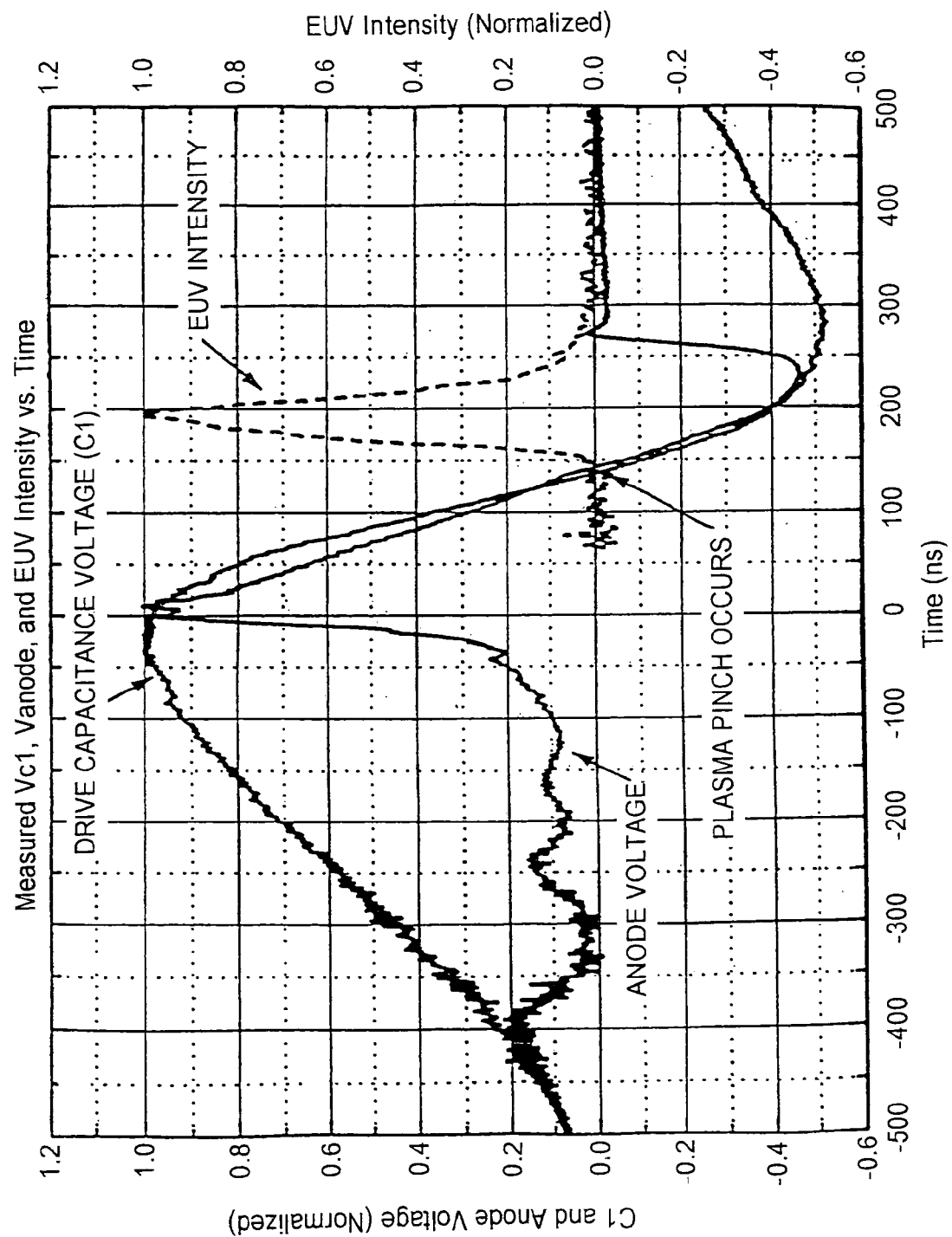
FIG. 13 is a time chart showing the anode voltage and EUV intensity.

FIG. 13 is a drawing showing the measured drive capacitance voltage, the measured anode voltage and the EUV intensity versus time for a preferred embodiment with the capacitance properly chosen to produce maximum capacitor current during the pinch. In this case, for a 2 cm long anode, a He buffer gas pressure of 2.5 Torr and a $C_1$ capacitance of 3 μF.

Optimum Shape of Central Electrode

Applicants have discovered with hollow anode configurations, that the plasma pinch grows rapidly along the axis once the pinch has been formed, and will extend down the opening in the hollow anode. As this pinch grows in length, it eventually drops too much voltage along its length and an arc-over occurs across the surface of the anode. One solution to prevent this arc-over makes use of a blast shield to provide a physical barrier to the growth of the pinch length extending away from the anode as described above. Another solution, to reduce the rate of pinch length growth down into the hollow anode, is to increase the open diameter inside the anode narrow region as shown in FIGS. 14C and 14D(1). This slows the growth of the pinch length and prevent arc-over. All previous literature shows a hollow anode with a constant dimension hollow portion. FIGS. 14A, 14B, 14C and 14D show examples of pinch shapes for various hollow anode shapes. The configuration shown in FIG. 14D shows the shortest pinch shape.

Exposed Length of Central Electrode

Since the plasma run down time determines where on the drive voltage waveshape the pinch occurs, Applicants have been able to adjust the duration of the pinch portion of the plasma focus device by changing the amount of exposed anode and thus the duration of the rundown. The buffer gas density is dictated by a desired plasma pinch diameter, and the drive capacitance is in practice limited to within a certain range. These two parameters, combined with the drive voltage determine the desired run down time. The run down time can then be adjusted by increasing or decreasing the length of exposed anode. Preferably, the run down time is chosen such that the plasma pinch event occurs during the peak in the drive current waveshape. If a longer plasma pinch duration is desired then the exposed length of the anode can be reduced, thus shortening the run down time and causing the plasma pinch to occur earlier in the drive waveshape.

RF Powered Vapor Production

Metal vapor delivery schemes described above depend on raising the anode temperature sufficiently high that the vapor pressure of metal reached a desired level. Such temperatures are in the range of 1000-1300° C. for lithium and 2,260° C. for tin.

An alternative is to fabricate an RF antenna from a material such as porous Tungsten infiltrated with Lithium. This porous Lithium filled Tungsten antenna 50 is placed down inside the anode as shown in FIG. 15. RF power source 52 creates a plasma-layer on and near the antenna will drive off atoms that are swept up by the gas flow 54 through the center of the hollow anode and the Lithium atoms carried to the end of the anode. The rate of metal ion production is easily controlled by the power level of the RF source. In addition, the porous Tungsten anode can be maintained with this RF drive at a temperature sufficient for liquid metal to wick up from a reservoir 56 placed at the bottom of the anode.

Electrode Cooling

Cooling of Central Electrode

In preferred embodiments of the present invention the central anode has an outside diameter in the range of about 0.5 cm to 1.25 cm. The central electrode absorbs substantial energy due to the plasma fall during discharge and due to absorption of radiation from the plasma pinch. Cooling in the range of about 15 kw or more may be required. Because the gas pressure are very low there cannot be much cooling due to con-vection through the buffer gas. Radiation cooling could only be effective at very high anode temperatures. Conduction down the anode length would require a very large temperature drop.

Heat Pipe

If lithium vapor is used as an active gas and is injected through the center of the anode the anode temperature may need to be maintained at temperatures in the range of 1,000° C. to 1,300° C. or higher. This high temperature of operation, substantial heat removal requirement, envelope considerations and the high voltage limit the choices of cooling technique. One technology, however, a lithium (or other alkali metal) heat pipe, offers the potential for a relatively simple and robust solution. Lithium heat pipes begin to operate efficiently at temperatures about 1000° C. The specific design of such devices typically use refractory metals, molybdenum and tungsten, for the casing and internal wick and can therefore operate at very high temperatures.

The simplest embodiment would take the form of a tubular or annular heat pipe that is integral with the anode of the DPF for best thermal coupling. A likely embodiment would be annular to enable the delivery of liquid or vaporized lithium to the plasma of the DPF. By way of an example, an 0.5 inch diameter solid heat pipe removing 15 kW would have a watt density of 75 kW/in$^2$ (11.8 kW/cm$^2$). An annular heat pipe having an OD of 1.0 inch and an ID of 0.5 inch removing 15 kW of heat would have a watt density of 25.4 kW/in$^2$ (3.9 kW/cm$^2$). Both of these examples illustrate the potential of this technology since watt densities far in excess of 15 kW/cm$^2$ have been demonstrated with lithium heat pipes. In operation, heat pipes have only a very small temperature gradient along their length and can be considered as having constant temperature with length for practical purposes. Therefore, the "cold" (condenser) end of the heat pipe will also be at some temperature at or above 1000° C. To remove heat from the condenser end of the heat pipe a preferred embodiment may utilize radiative cooling to a liquid coolant (such as water) jacket. Radiative heat transfer scales as the fourth power of temperature, therefore, high rates of heat transfer will be possible at the proposed operating temperatures. The heat pipe would be surrounded by an annular water heat exchanger capable of steady state operation at 15 kW. Other embodiments may insulate the condenser end of the heat pipe with another material such as stainless steel and cool the outer surface of that material with a liquid coolant. Whatever technique is used, it is important that the heat pipe is not "shocked" with a coolant at the condenser, i.e., forced to be much cooler than the evaporator end. This can seriously impact performance. Also if the heat pipe temperature falls below the freezing temperature of the working fluid at any point along its length (~180° C. for lithium) it will not work at all.

Restrictions to the operating temperature of components near the base of the central electrode (anode) may require that heat transferred to this region be minimized. This condition may be accomplished, for example, by coating the exterior of the heat pipe with a low emissivity material near the region of lower temperature tolerance. A vacuum gap can then be fabricated between the heat pipe and the desired lower temperature components. Since vacuum has very low thermal conductivity and the heat pipe is coated with a low emissivity material, minimal heat transfer will occur between the heat pipe and the cooler components. Maintaining a controlled anode temperature under varying power load levels is another consideration. This may be accomplished by placing a cylinder between the heat pipe and the water cooled outer jacket. This cylinder would be coated or finished for high reflectivity on its inner diameter and for low emissivity on its outer diameter. If the cylinder is fully inserted between the radiating heat pipe and the water cooling jacket, radiation will be reflected back toward the heat pipe thus reducing the power flow from heat pipe to jacket. As the "restrictor" cylinder is extracted a greater proportion of the heat pipe's condenser can radiate directly onto the water jacket heat exchanger. Adjustment of the "restrictor" position thus controls the power flow which sets the steady state operating temperature of the heat pipe, and ultimately the anode.

Figure 16:
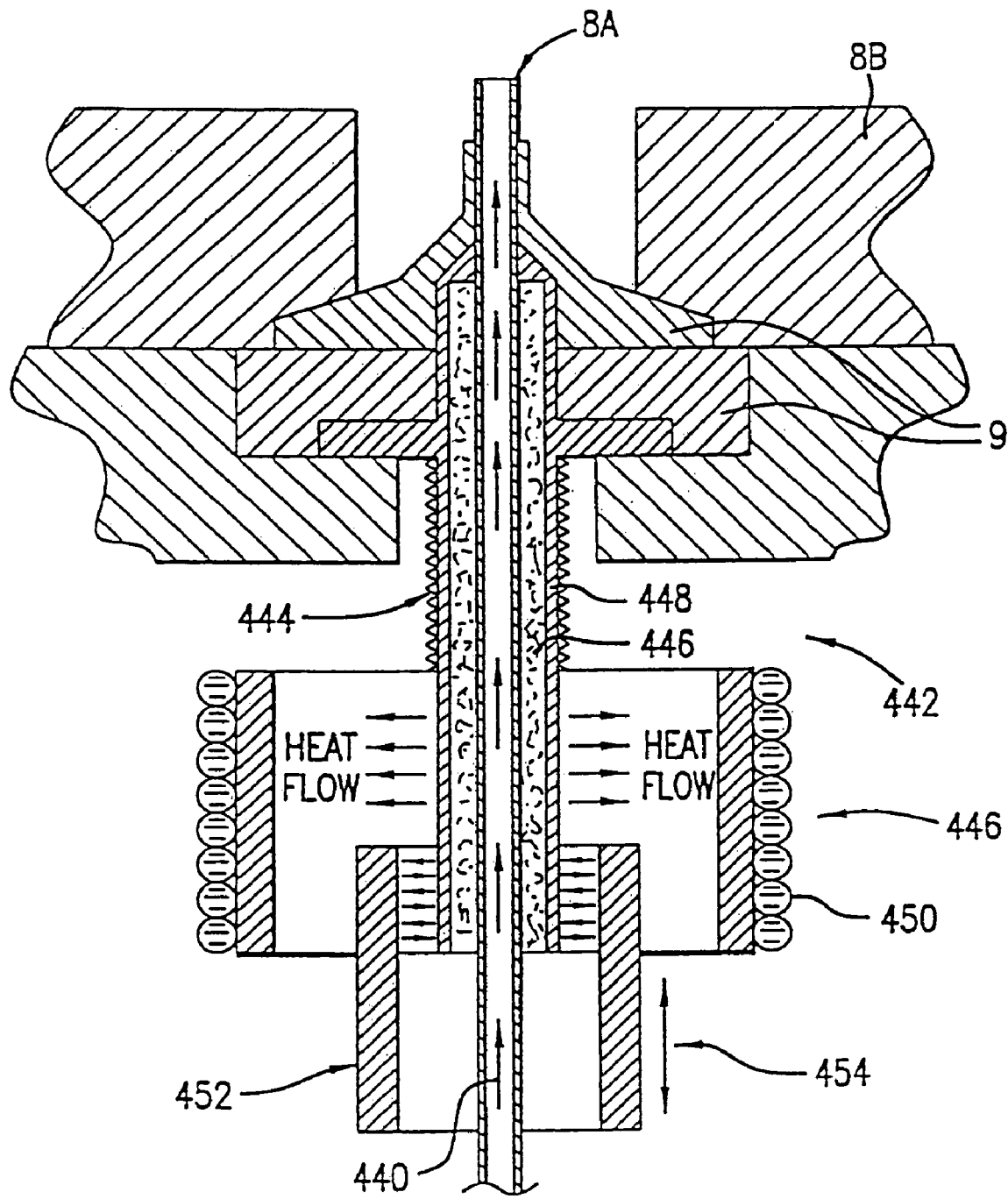
FIG. 16 shows a heat pipe cooling technique for the anode in a preferred DPF device.

A preferred embodiment using heat pipe cooling is shown in FIG. 16 shown in the drawing are anode 8A, cathode 8B, and insulator element 9. In this case, lithium vapor is used as the active gas and is delivered into the discharge chamber through the center of anode 8A as shown at 440. Anode 8A is cooled with lithium heat pipe system 442 comprising lithium heat pipe 444. Lithium within the heat transfer region 446 of heat pipe 444 vaporizer near the hot end of the electrode 8A and the vapor flows toward the cooler end of the heat pipe where heat is transferred from the heat pipe by radiative cooling to a heat sink unit 446 having a heat sink surface 448 cooled by water coil 450. The cooling of the lithium vapor causes a change in its state to liquid and the liquid is wicked back to the hot end in accordance with well known heat pipe technology. In the embodiment a restrictor cylinder 452 slides up and down as shown at 454 inside heat sink surface 448 based on a drive which is part of a temperature feedback control unit not shown. The anode heat pipe unit also preferably comprises an auxiliary heating system for maintaining the lithium at temperatures in excess of its freezing point when the plasma pinch device is not producing sufficient heat.

Water Cooling of Central Electrode

Another preferred method of cooling the central electrode is shown in FIGS. 20, 20A, 21 and 22. In this case water under pressure is circulated through the central electrode. Central electrode 8A as shown in FIG. 20C is comprised of two parts, a discharge portion 8A1 comprised of single crystal tungsten (available from Mateck GMBH, Fuelich, Germany and lower part 8A comprised of sintered tungsten. The outer electrode 8B is made in two parts, a lid 8B1 and a base 8B2, both comprised of an oxide hardened copper material sold under the tradename Glidcop. The oxide material is alumina. The outer electrode is made in two parts to provide water passages 460 for cooling the outer electrode. The electrodes are insulated from each other by main insulator 462 comprised of boron nitride or silicon carbide, a layer 464 of alumina deposited on stainless steel base 8A3 and a polymide 466 (preferably Kapton as available from Dupont). The water path through the central electrode is shown by arrows 468 in FIG. 20C. Cylindrically shaped stainless steel partition 470 separate the supply and return flow in the electrodes. Parts 8A1, 8A2 and 8A3 are braised together using a gold/nickel or gold/copper braze material such as Niord or 50 An-50 c.

Plasma Pinch with Radial Run-Down

Figure 21:
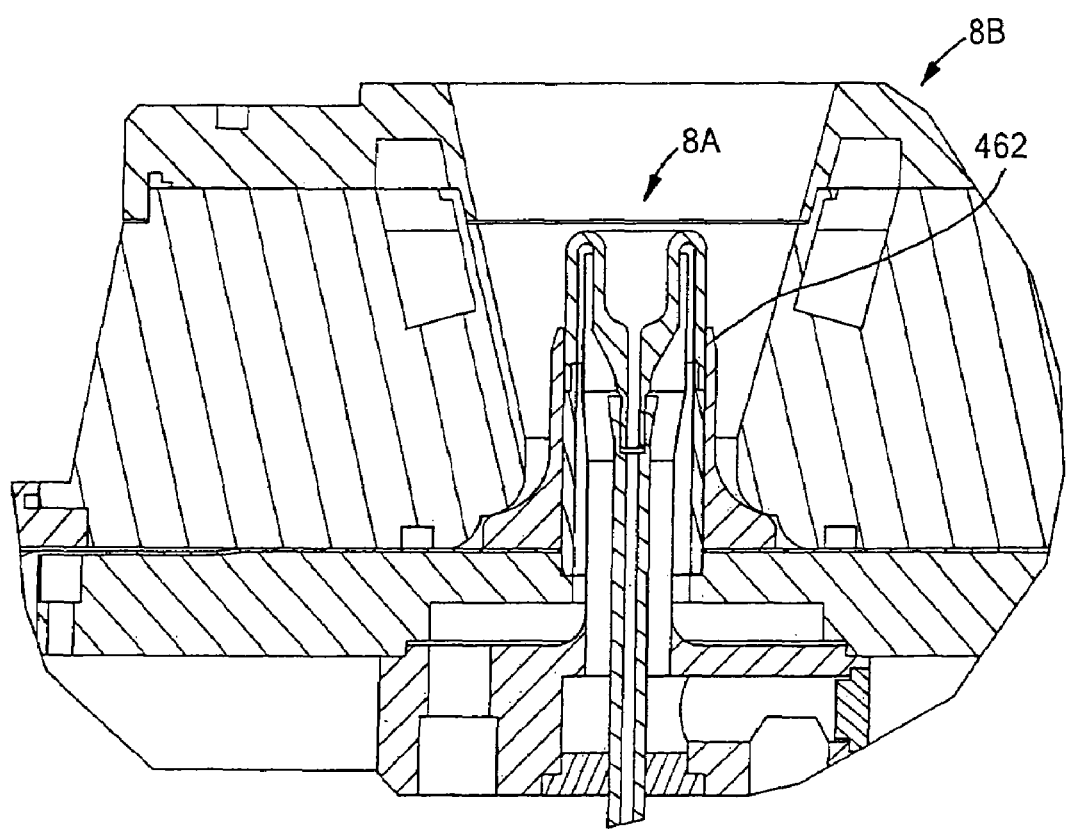
Figure 22:
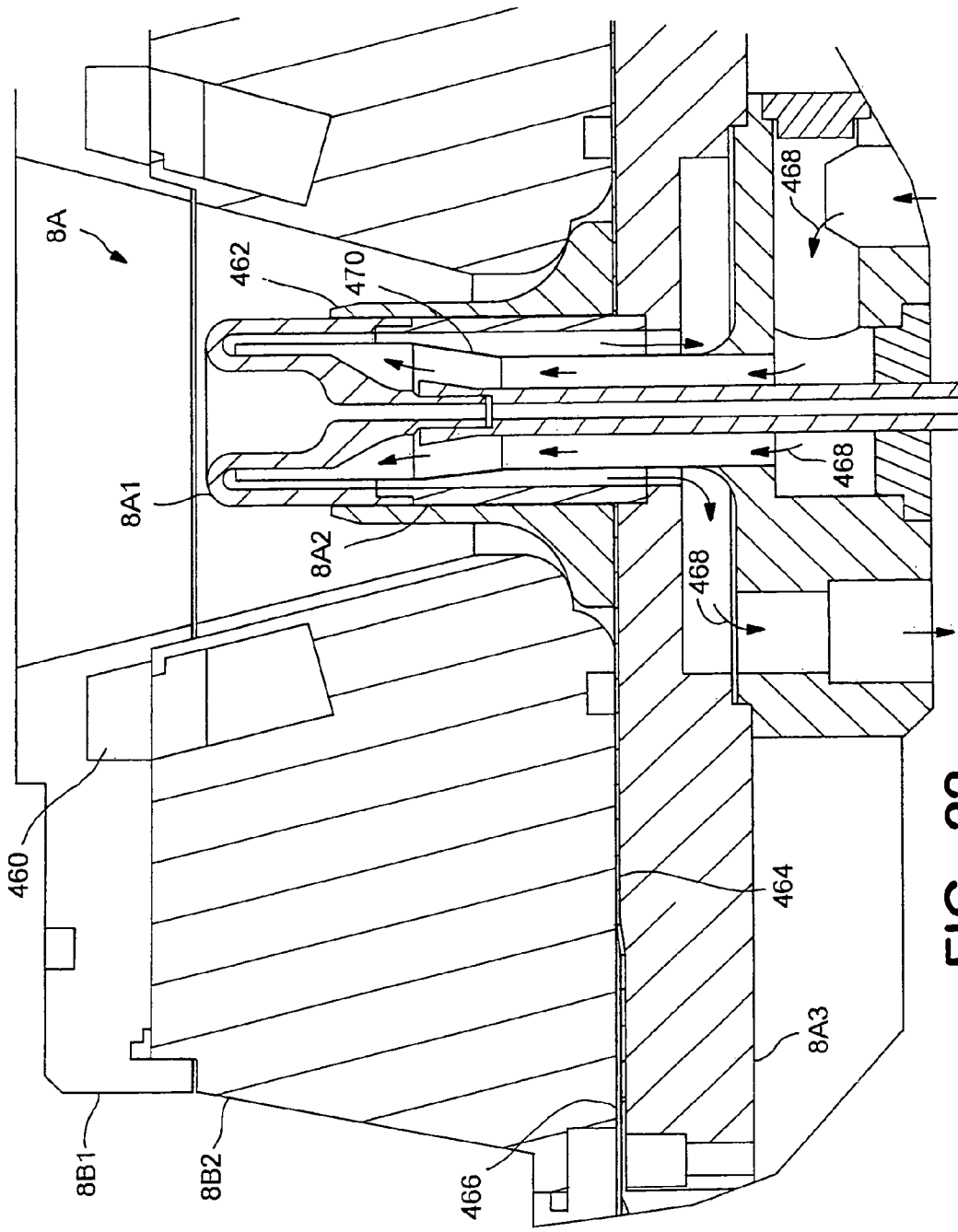

Preferred embodiments of the present invention utilizes the pulse power features, the radiation collection features and the debris control features described above with any of the electrode arrangement as described in FIGS. 2A, 2B, 2C and 2D. This electrode arrangement provides advantages and disadvantages as compared to electrode configuration such as that shown in FIG. 21. The electrodes have greater surface area so that thermal problems may be minimized. There also could be less filamentations of the discharge and perhaps better plasma confinement and possibly better radial stability. Applicants believe they can design the electrodes to produce pinches along the axis of the electrodes as shown in FIG. 21.

Use of Multiple EUV Sources

As indicated above a preferred application of the present invention in for lithography light sources for future machines, at least the production versions, have not yet been designed and built. It is possible that illumination power may exceed the illumination power that can be conveniently produced by a single EUV source source utilizing the technology described herein. In this case two or more EUV sources could be combined to provide the illumination needed. Preferably the light from each of the sources would be collected using techniques similar to those described herein and projected on a single slit which would be the source for the lithography equipment.

Integration with Litho Machine

In preferred embodiments portions of the EUV light source unit is integrated directly into a lithography unit such as a stepper machine as shown in FIG. 2A(21). The integrated parts may include the commentator and the compression head of the solid state pulse power unit and the vacuum vessel which includes the electrode set, debris shield and radiation collectors and turbo-molecular vacuum pumps all as shown at 120 in FIG. 2A(21). Support equipment (including electronic controls, high voltage power supply, resonant charger, power distribution system and fluid management for cooling water and gas control) are located in a support equipment cabinet separate from the lithography unit (which could be in a separate room if desired) all as shown at 122. Rough vacuum pumps and high pressure water pumps are located in a third cabinet 124 which also could be in the separate room, in lithography unit 126 are illumination optics, reticle, reduction optics and wafer handling equipment.

Electrode Erosion

Minimizing Erosion

Applicants' experiments with their early prototype EUV device show that electrode erosion is a serious issue and Applicants have developed several techniques for dealing with this issue. Applicants have discovered through experiments with their fourth generation plasma pinch device that the inductance in the discharge circuit increases dramatically at the time the pinch occurs greatly reducing the current flow and producing an increasing electric field between the electrodes. As a consequence a second breakdown occurs between the anode and the cathode generally near the tip of the anode as shown in FIG. 2A(2). This produces erosion at the location of the breakdown. Applicants propose to minimize this problem by providing a means for promoting their post pinch discharge at a location where erosion is not a problem. One technique to inject a plasma containing gas in lower region between the electrodes to produce the post pinch in this lower location far away from the anode tip.

Sputter Replacement of Material Eroded from Anode

Figure 25:
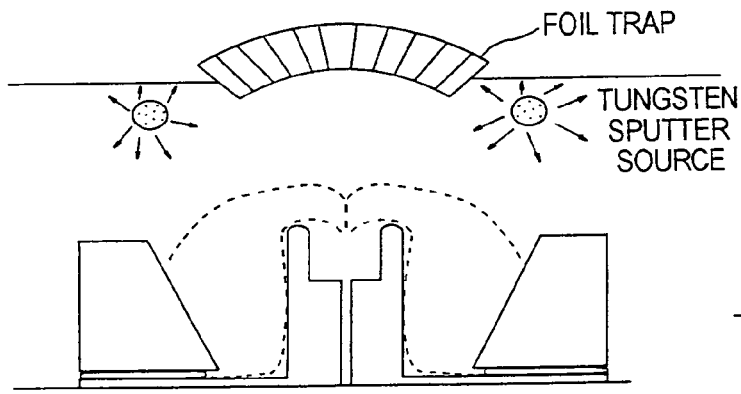

Applicants' experiments with its fourth generation device have shown substantial anode erosion with long-term operation. As indicated above the principal expected use of these plasma pinch devices is for integrated circuit production. This means the device must operate substantially continuously for many days or weeks between maintenance down times. Therefore, techniques must be found for increasing electrode lifetimes. A potential technique is to provide a sputter source for sputtering electrode material onto one or both of the electrodes. FIG. 25 is a sketch showing two-tungsten sputter sources for providing sputtered tungsten to replace electrode erosion. Applicants discovered that short pulse high voltage driven electrodes used for preionization was producing sputter ions which collected on the sides of the anode and on the cathode. The side of the anode is also the location of most of the electrode erosion. Therefore, Applicants propose to provide sacrificial electrodes of the same material as the anode and cathode specifically designed to erode by sputtering. These sacrificial electrodes will be positioned so that sputtered electrode material is directed to regions of the anode and/or cathode suffering worse erosion. Preferably the sacrificial electrodes are designed so that they can be easily replaced or periodically extended into the discharge chamber as the erode. Some of the sputtered material will collect on insulator surfaces, but Applicants have leaned that sputtered tungsten deposited on insulator surfaces in these devices is not a problem.

Insulator Covered Electrodes

Applicants have discovered in actual experiments that center electrode erosion can be greatly reduced by covering the side wall of the center electrode with insulator material.

By covering with insulator material portions of the electrode which would otherwise face high current densities, the post pinch discharge current is forced to spread out over a larger area in a different region of the electrode. This technique can be employed to reduce the current density in the area of electron or ion impact on the anode or cathode, respectively. The reduced erosion rate leads to reduced debris generation and longer electrode lifetime. There is still some erosion and debris from the sliding discharge across the insulator, but it is not so severe as the electrode erosion. The so-called "flash-over arcing" which leads to high erosion rates occurs only on conductive surfaces. It can therefore be eliminated in regions where the electrode is covered by the insulator.

Thus, a preferred embodiment is a dense plasma focus with the usual anode and cathode configuration, but without a sliding discharge along the outer diameter of the inner electrode (run-down length). Instead, the inner electrode is covered by a long insulator tube which protrudes, i.e., the diameter of the inner electrode is eliminated. Even thought the effective inductance is slightly increased, an intense pinch still occurs on the axis leading to EUV generation. In contract to conventional dense plasma focus devices, there is no run-down occurring along the inner electrode. The inner surface of the inner electrode may also be covered with insulator material to eliminate flash-over arcing in this region. This insulator has to have the appropriate inner diameter in order not to reduce the pinch size and EUV output.

Preferred embodiments are in FIGS. 26A and 26B. In FIG. 26A insulator 60 covers the outside surface and in the FIG. 26B embodiment insulator 62 covers the inside surface in addition to insulator 60 on the outside. The anode in both FIGS. is identified at 64 and the cathode at 65.

Pyrolytic Graphite Electrodes

In a preferred embodiment the discharge surface of the anode shown at 8A in FIG. 2A(2) is covered with pyrolytic graphite. The body of the anode is copper or tungsten. An important advantage of this design is that carbon is 15 times lighter than tungsten (the principal prior art anode material). Therefore, the carbon debris is much easier to deal with in a debris shield. Also graphite does not melt; it evaporates. Preferably the graphite should be applied so that the atomic graphite layers are aligned perpendicular to the surface to improve thermal conductivity and to minimize erosion. Preferably an interlayer is applied between the pyrolytic graphite surface material and the substrate electrode material to minimize thermal stresses.

Electrode Replacement

Shutter With Seal

When the plasma focus source components and collector are contained in the same chamber any maintenance of the source requiring venting will have disadvantageous effects on the collector mirrors and also on the debris trap. A separation of these components into two chambers with respect to vacuum should be very beneficial. However, prior art designs with respect to position of debris trap and collection optics just do not provide the space required to accommodate a gate valve between the two chambers.

Applicants have developed techniques for venting the source chamber for maintenance (like electrode replacement) while keeping the collector chamber under (near-) vacuum during this time. The source chamber 69 will require more frequent venting compared to the venting required for the collector chamber 70. The collector mirrors 66 and also the debris trap 68 will be protected when maintenance is carried out on the source by use of the proposed shutter. Therefore the lifetime of the collector (and perhaps also of the debris trap) will be greatly increased. Since a very short distance is required between the pinch source volume 71 and the debris trap and collection optics entrance in present designs, there is usually not enough space available to accommodate a separating gate valve. When the proposed shutter with seal towards the collector chamber is introduced, only very little space is required to accommodate it. The collector chamber can be kept under (near) vacuum, since the shutter will be pressed against the sealing surface by the ambient pressure of the vented source chamber.

Figure 27A:
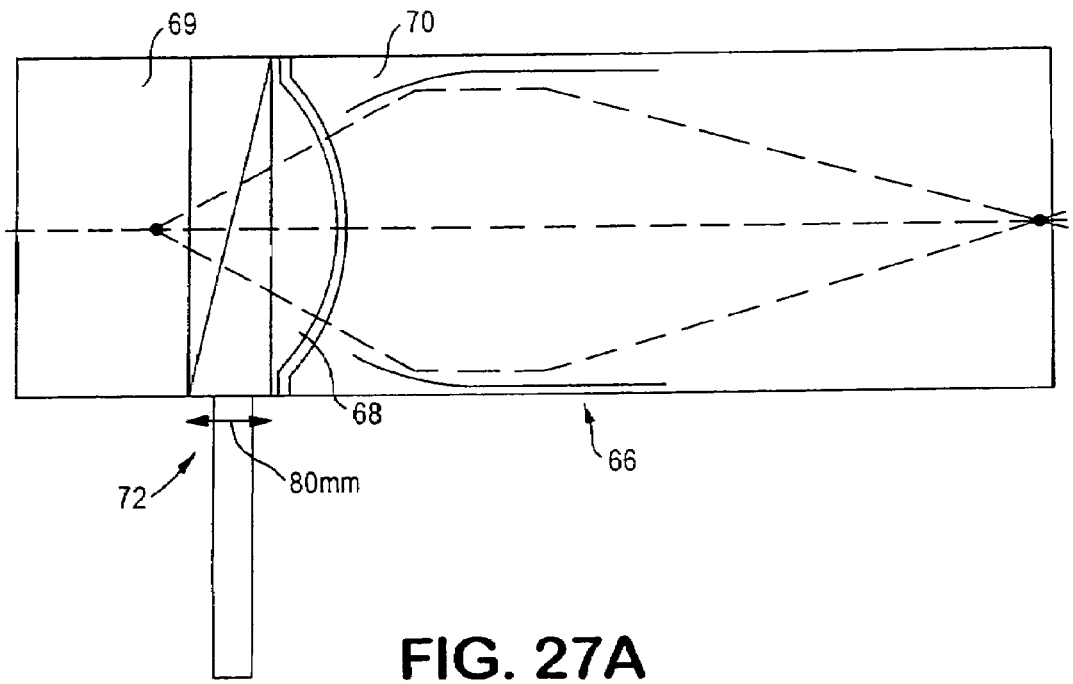
FIGS. 27A and 27B show a maintenance technique.
Figure 27B:
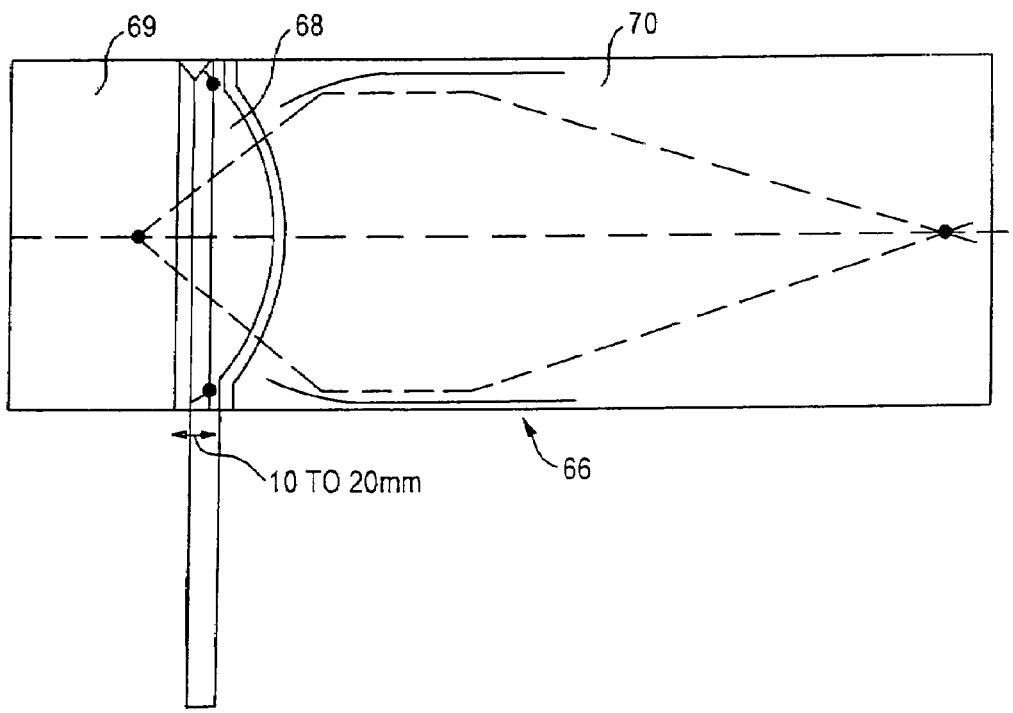

The advantage of the present design is illustrated in FIGS. 27A and 27B. The prior art drawing FIG. 27 shows an arrangement with a gate valve 72 separating the source and collector chambers. However, present designs require a distance of 100 mm or less from the plasma source volume to the entrance of the grazing incidence collector optics and thus usually do not provide enough room to accommodate a gate valve. UHV gate valves from vacuum suppliers like VAT with 8 inch (200 mm) or 10 inch (250 mm) opening diameter have a flange-to-flange distances of 80 to 100 mm. Therefore, such gate valves are omitted in present designs. This has the big disadvantage that each time when venting for maintenance of the source is required, the collector chamber is also vented. Each venting cycle has disadvantageous effects for the very sensitive collector optics. Furthermore, the pump-down time is longer for the collector chamber compared to the source chamber since its vacuum requirements are more severe. If the collector chamber does not need to be vented each time when the source chamber is vented, several advantages exist: The collector optics contamination is reduced and the optics lifetime is increased. The system maintenance down-time is decreased because no pump-down of the collector chamber is required at the end of the maintenance work. The sensitive debris trap is also protected better.

FIG. 27B shows a proposed mechanical shutter 74 with vacuum seal from the source to the collector chamber. The shutter has an o-ring seal on the side facing the collector chamber just like the plate of a gate valve. The space required to accommodate this shutter is only 20 mm or perhaps even only 10 mm. In contrast to a gate valve the shutter can provide a vacuum seal only with respect to collector chamber and not for the source chamber. However, this is sufficient, since in most cases only the source chamber needs to be vented (shutter in closed position as shown in the figure). When the collector chamber needs to be vented, the source chamber can always be vented, as well, without any disadvantages (shutter in open position).

When the shutter is approaching the closed position, it is pressed with its o-ring seal against the sealing surface of the collector chamber by a notch or protrusion near the shutter end position. The sealing surface may be conveniently located on the outer circumference of the debris trap (holder), for instance. At the start of the source chamber venting, the increased pressure in the source chamber will push the shutter further against its sealing surface with a force which will increase with the increase of the pressure in the source chamber. At the beginning of the venting some small leaks may still exist towards the collector chamber, but this can be tolerated. When the source chamber is at high (atmospheric) pressure, the force pushing the shutter against its sealing surface will be so large due to the relatively large shutter area that a high-vacuum seal is established. This is sufficient to protect the collector optics (and debris trap). A (minor) disadvantage is that the sealing shutter has to be integrated into the collector (or source) chamber design (preferentially right next to the connecting vacuum flange). But the major advantage is that the space required for the extra 2 flanges of the gate valve and some of its width can be avoided. Therefore, such a shutter can be accommodated even when the required separation from the source to the debris trap/collector entrance is very small.

Replaceable Electrode Module

Another technique to simplify electrode replacement is to design the EUV device for replacement of the electrode, the debris collector and the first collector as a single module. For example, referring to FIG. 19, collector 42 would a port of a module comprised of anode, cathode and debris collector and collector 42. The system would permit these components to be replaced as a unit in a minimum period of time to reduce maintenance down-time. This results in quick replacement of the electrodes which degrade because of erosion and the debris collector and first collector optics which degrade because of contamination with eroded material.

Example of an Optimized Dense Plasma Focus Device

Optimization Efforts

Applicants have devoted considerable effort to optimize performance of their fourth generation dense plasma focus device shown in cross section in FIG. 2A(1) for efficient generation of EUV radiation. A side view of the system with vacuum chamber is shown in FIG. 2A(3). Performance parameters included in their investigations are He and Xe pressure and flow rates, electrode geometries, pre-ionization characteristics, and duty factor related performance issues. In these investigations Applicants found that the location of the He (buffer gas) and Xe (working gas) gas injection ports as well as the pressures and flow rates of the gas mixture components had a strong impact on EUV emission efficiency. Additional constraints on the gas recipe are also derived from gas absorption of the EUV radiation and the desire to provide debris mitigation properties. Best results to date have been obtained with an axially symmetric buffer gas injection scheme coupled with axial Xe injection through the central electrode. The highest conversion efficiency obtained was 0.42% at 12.4 J of input energy. Measurements of energy stability show a 10% standard deviation at near optimum EUV output. The matching of the drive circuit to the pinch as determined by the damping of the voltage overshoot waveforms was found to depend strongly on the He and Xe pressures. Energy Dispersive X-Ray (EDX) analysis of the debris emitted from the source shows that the primary sources of the debris are the central electrode and the insulator. No evidence of cathode material has been found. In addition to efforts toward more efficient operation, first phase efforts of thermal engineering have been undertaken, which have led to continuous operation at 200 Hertz with conventional direct water-cooling. The system can be operated at higher repetition rates with proportionally lower duty cycles. The data shows the distribution of thermal power throughout the whole system. This more detailed understanding of the thermal power flow allows Applicants to better determine the ultimate high volume manufacturing potential of this source technology.

Applicants have demonstrated significant gains in performance with conversion efficiencies approaching those of the more mature laser produced plasma sources. The particular specifications which the light sources must meet are tightly coupled with the design of the entire illumination system. Key source parameters which must be measured are: operating wavelength, in-band EUV power, out-of-band power, source size; maximum collectible angle, high repetition rate scaling; pulse to pulse repeatability and debris generation from plasma facing components.

Applicants' early efforts in DPF development were directed at developing the basic pulsed power technology required to drive a source of this type. High conversion efficiency was demonstrated with Li vapor as the active radiating element at high stored energy (25 J). These stored energies were too high for practical scaling to high repetition rate operation. Development of the 4th generation machine allowed Applicants to use Xe as the active species. Their recent efforts have been focused on optimizing the performance of the DPF with Xe as the source gas. To facilitate this effort they have investigated pulsed power development, plasma initiation and characterization, EUV metrology, debris mitigation and characterization, thermal engineering, and collector optics development.

System Description

The fourth generation of Dense Plasma Focus system developed by Applicants utilizes a power system with solid-state switching and several stages of magnetic pulse compression (as shown in FIG. 1 and described above) similar to that used in Cymer's excimer lasers, in order to generate the high voltage, high peak power pulse required by the DPF to generate EUV light. These systems begin with a charging voltage of 1300 V and generate an output pulse applied to the DPF of ~4 kV with a risetime of less than 50 ns. Although current measurements have not yet been directly performed, circuit simulations based on the voltage waveforms from typical experiment operation predict that the output DPF drive current peaks at a value of ~50 kA, with a dI/dt of 675 kA/∝s. It is this combination of high peak current and high dI/dt that allow the DPF to function efficiently.

The most important features of this fourth generation device is described in FIG. 33 along with a bullet list of the advantages of the deep plasma focus device. As explained elsewhere Applicants have demonstrated conversion efficiencies (the ration of: in-band EUV radiation at an intermediate focus to electric power input) of about 0.5%. As of the filing of this application, Applicants have demonstrated the following system performance parameters:

Current Source Performance

| | |
|---|---|
| EUV efficiency with Xe, (2% BW, 2π sr) | >0.45% |
| EUV energy per pulse (2% BW, 2π sr) | ~55 mJ |
| Average source size (FWHM) | ~0.4 × 2.5 mm |
| Source position stability (entroid) | <0.05 mm, rms |
| Continuous repetition rate | 1000 Hz |
| Burst repetition rate | 4000 Hz |
| Energy Stability | ~7%, rms |
| Avg. EUV Output Power (2% BW, 2π sr) | 50 Watt |
| EUV output Power, Burst (2% BW, 2π sr) | 200 Watt |

Collection efficiency is about 20 to 30 percent and about half of the collected EUV in band radiation can be delivered to the intermediate focus utilizing the technology described herein. Thus, the demonstrated EUV power at the intermediate focus is currently about 5 Watts on a continuous basis and 200 Watts in burst mode. With the improvements described herein Applicants expect to increase the continuous power at the intermediate focus to at least 45.4 Watts within the near future and ultimately to 105.8 Watts. Burst mode performance will be roughly proportionately greater.

Six fourth generation DPF machines have been built and are being used for a variety of experiments on system optimization, pre-ionization, power system development, debris mitigation, thermal management, and collector design. For those experiments not requiring high repetition rates (~1 kHz and above), charging power for these machines is simply provided by resistive charging from a set of DC power supplies. Those DPF systems that do require high rep-rate capability are being charged with a resonant charging system which charges the initial energy storage capacitor, C0, to a voltage of 1300 V in less than 250 μs. These resonant charging systems also provide energy recovery, storing the energy which is not utilized by the DPF or dissipated in heat and using this recovered energy for the next pulse. This reduces the amount of power required by the main power supply and also helps with other issues such as thermal management.

Measurements

In this section Applicants present an overview of measurements performed on one of Applicants low-duty-factor sources operated at less than 50 Hz. They show the dependence of the EUV output and conversion efficiency on gas recipe, present data on the out of band emission, and show measurements of the source size and position stability.

Over the past year significant progress has been made in understanding some of the empirical dependencies of the EUV output on electrode geometry and gas dynamics issues. Significant changes in the apparatus, as compared with earlier generations include a new cathode design which allows gas to be injected symmetrically around the anode region, and a system for injecting He and Xe mixtures through the anode electrode. The gas delivery system was modified to allow combinations of He and Xe to be injected into different sections of the DPF system. A schematic of this system is shown in FIG. 1. Gas control is performed via two mass flow controllers and a high accuracy capacitance manometer. The system is operated in a constant-pressure mode. Xe is injected in a constant-flow mode, and He makeup gas is added in order to reach the target operating pressure. In this mode the He flow rate depends on the pumping speed of the system. Dependence on gas flow rates was investigated by testing different pumping configurations.

Radiation emitted from the pinch along the axis passes through an aperture into a differentially pumped diagnostic chamber 204. Gas absorption in the measurement vessel is minimized by maintaining the pressure below 5 mTorr. For these measurements the diagnostic vessel entrance was located 5 cm from the pinch region. No correction for the gas attenuation in the main DPF vessel along the 5 cm path nor in the diagnostic vessel is performed. The radiation from the pinch is reflected from a Mo/Si multi-layer mirror and is directed through a 1∝m thick Be foil onto an un-coated IRD AXUV-100 photodiode. A typical measurement sequence consists of recording the voltage waveforms on the pulsed power system, the DPF anode, and the photodiode as a function of the experimental parameters. Data acquisition and control of the gas system are performed via a computer interface.

The representative dependence of the in-band EUV signal (at 13.5 nm, into 2% bandwidth, into 2 π sr) on the Xe flow rate is shown in FIG. 2A(5) at a constant operating pressure of 350 mTorr and at a fixed charging voltage on the first stage capacitor of the pulsed power system.

A significant increase in the EUV output from the source was observed when He was injected around the anode and Xe through the cathode at 20 Hz source operation compared with He injection into the main DPF vessel. Additional improvement was observed by increasing the He gas flow rate via the addition of pumping capacity. The effect of higher pumping speed is to make the EUV output less sensitive to the Xe mass flow set point and to increase the measured EUV output.

Similar measurements were performed as a function of He pressure at a constant Xe flow rate and a voltage of 1300 V on the first capacitor stage C2 as shown in FIG. 1. FIG. 2A(6) shows the voltage waveform on the final stage capacitor (C2) and the in-band 13.5 nm photodiode signal for He injection around the anode. The EUV signal strongly depends on the He pressure. Examination of the C2 waveform shows that the energy recovered by this capacitor due to underdamped response depends on the gas recipe. A similar dependence was observed as a function of Xe flow variation.

The energy dissipated in the pinch region is calculated from the difference in stored energy on the C2 capacitor. At 1500 mT He pressure, approximately 70% of stored energy is dissipated in the pinch region (8.8 J), while at 200 mT, the corresponding value is 96% (11.9 J). This dependence is illustrated in FIG. 2A(7) where the photodiode signal, initially stored energy, recovered energy and dissipated energy are plotted as a function of the He pressure. The EUV signal increases by approximately a factor of 10 over this range. A further decrease in the He partial pressure results in a sharp drop in the EUV yield not shown in these data.

Another interesting feature of the dependence on the gas pressure is the shift in the onset of EUV emission as measured by the photodiode. At the constant Xe flow conditions used, this variation of the pressure from 180 mT to 1500 mT results in a shift of 150 ns of the EUV emission. From classical snowplow and slug models of the DPF operation Applicants expect the characteristic axial and radial transit times for the plasma shock front to scale with the square root of effective mass density. This scaling needs to be confirmed for this configuration, and the proportionality constant may be related to the effectiveness of the shock front in sweeping the mass out of the electrode region. Calculations of this effect, based on a one-dimensional snowplow model suggest that axial and radial effective masses may be significantly less than those derived from the actual gas pressure.

The dependence of the average in band EUV energy and energy efficiency on the dissipated energy at fixed gas flow conditions is shown in FIGS. 2A(8) and 2A(9), and 4b. These data were taken with the source conditions optimized at the peak EUV output.

Lower energy input was obtained by reducing the charging voltage while leaving all other parameters fixed. The data shown here are for the optimum conditions of the present experiment as well as for the configuration presented in [1] employing a different gas recipe and anode geometry. At 10 J a 70% increase in conversion efficiency (CE) is obtained, as compared with the previous configuration. Although the energy coupled into the pinch depends on the gas recipe, we can see that the dependence of EUV energy shown in FIGS. 2A(6) and 2A(7) is primarily due to variation in gas flow and not to the change in coupling.

Two types of measurements of the EUV radiation lying outside the 2% bandwidth around 13.5 nm were performed. The experimental setup for these measurements is shown in FIGS. 2A(8) and 2A(9). The first type of measurement compared the total radiation from the pinch on axis with the fraction transmitted through a CaF2 window transmitting in the 130 nm-1300 nm band. These results show that ~0.5% of the total radiation emitted from the pinch lies in the CaF2 band between 130 nm and 1300 nm, and are similar to previous results obtained by Applicants. In the second measurement the fraction of radiation emitted from the pinch reflected from one Mo/Si multilayer (ML) mirror and detected by the AXUV-100 photodiode was compared with the fraction of radiation transmitted through a 1 $\propto$m Be foil and reflected by the ML mirror. The signal, measured on the photodiode with no filter in place after reflection from the ML mirror gives the sum of in-band and out-of-band components. Insertion of a Be filter limits the measurement to the in-band fraction only. Therefore by subtracting the in-band fraction of radiation corrected for the ML mirror transmission from the total signal with no filter we conclude that ~15% of the total radiation reflected by one ML mirror is out of the 2% band around 13.5 nm.

Measurements of source size and centroid motion were performed with the source tuned for peak output. A pinhole camera employing a back-illuminated CCD array and a Be filter was used. The source images are shown in FIG. 2A(10). These images were taken with the camera positioned on axis. Measurements were also taken at an angle of 68 degrees. The average source size (averaged over 100 pulses) was determined to be 0.25 mm×2 mm full-width-at-half-maximum. The pulse-to-pulse EUV source centroid displacement is plotted in FIG. 2(A) 11. The average displacement is approximately 50 $\propto$m.

Using the pinhole camera technique we can obtain an estimate of the EUV energy stability by integrating the intensity in each frame and calculating the standard deviation of this quantity. The results show 9.5% (1 $\Gamma$) intensity fluctuation. This measurement compares well with measurements of the energy stability performed with the standard measurements using a Be filter, ML mirror, and AXUV −100 photodiode. Additional experiments that will be performed with this diagnostic will include correlation of EUV source size with the in-band energy.

From the on-axis images we also conclude that there is no EUV production originated from an interaction of the pinch with the anode end wall. The maximum EUV intensity is observed in the center of the pinch where Xe gas is injected through an aperture in the anode. No EUV emission is observed at the periphery of the pinch where it contacts the anode end wall.

High Repetition Operation

Stable operation of the source at high repetition rates is important for high exposure dose and accurate dose control. The burst mode operation of this fourth generation light source was improved. Using a resonant charging scheme with 10 J input energy (similar to that employed by Cymer's excimer lasers), the maximum burst emission period was increased to up to 300 pulses at repetition rates of 2 KHz.

The time-integrated in-band energy of the EUV pulses was measured using the multi-layer mirror-Be foil-photodiode detection scheme described above. The in-band energy vs. pulse number data are shown in FIG. 2A(12). When the repetition rate was increased from low to high rates with no changes of the gas mixture, a severe reduction of the EUV output energy was observed with increasing burst pulse number. By making appropriate adjustments of the gas recipe it was possible to tune the output in order to obtain relatively stable EUV pulse energy for 300 pulses long bursts at a 2 kHz repetition rate. As shown in the figure, after a transient period lasting for about 10-15 pulses the output energy stays at high values for the remainder of the burst. The corresponding measured standard deviation of the energy stability in this mode is 10%. At the present level, we have not reached any fundamental scaling limitations for high-repetition-rate operation and a further performance increase should be possible with upgraded pulsed power and thermal management schemes.

Debris Mitigation

Figure 10:
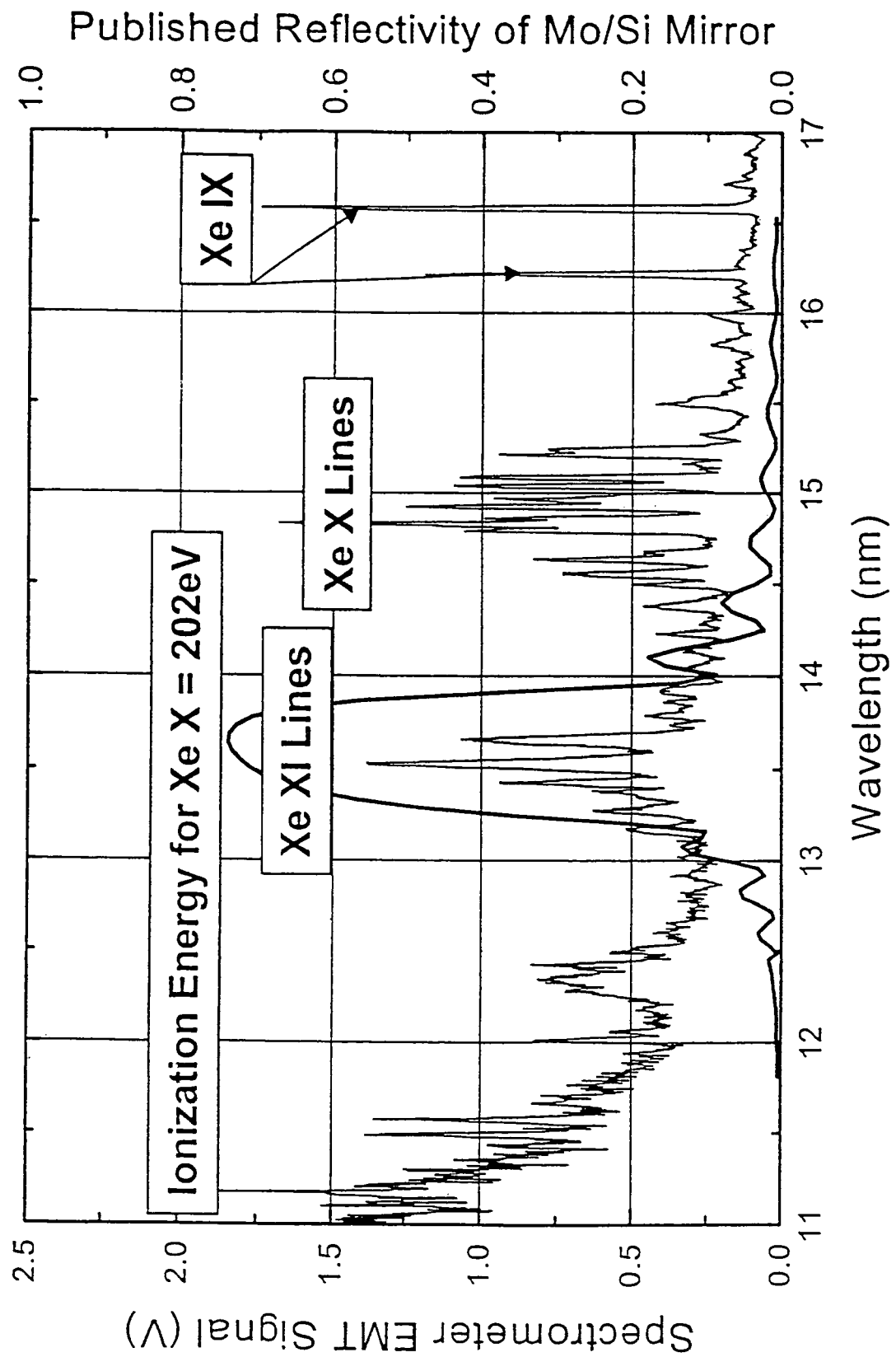
FIG. 10 shows a xenon spectra a multi-layer mirror spectra.

Applicants have exposed Mo and Pd coated silicon wafers to the debris produced by the DPF in an effort to evaluate the main source of the debris, and the debris deposition rate on the collector optics. The source configuration for these tests consisted of a tungsten anode, alumina insulator and brass cathode. Samples were exposed to 4.105 pulses at 30 Hz, at a distance of 5 cm (Mo sample) and 11 cm (Pd sample) away from the pinch. The arrangement and placement dimensions are shown in FIG. 10. After exposure the samples were analyzed by Energy Dispersive X-Ray (EDX) analysis. The results, summarized in Table 1 below, show that anode (W) and insulator (O, Al) materials were found at both distances, 5 cm and 11 cm.

No sign of cathode material was observed. A small fraction of Xe was found on the Mo sample at 5 cm. This may be a signature of energetic Xe ions produced by the DPF or simply Xe incorporated into the thin film coating. The presence of He could not be detected by EDX. The presence of a weak but detectable Mo signal at 5 cm is an indication that the deposited debris is between 0.5 $\propto$m and 2.0 $\propto$cm thick, which is the typical penetration depth for EDX analysis. This gives us an estimate of the debris generation rate at 1-4.10-3 nm per pulse on axis at 5 cm from the pinch.

A simple optical technique was tested to characterize the deposition of debris generated by the DPF. The absorption of metals in the visible region of the spectrum is generally high. The corresponding optical thickness up to which appreciable transmittance occurs is generally well below a quarter wavelength in this region so that interference fringes are not observed. According to Lambert-Beer's law:

$$T = e^{-\alpha * L}$$

where T is the transmittance, $\alpha$ is the absorption coefficient and L is the film thickness. Therefore the absorbance A, defined as $Log_{10}(1/T)$, is proportional to the film thickness if $\alpha$ is independent of L. If L is proportional to the number of pulses, then from a measurement of the absorbance of a coating on a transparent sample due to debris produced by the DPF as a function of the number of pulses the debris deposition rate per pulse may be determined. Experimental verification of this proportionality is plotted in FIG. 11.

Measurements of the absorbance allow one to compare the debris deposition rate on witness samples under different DPF operating conditions. We used this method as the primary means for obtaining the angular distribution of the debris, as well as for the debris reduction factor due to the insertion of a debris shield.

To evaluate the effectiveness of the debris shield concept a simple single-channel test setup was designed and built. The geometry and critical dimensions are shown in FIG. 2A(15). Glass samples were placed at 6 cm from the pinch either facing the pinch directly or after a series of metal cylinders with 1 mm diameter channels drilled through them. Tests were performed with 1 cm and 2 cm channel lengths. During the tests total pressure in the chamber was 0.7 Torr with Helium injection into the main vessel and Xe was injected through the anode. By comparing the debris film thickness using the absorbance technique, for samples which were exposed to the same number of pulses at the same operating conditions but with different debris shield lengths, we can calculate a debris reduction factor (F). If F=1 is defined as the case when the sample was placed without any protection, then F shows how effectively the debris shield protection works. Experimental results for the 1 and 2 cm thick single channel setup are plotted in FIG. 2A(17). These results show a reduction factor of 100 per cm of shield length. These results may be compared with the reduction factor measured for a more realistic multi-channel debris shield shown in FIG. 2A(16). This prototype shield was fabricated from stainless steel by electron discharge machining (EDM). The data show that under these conditions the reduction factor measured for the 1 cm long multi-channel shield was comparable to the simple 1 cm single channel setup. This gives us a measure of confidence in scaling this type of debris shield to the length required for practical source operation.

Thermal Engineering

Water-cooled electrodes, the first step in development of a thermal management solution for the DPF discharge region, have been designed and tested on Applicants fourth generation EUV light source. These electrodes have enabled study of the DPF operation at significantly higher steady-state repetition rates than previously achieved and generated calorimetric data that shows the dissipation of thermal energy in each electrode.

The cathode has four separate cooling delivery and exhaust loops, one for each quadrant of the annular weldment. The flow through each quadrant is arranged to be similar. It was designed to maximize the area cooled internally by the water and minimize the conduction path through the plasma heated wall and was fabricated from a high thermal conductivity copper alloy with good mechanical properties. At 400 kPa the total water flow through the cathode is 3.8 liters per minute. The water-cooled electrodes are shown diagrammatically in FIG. 2A(18). The anode is cooled by flowing water through two concentric, annular channels created in the body of its welded assembly. This allows the water to get very close to the region of the part heated most aggressively by the plasma. Water can be pumped through this electrode at relatively high pressures giving high water flow rates and maintaining a more favorable temperature gradient in the region of highest heat flux. In recent testing water has been pumped through the anode at 1100 kPa giving a flow rate of 11 liters per minute.

Testing of the water-cooled electrodes has been carried out up to several hundred Hertz in short bursts and at steady state repetition rates up to 200 Hz. The results so far indicate that a reasonable correlation exists between measured electrical energy input and measured heat load on the electrode cooling system when other as yet unmeasured but largely understood system heat losses are considered. The thermal energy leaving the electrodes in the water is not divided evenly between the anode and cathode. Typically the cathode removes more heat than the anode. The data suggest that the cathode removes a higher proportion of the heat as the repetition rate rises. This was expected since the anode temperature rises more rapidly than that of the cathode with increasing repetition rate and the corresponding reduction of thermal conductivity in the anode material is significant. The cathode also has a much larger cooled area, a shorter heat conduction path and far higher thermal conductivity than the anode. The fraction of heat removed by each electrode is shown in FIG. 2A(19).

A summary of the demonstrated source parameters is given in FIG. A(20). In the past year Applicants have built five new DPF sources as well as implementing upgrades to our existing fourth generation system bringing the total number of operational systems at Cymer to six. Significant improvements were made in the conversion efficiency primarily by optimization of the gas recipe and gas injection geometry. The best achieved conversion efficiency into 2 $\pi$ sr and 2% bandwidth was ~0.4% at ~10.5 J and low repetition rate. Stable EUV output was demonstrated for 300 pulse bursts at 2 kHz using our proven resonant charger technology. Experiments performed to date suggest that further improvement is possible by continued optimization of the gas delivery system. Energy stability continues to be ~10% (1$\sigma$) and will require improvement. Out of band radiation is <0.5% for the improved CE source.

Characterization of debris collected on witness samples exposed to the pinch shows deposition primarily of anode material (W), and anode insulator material (Al, O). No evidence of cathode material is seen. Measurements of the debris reduction factor for single and multiple channel debris shield show a reduction factor of 100× per cm of shield length. Extrapolating this result to a reduction factor of 10 8 suggests that a 4-5 cm shield will be required.

The measurements of heat extraction from the electrodes for continuous operation at 200 Hz show that approximately 60% of the power is dissipated in the cathode with 40% going to the anode. This suggests that at 5000 Hz repetition rate and 10 J total input energy we would need to extract approximately 20 kW from the anode electrode. At these conditions using 0.4% CE we calculate a total in band radiated power of 200 W into 2% BW and 2 π sr at the source. Appropriate reduction factors must be used for all downstream components that attenuate the source radiation.

Other Improvements

Dual Purpose Collectors

Due to large reflection losses of EUV mirrors, minimization of the number of mirrors is very desirable for illumination systems for EUV lithography. Specially designed surfaces can have additional features such as beam homogenization features. One such feature could be a reflective diffuser added to a grazing incidence collector of the type described above.

Use of Magnetic Field and Preionizers to Control Pinch

Figure 28A:
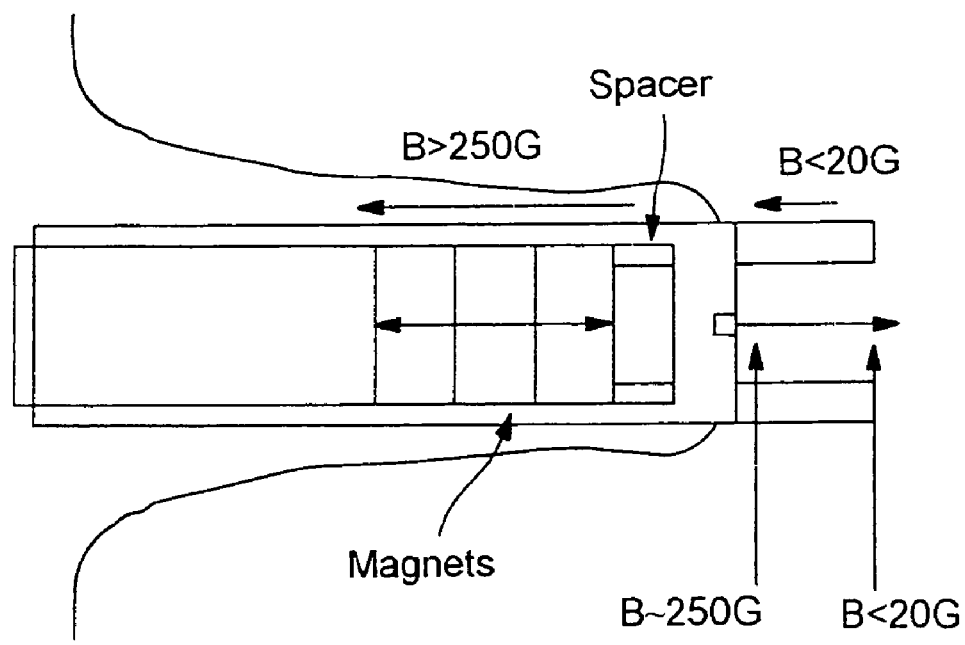
FIGS. 28A and 28B show the use of magnets to control the pinch.

Applicants have demonstrated that magnetic fields can be used to control the pinch size and position. In one embodiment a permanent magnetic positioned above the pinch region reduces the pinch length. Magnets can also be positioned in the anode as shown in FIG. 28A. Magnetic fields can also be applied to help confine the pinch. Applicants have also demonstrated that the shape and position of the pinch can also be controlled by moderating the preionization signal from preionizers 138 as shown in FIG. 2A(2).

Metal in Solution Target

Metals such as lithium and tin provide vapors which make good active gases to produce radiation in the 13.5 nm range. However, dealing with metal vapors is difficult. A technique for providing target material at the pinch site is to form a liquid solution with the metal and inject the target in liquid form.

When a liquid solution containing the metal is inserted into the discharge chamber, the metal does not have to be heated for delivery. The target delivery can be made in a so-called mass-limited way, i.e., just the right amount of metal (particles) is delivered, no more mass than needed. This leaves no extra particles, which would otherwise just represent unwanted debris produced by the source. The target material can be delivered in a liquid jet from a nozzle, if a sufficiently high backing pressure is applied. In this way, it can be delivered to the discharge region and it can be avoided that the whole discharge chamber is filled with target material. Since colloidal particles in suspension or liquids or particles in liquids are used, the target density can be much higher than for metal vapor. By choosing the right concentration of metal content of the liquids, an optimized mass-limited metal target can be provided. It is also much simpler to just inject a liquid into the chamber rather than constructing a metal vapor delivery system, for instance based on a heat pipe principle. Tin nitrate should be an efficient target for 13.5 nm to 14 m EUV light generation.

Figure 28B:
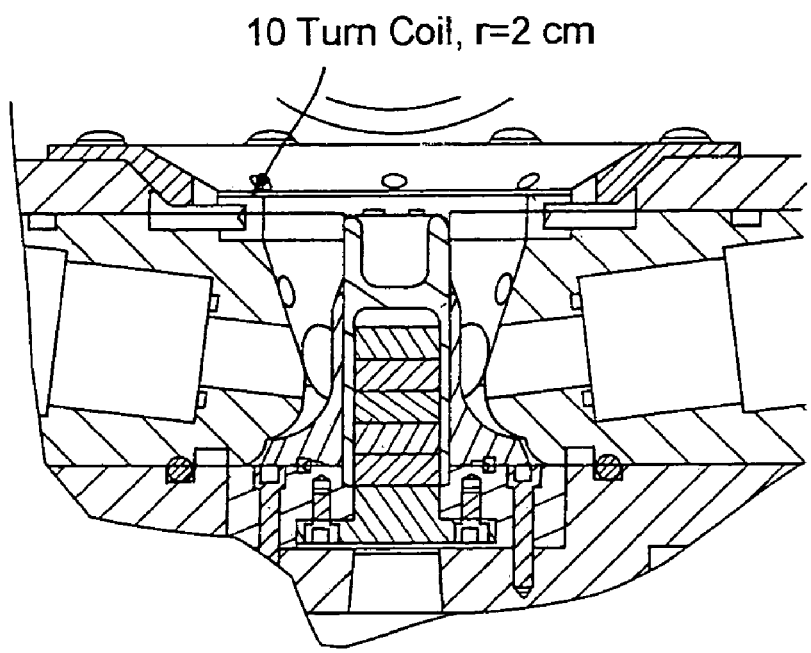

An improvement in EUV output and preionization was observed when a pulsed magnetic field was applied by means of a coil mounted as shown in FIG. 28B below. The coil current pulse is shown in FIG. 30. This pulse produces a magnetic field between 200 and 500 G at the end of the anode. An improvement in preionization was seen as shown by the anode waveform in FIG. 29A. The corresponding change in C2 waveform is shown in FIG. 29B. The application of the pulsed field resulted in a higher preionization density in the anode cathode region as evidenced by the drop in anode voltage shown in FIG. 29A. The EUV output increased with the pulsed field. The in band EUV waveshape is shown in FIG. 29C with B on and off. The overall dependence of the EUV output on input energy with pulsed field applied is shown in the upper curve of FIG. 29C. The curves below this are with no pulsed B field. FIG. 2A(9) shows improvements in efficiency resulting from electrode geometry improvement discussed herein including gas pumping and preionization changes and plasma dynamics using magnetic effects.

Figure 23:
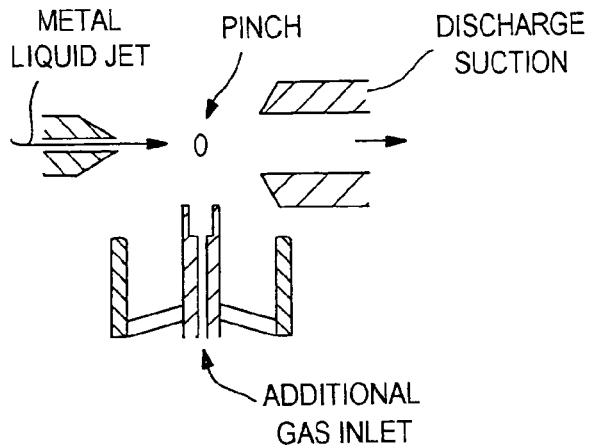
FIGS. 23, 24, 25, 26A and 26B show techniques for reducing electrode erosion.

Metal targets can be delivered by means of liquids, fluids, solutions or suspensions. The compound has to be liquid at the given (backing) pressure at temperatures around room temperature, say, from ~10° C. to ~50° C. This technique applies to any pinched (=magnetically self-compressed) discharge which can produce EUV or X-ray radiation, like a dense plasma focus (DPF), a Z-pinch, an HCT-pinch (=hollow cathode triggered pinch) or a capillary discharge. The liquid can be delivered through the former gas injection port of the discharge device, see FIG. 18A for example for the case, when the discharge device is a DPF. In another embodiment see FIG. 23, the liquid can be at high pressure or can be backed up by very high-pressure (ca. 80 atm) helium gas and be delivered to the discharge region via a jet nozzle with very small opening (ca. 50 μm to ca. 10 μm). In this way, the metal-containing liquid is confined to a narrow liquid jet. The jet crosses the pinch region of the discharge. Additional gas may be inserted to promote the development of an efficient pinch discharge. The liquid and evaporated gas can be pumped away by a nearby dump port with a vacuum pump. The nozzle expansion through the nozzle or through the inner electrode may also alternatively be operated such as to form a series of liquid drops or as a (more diffuse) liquid spray expansion. The liquids provide an easy means of delivering metals of optimal concentration, diluted in solution, to the discharge region. Heating of the metal to provide a metal vapor can be avoided.

The preferred metals are the ones that provide efficient EUV generation in the region of ca. 13 nm to ca. 15 nm. They are: lithium, tin, indium, cadmium and silver. Lithium (Li2+) has a strong transition at 13.5 nm. Tin (Sn), indium (In), cadmium (Cd) and silver (Ag) have strong 4d-4f transition arrays from several ion species overlapping in the 13 to 15 nm wavelength region. (As one goes from 13 nm to 15 nm, the peak reflectivity of the multi-layer mirrors for EUV lithography decreases, but their bandwidth increases at the same time. Therefore, the integral reflected intensity can still be large, and wavelengths above 14 nm are still of interest here.) The preferred solutions are alcohols like iso-propanol, methanol, ethanol, etc., and also water or glycol.

The preferred chemical compounds are lithium fluoride, lithium chloride, lithium bromide-salts, dissolved in water, for instance. For Sn, In, Cd and Ag preferred solutions are likewise chlorine solutions, bromine solutions and fluorine compounds. In addition, metal sulfates and nitrates.

Tin nitrate ($Sn(NO3)4$) is one of the most interesting compounds. Likewise, indium nitrate ($In(NO3)3$), cadmium nitrate ($Cd(NO3)2$), and sliver nitrate ($Ag(NO3)$). Nano- and micro-particles in solution or suspension may also be used. It may also be considered to insert such nano- and micro-particles by turbulence into a gaseous stream of helium and not use a liquid at all for delivery.

Additional EUV Light from Electron Impact

Applicants propose to supplement the in-band light produced by its plasma pinches with light results from energetic electron impact.

Figure 24:
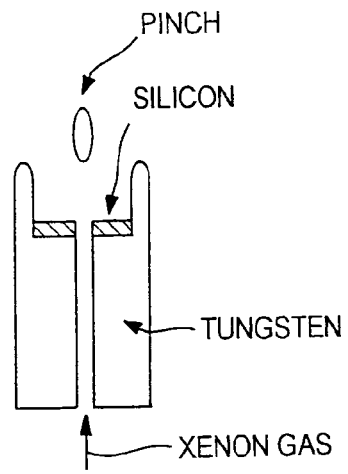

Bremsstrahlung (=soft x-ray radiation) generated from energetic electron impact on solids with suitable absorption edges generates EUV radiation in addition to the EUV radiation produced in the gaseous pinch plasma. This is the idea in general. In the case of our DPF source, for instance, it is known that when operated with positive polarity on the central electrode (=anode), an electron beam (with electron energies of several keV is produced which impinges onto the inner front side of the center electrode. For 13.5 nm radiation, Si (silicon) is the suitable material to be placed here. The silicon L-absorption edge occurs at 13.5 nm. Therefore, the energetic electrons will produce 13.5 nm radiation. This is completely in addition to the main 13.5 nm-radiation produced by the xenon ions in the pinch plasma. Therefore, more EUV radiation will be generated, if the central inner potion of the anode (in general, any place where the electron beam impacts) is made out of silicon. An electron kinetic energy of 10 keV is just about right for optimal efficiency. For instance, put silicon inside of the tungsten anode. Without silicon oat the place f impact (=present mode of operation), there is no match of the absorption edge (e.g., tungsten), consequently no additional radiation is produced at 13.5 nm. Silicon is of most importance here, but the principle applies also to other materials at other wavelengths. (For example: Beryllium insert to produce 11.5 nm radiation at the Be K edge). A sketch showing this technique is provided in FIG. 24.

Metal Vapor Produced by Sputtering

In preferred embodiments the active gas (lithium or tin vapor) and pre-ionization is provided in a single system. In this case the metal target is sputtered with an electric discharge which produces the metal vapor and also produces any ionization needed to promote the main discharge. The source for the sputter power preferably is a signal generator, a 100 Watt linear RF amplifier and a 2000 Watt command amplifier. The solid lithium or tin target is preferably located in a hollow in the central electrode and the sputter discharge are directed to that target.

For example, Applicants fourth generation EUV sources produce about 5 Watts of in band EUV energy at the interim focus 11 in FIG. 19. Applicants expect future design using existing technology to boost this 5 Watts to about 45.4 Watts. However, some designers of EUV lithography mediums have expressed a desire for power levels of more than 100 Watts. Applicants propose to accomplish this by combining two EUV sources using the technology described herein into one EUV system.

Wavelength Ranges

The various embodiments discussed herein have been discussed particularly in terms of light sources producing ultraviolet in the spectral range of between 12 and 14 nm. This is because mirror suppliers have reported substantial success in the development of multi-layer near normal mirrors for UV light within these wavelengths ranges. Typically these mirrors have maximum reflectivities of about 0.6 to 0.7 in the 12 to 14 nm range and the mirrors typically have a FWHM bandwidth of about 0.6 nm depending on the specific mirror design. So the typical mirror only covers a portion of the spectral range between 12 nm and 14 nm.

For this reason it is very important to carefully match the spectral output of the source to the spectral range of the reflectivity of the mirrors which will be used to direct the beam, such as the mirrors in lithography scanner machine.

The reader should also understand that the teachings of this specification will apply to a much broader spectral range than the 12 nm to 14 nm range where most of the current extreme UV attention is focused. For example, good mirrors can be produced for the 11 nm range and there may be advantageous for using these pinch devices at wavelengths above the 14 nm range up to about 50 nm. In the future it may be possible to practice projection lithography down to about 5 nm. Also, by going to x-ray proximity lithography, it should be possible to use the techniques described herein for light sources down to about 0.5 nm.

For projection lithography an active material would need to be chosen which would have at least one good emission line within the reflectivity range of the mirrors used for the projection good lines are available throughout extreme UV spectrum. Good lines are also available in ranges which could apply down to 0.5 nm for the proximity lithography. Therefore, Applicants believe many or most of the concepts and ideas expressed herein would be useful throughout the spectral range from about 0.5 nm to about 50 nm.

It is understood that the above described embodiments are illustrative of only a few of the many possible specific embodiments which can represent applications of the principals of the present invention. For example, instead of recirculating the working gas it may be preferable to merely trap the lithium and discharge the helium. Use of other electrode-coating combinations other than tungsten and silver are also possible. For example copper or platinum electrodes and coatings would be workable. Other techniques for generating the plasma pinch can be substituted for the specific embodiment described. Some of these other techniques are described in the patents referenced in the background section of this specification, and those descriptions are all incorporated by reference herein. Many methods of generating high frequency high voltage electrical pulses are available and can be utilized. An alternative would be to keep the lightpipe at room temperature and thus freeze out both the lithium and the tungsten as it attempts to travel down the length of the lightpipe. This freeze-out concept would further reduce the amount of debris which reached the optical components used in the lithography tool since the atoms would be permanently attached to the lightpipe walls upon impact. Deposition of electrode material onto the lithography tool optics can be prevented by designing the collector optic to re-image the radiation spot through a small orifice in the primary discharge chamber and use a differential pumping arrangement. Helium or argon can be supplied from the second chamber through the orifice into the first chamber. This scheme has been shown to be effective in preventing material deposition on the output windows of copper vapor lasers. Lithium hydride may be used in the place of lithium. The unit may also be operated as a static-fill system without the working gas flowing through the electrodes. Of course, a very wide range of repetition rates are possible from single pulses to about 5 pulses per second to several hundred or thousands of pulses per second. If desired, the adjustment mechanism for adjusting the position of the solid lithium could be modified so that the position of the tip of the central electrode is also adjustable to account for erosion of the tip.

Many other electrode arrangements are possible other than the ones described above. For example, the outside electrode could be cone shaped rather than cylindrical as shown with the larger diameter toward the pinch. Also, performance in some embodiments could be improved by allowing the inside electrode to protrude beyond the end of the outside electrode. This could be done with spark plugs or other preionizers well known in the art. Another preferred alternative is to utilize for the outer electrode an array of rods arranged to form a generally cylindrical or conical shape. This approach helps maintain a symmetrical pinch centered along the electrode axis because of the resulting inductive ballasting.

Accordingly, the reader is requested to determine the scope of the invention by the appended claims and their legal equivalents, and not by the examples which have been given.

The invention claimed is:

1. An apparatus comprising:
    a laser produced plasma extreme ultraviolet ("EUV") light source comprising:
    an EUV light collector shaped and disposed to collect EUV light produced at a plasma irradiation site;
    a system creating a plasma source material irradiation light beam of pulses and providing the plasma source material irradiation light beam of pulses to the plasma irradiation site;
    the plasma source material comprising tin droplets, and
    a cleaning buffer gas comprising hydrogen.

2. The apparatus of claim 1 wherein said plasma source material irradiation light beam is a beam of pre-pulses and said system also creates a plasma source material irradiation light beam of main pulses and provides the source material target irradiating beam of main pulses to the plasma irradiation site.

3. The apparatus of claim 1 wherein said cleaning buffer gas comprises at least 20 percent hydrogen.

4. The apparatus of claim 1 wherein said cleaning buffer gas comprises 20 to 50 percent hydrogen.

5. The apparatus of claim 1 further comprising a debris shield.

6. An apparatus comprising:
    a laser produced plasma extreme ultraviolet ("EUV") light source comprising:
    an EUV light collector shaped and disposed to collect EUV light produced at a plasma irradiation site;
    a system creating a plasma source material irradiation light beam of pulses and providing the plasma source material irradiation light beam of pulses to the plasma irradiation site;
    the plasma source material comprising a droplet of metal and
    a cleaning buffer gas comprising hydrogen.

7. The apparatus of claim 6 wherein said plasma source material irradiation light beam is a beam of pre-pulses and said system also creates a plasma source material irradiation light beam of main pulses and provides the source material target irradiating beam of main pulses to the plasma irradiation site.

8. The apparatus of claim 6 wherein said cleaning buffer gas comprises at least 20 percent hydrogen.

9. The apparatus of claim 6 wherein said cleaning buffer gas comprises 20 to 50 percent hydrogen.

10. The apparatus of claim 6 further comprising a debris shield.

11. An apparatus comprising:
    a laser produced plasma extreme ultraviolet ("EUV") light source comprising:
    an EUV light collector shaped and disposed to collect EUV light produced at a plasma irradiation site;
    a system creating a plasma source material irradiation light beam of pulses and providing the plasma source material irradiation light beam of pulses to the plasma irradiation site;
    the plasma source material comprising metal delivered to the plasma irradiation site in the form of a droplet having a liquid, fluid, solution or suspension comprising metal plasma source material and
    a cleaning buffer gas comprising hydrogen.

12. The apparatus of claim 11 further comprising:
    the metal comprising tin.

13. The apparatus of claim 11 wherein said cleaning buffer gas comprises at least 20 percent hydrogen.

14. The apparatus of claim 11 wherein said cleaning buffer gas comprises 20 to 50 percent hydrogen.

15. The apparatus of claim 11 further comprising a debris shield.

16. An apparatus comprising:
    a laser produced plasma extreme ultraviolet ("EUV") light source comprising:
    an EUV light collector shaped and disposed to collect EUV light produced at a plasma irradiation site;
    a system creating a plasma source material irradiation light beam of pulses and providing the plasma source material irradiation light beam of pulses to the plasma irradiation site;
    the plasma source material comprising a metal droplet that is mass limited and
    a cleaning buffer gas comprising hydrogen.

17. The apparatus of claim 16 wherein said plasma source material irradiation light beam is a beam of pre-pulses and said system also creates a plasma source material irradiation light beam of main pulses and provides the source material target irradiating beam of main pulses to the plasma irradiation site.

18. The apparatus of claim 16 wherein said cleaning buffer gas comprises at least 20 percent hydrogen.

19. The apparatus of claim 16 wherein said cleaning buffer gas comprises 20 to 50 percent hydrogen.

20. The apparatus of claim 16 further comprising a debris shield.

* * * * *

UNITED STATES PATENT AND TRADEMARK OFFICE
CERTIFICATE OF CORRECTION

PATENT NO. : 7,642,533 B2 Page 1 of 1
APPLICATION NO. : 11/880319
DATED : January 5, 2010
INVENTOR(S) : Partlo et al.

It is certified that error appears in the above-identified patent and that said Letters Patent is hereby corrected as shown below:

Title Page, under Item (12) United States Patent, Delete "Partio" and insert --Partlo--.

Title Page, Item (75) Inventors:
After "William N." replace "Partio" with --Partlo--.

Signed and Sealed this

Seventh Day of September, 2010

David J. Kappos
*Director of the United States Patent and Trademark Office*